United States Patent
Chang et al.

(10) Patent No.: US 12,518,968 B2
(45) Date of Patent: Jan. 6, 2026

(54) INTEGRATED CIRCUIT DEVICE

(71) Applicants: TAIWAN SEMICONDUCTOR MANUFACTURING COMPANY, LTD., Hsinchu (TW); NATIONAL TAIWAN UNIVERSITY, Taipei (TW)

(72) Inventors: Ya-Ting Chang, Yunlin County (TW); Jian-Zhi Huang, Changhua County (TW); Jin-Bin Yang, Taichung (TW); I-Chih Ni, New Taipei (TW); Chih-I Wu, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/758,647

(22) Filed: Jun. 28, 2024

(65) Prior Publication Data

US 2024/0355622 A1 Oct. 24, 2024

Related U.S. Application Data

(62) Division of application No. 17/583,330, filed on Jan. 25, 2022, now Pat. No. 12,062,540.

(Continued)

(51) Int. Cl.
*H01L 21/02* (2006.01)
*H01L 21/768* (2006.01)
(Continued)

(52) U.S. Cl.
CPC .. *H01L 21/02614* (2013.01); *H01L 21/02568* (2013.01); *H01L 21/76843* (2013.01);
(Continued)

(58) Field of Classification Search
CPC ......... H01L 21/02614; H01L 21/02568; H01L 21/76843; H01L 23/53209;
(Continued)

(56) References Cited

U.S. PATENT DOCUMENTS

2016/0372351 A1 12/2016 Singh et al.
2018/0350921 A1 12/2018 Dasgupta et al.
(Continued)

FOREIGN PATENT DOCUMENTS

| TW | 201808795 A | 3/2018 |
|----|-------------|--------|
| TW | 202022148 A | 6/2020 |
| TW | 202125818 A | 7/2021 |

OTHER PUBLICATIONS

Zhang et al., "High performance few-layer MoS2 transistor arrays with wafer level homogeneity integrated by atomic layer deposition," 2D Mater. 5 (2018) 015028 (Year: 2018).*

(Continued)

*Primary Examiner* — Julia Slutsker
(74) *Attorney, Agent, or Firm* — Birch, Stewart, Kolasch & Birch, LLP

(57) ABSTRACT

An integrated circuit device includes a substrate, a first transition metal dichalcogenide layer over the substrate, a dielectric layer over the first transition metal dichalcogenide layer, a first gate electrode, and a first source contact and a first drain contact. The first transition metal dichalcogenide layer has a surface roughness greater than 0.5 nm and less than 1 nm. The first gate electrode is over the dielectric layer and a first portion of the first transition metal dichalcogenide layer. The first source contact and the first drain contact are respectively connected with a second portion and a third portion of the first transition metal dichalcogenide layer. The (Continued)

first portion of the first transition metal dichalcogenide layer is between the second and third portions of the first transition metal dichalcogenide layer.

20 Claims, 48 Drawing Sheets

Related U.S. Application Data

(60) Provisional application No. 63/220,025, filed on Jul. 9, 2021.

(51) Int. Cl.
  *H01L 23/532* (2006.01)
  *H10D 30/67* (2025.01)
  *H10D 84/03* (2025.01)
  *H10D 86/01* (2025.01)
  *H10D 87/00* (2025.01)
  *H10D 88/00* (2025.01)
  *H10D 99/00* (2025.01)

(52) U.S. Cl.
  CPC ..... *H01L 21/76856* (2013.01); *H10D 84/038* (2025.01); *H10D 86/01* (2025.01); *H10D 87/00* (2025.01); *H10D 88/01* (2025.01); *H10D 99/00* (2025.01); *H01L 23/53209* (2013.01); *H01L 23/53223* (2013.01); *H01L 23/53238* (2013.01); *H01L 23/53266* (2013.01); *H10D 30/67* (2025.01)

(58) Field of Classification Search
  CPC ......... H01L 23/53223; H01L 23/53238; H01L 23/53266; H10D 87/00; H10D 30/67; H10D 30/47; H10D 30/675; H10D 84/856; H10D 88/00; H10D 84/0149; H10D 84/83
  See application file for complete search history.

(56) References Cited

U.S. PATENT DOCUMENTS

| | | |
|---|---|---|
| 2019/0067005 A1 | 2/2019 | Yun et al. |
| 2019/0093227 A1 | 3/2019 | Yeh et al. |
| 2020/0098564 A1* | 3/2020 | Li .................... H01L 21/02381 |
| 2020/0098875 A1* | 3/2020 | Sung ...................... H10B 12/05 |
| 2020/0098934 A1 | 3/2020 | Shivaraman et al. |
| 2020/0161129 A1 | 5/2020 | Mattinen et al. |
| 2020/0185532 A1* | 6/2020 | Lin .................. H01L 21/76816 |
| 2020/0219804 A1* | 7/2020 | Jezewski ............. H10D 30/477 |
| 2021/0183650 A1* | 6/2021 | Chiu ...................... C23C 16/40 |

OTHER PUBLICATIONS

Ahn et al., "Low-Temperature Synthesis of Large-Scale Molybdenum Disulfide Thin Films Directly on a Plastic Substrate Using Plasma-Enhanced Chemical Vapor Deposition", Advanced Materials, 2015, vol. 27, pp. 5223-5229.

Chaturvedi et al., "Rapid synthesis of transition metal dichalcogenide few-layer thin crystals by the microwave-induced-plasma assisted method", Journal of Crystal Growth, 2016, vol. 450, pp. 140-147.

Grill, "Cold Plasma in Materials Fabrication: From Fundamentals to Applications", Wiley-IEEE Press, 1994, pp. 1-23.

Hyun et al., "Synthesis mechanism of MoS2 layered crystals by chemical vapor deposition using MoO3 and sulfur powders", Journal of Alloys and Compounds, 2018, total 19 pages.

Tarasov et al., "Highly Uniform Trilayer Molybdenum Disulfide for Wafer-Scale Device Fabrication", Advanced Functional Materials, 2014, vol. 24, pp. 6389-6400.

Zhao et al., "Low-temperature synthesis of 2D MoS2 on a plastic substrate for a flexible gas sensor", Nanoscale (The Royal Society of Chemistry), May 8, 2018, total 8 pages.

* cited by examiner

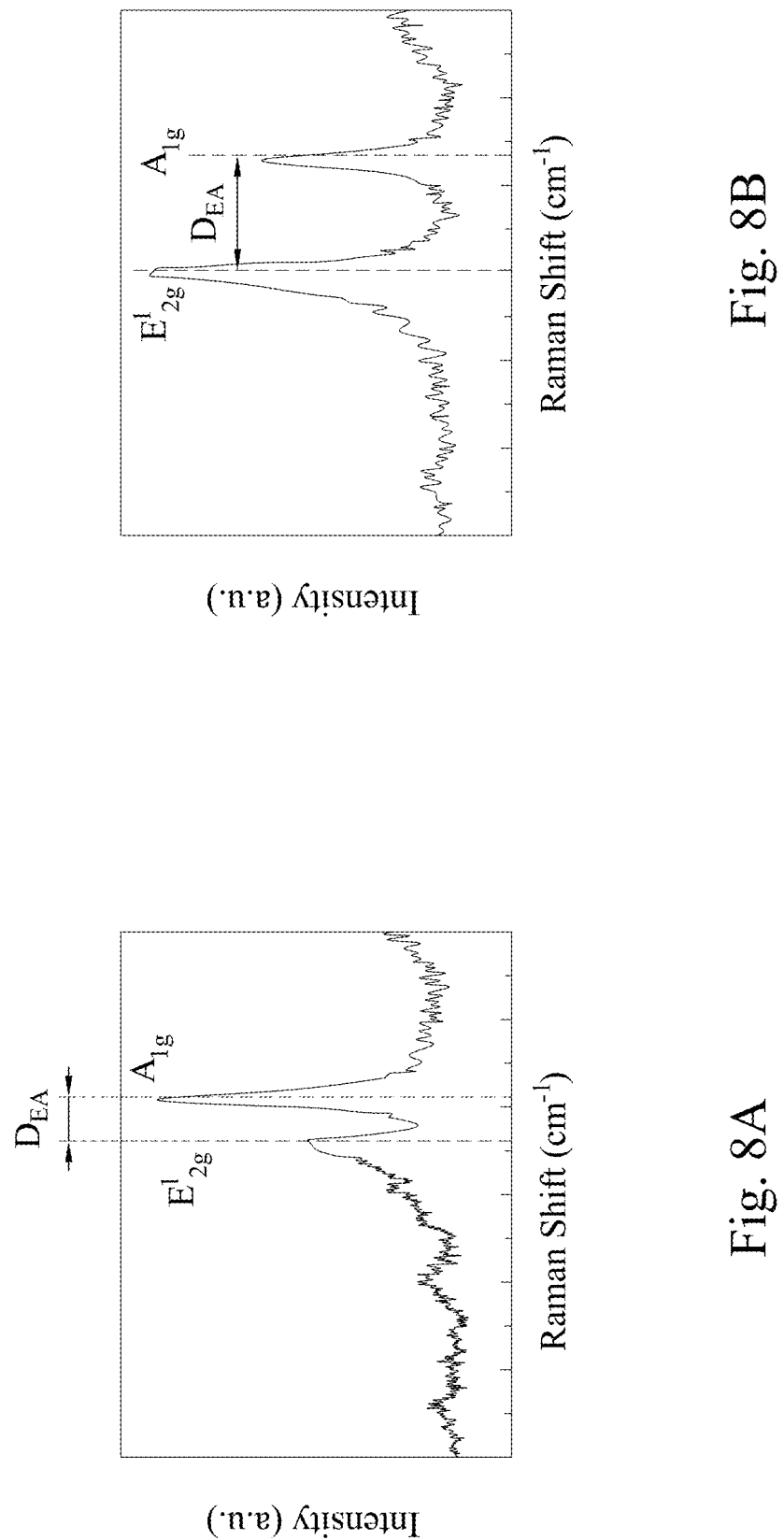

INTEGRATED CIRCUIT DEVICE

PRIORITY CLAIM AND CROSS-REFERENCE

This application is a divisional application of U.S. patent application Ser. No. 17/583,330, filed Jan. 25, 2022, which claims priority to U.S. Provisional Application Ser. No. 63/220,025, filed on Jul. 9, 2021, the entirety of which is incorporated by reference herein in their entireties.

BACKGROUND

The semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3-6A illustrate a method for forming a TMDC layer according to some embodiments of the present disclosure.

FIGS. 8A and 8B respectively shows Raman spectra of a sulfurized Mo layer and a sulfurized W layer in accordance with some embodiments of the present disclosure.

DETAILED DESCRIPTION

Figure 1A:
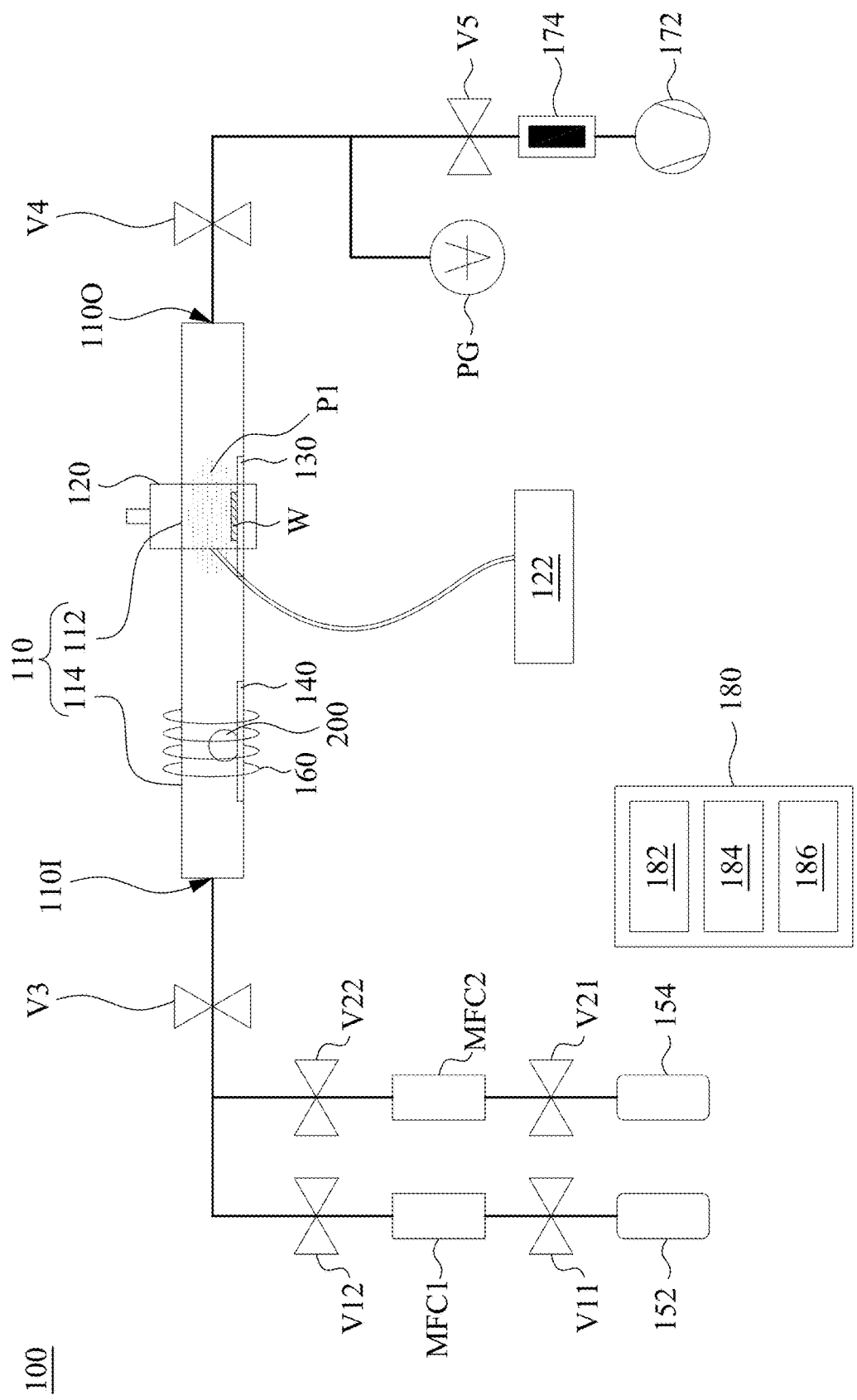
FIG. 1A is a schematic side view of an apparatus for forming a transition metal dichalcogenide (TMDC) layer according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. As used herein, "around," "about," "approximately," or "substantially" may mean within 20 percent, or within 10 percent, or within 5 percent of a given value or range. Numerical quantities given herein are approximate, meaning that the term "around," "about," "approximately," or "substantially" can be inferred if not expressly stated.

Embodiments of the present disclosure are related to a method for forming a large-area transition metal dichalcogenide (TMDC) material. TMDC material has high channel mobility, a high current ON/OFF ratio, and a good subthreshold swing. Exemplary TMDC material may include $MoS_2$, $WS_2$, or the like. In some embodiments, TMDC may serve as a channel layer in transistors. In some alternative embodiments, TMDC may serve as a barrier layer between a metal feature and a dielectric layer. Developing the method for forming a large-area TMDC material can make it easier to fabricate an integrated circuit (IC) device with TMDC material.

FIG. 1A is a schematic side view of an apparatus 100 for forming a TMDC layer according to some embodiments of the present disclosure. In some embodiments, the apparatus 100 may be referred to a plasma-enhanced chemical vapor deposition (PECVD) system. In furtherance of some embodiments, the apparatus 100 may be referred to a microwave plasma chemical vapor deposition (MPCVD) system. The apparatus 100 includes a processing chamber 110, a plasma reactor 120, a substrate holder 130, a container 140, gas sources 152, 154, a heating device 160, a vacuum pump 172, and a controller 180.

The processing chamber 110 may be referred to as a processing tube. The processing chamber 110 is fabricated from materials such as quartz that provides a non-reactive environment that will sustain plasma generation. In addition to quartz, other materials, including alumina, glass, and the like can be utilized in fabricating the processing chamber 110.

The plasma reactor 120 (or plasma generator) is associated with a power supply 122 in order to generate a plasma P1 in the processing chamber 110. The power supply 122 may be a microwave source power that generates microwaves, which may be referred to as electromagnetic waves at frequencies higher than 300 MHz. In some embodiments, the microwaves may be referred to as an ultra-high frequency (UHF) portion of the RF spectrum, for example in a range from about 2.4 GHz to about 2.5 GHz, such as at about 2.45 GHz. As the plasma P1 is a microwave plasma generated using the microwaves, the plasma reactor 120 may be referred to a microwave plasma reactor. For example, the plasma reactor 120 may be a cavity, acting as a resonator, consisting of a metal structure that confines electromagnetic fields in the microwave region of the spectrum. The metal structure is either hollow or filled with dielectric material. The microwaves bounce back and forth between the walls of the cavity. At the cavity's resonant frequencies they reinforce to form standing waves in the cavity.

In the present embodiments, a portion 112 of the process chamber 110 is surrounded by the plasma reactor 120, while a portion 114 of the process chamber 110 fluidly communicated with the portion 112 is not surrounded by the plasma reactor 120. Through the configuration, a plasma density in the portion 112 of the process chamber 110 is higher than a plasma density in the portion 114 of the process chamber 110. In some alternative embodiments, the plasma reactor 120 may surround both portions 112 and 114 of the processing chamber 110, such that a plasma density in the portion 114 may be equal to a plasma density in the portion 112.

A substrate holder 130 is placed in the portion 112 of the processing chamber 110, and supports a substrate W. The substrate holder 130 may be fabricated from materials such as quartz that is inactive to the plasma P1. In addition to quartz, other materials, including alumina, glass, and the like can be utilized in fabricating the substrate holder 130. The substrate holder 130 may be a crucible in some embodiments. In the present embodiments, the substrate W may include a transition metal layer (not shown) facing the substrate holder 130. For example, the transition metal layer may include Mo, W, Pd, Pt, the like, or the combination thereof.

In some embodiments, a chalcogen precursor 200 is stored in a container 140 placed in the portion 114 of the processing chamber 110. The container 140 may be fabricated from materials such as quartz that is inert to the plasma P1. In addition to quartz, other materials, including alumina, glass, and the like can be utilized in fabricating the container 140. The container 140 may be a crucible in some embodiments. In the present embodiments, the chalcogen precursor 200 may be stored in solid form. For example, the chalcogen precursor 200 may be one or more chalcogen pieces that have a fixed shape in solid form. The chalcogen pieces may be a S piece, a Se piece, a Te piece, the like, or the combination thereof. In some other embodiments, the chalcogen precursor 200 may be chalcogen powders that do not have a fixed shape in solid form. The chalcogen powders may be S powders, Se powders, Te powders, the like, or the combination thereof. In still some alternative embodiments, the chalcogen precursor 200 may be stored in liquid form or gas form. For example, the chalcogen precursor 200 may include chalcogen liquids, such as $C_2H_6S$, $SeF_4$, or the like, and/or chalcogen gases, such $H_2S$, $SeF_6$, $CH_4S$, $WF_6$, or the like. These chalcogen powders, chalcogen liquids, chalcogen gases may be stored in the container 140 placed in the portion 114 of the processing chamber 110 or stored in other containers external to the portion 114 of the processing chamber 110, which will be illustrated in FIGS. 14-16 later. In still some alternative embodiments, the chalcogen precursor 200 may include a combination of two or three of chalcogen solids (pieces or powers), chalcogen liquids, and chalcogen gases.

In the present embodiments, the processing chamber 110 has a gas inlet 110I and a gas outlet 110O, in which the portions 112 and 114 of the processing chamber 110 is between the gas inlet 110I and the gas outlet 110O. The portion 114 of the processing chamber 110 may be closer to the gas inlet 110I than the portion 112 of the processing chamber 110 is. One or more plasma gas sources 152 and 154 are fluidly connected with the gas inlet 110I. The plasma gas sources 152 and 154 may provide $CH_4$, Ar, and $H_2$, for example. In some examples, the gas source 152 is a $H_2$ gas source, and the gas source 154 is an Ar gas source. Mass flow controllers (MFCs) MFC1 and MFC2 or other suitable flow controllers may be utilized to control the flow rate of the gases from the gas sources 152 and 154 to the processing chamber 110. Various valves V11, V12, V21, V22, and V3 can be utilized to control the gas pressure in the processing chamber 110.

A heating device 160, such as a heating tap, may wrap around the portion 114 of the processing chamber 110. The heating device 160 may be connected to a temperature controller. Heating of the heating device 160 under control of the temperature controller can melt the chalcogen precursor 200 and produce the appropriate amount of the chalcogen containing precursor in the vapor phase. For example, in some embodiments where the chalcogen precursor 200 contains sulfur, which may have a melting point at about 120° C., a temperature of the heating device 160 may be in a range from about 120° C. to about 200° C. If the temperature of the heating device 160 is too low, sulfur may not melt, and little sulfur containing precursor is produced. If the of the heating device 160 is too high, sulfur may melt too soon, a sulfur may evaporate and consume too fast, which may result in high cost.

In some embodiments, a vacuum pump 172 is fluidly connected with the gas outlet 110O of the process chamber 110, thereby drawing gas from the process chamber 110. A backing trap 174 may be utilized in a vacuum line from the gas outlet 110O to the vacuum pump 172, for preventing back-migration of pumped gas into the process chamber 110. In some embodiments, in order to monitor the pressure in the processing chamber 110, a pressure gauge PG can be utilized in the vacuum line from the gas outlet 110O to the backing trap 174 and the vacuum pump 172. Additional vacuum elements can be utilized as appropriate to the particular application. Additionally, a valve V4 and one or more vacuum control valves V5 can be utilized to control the gas pressure in the processing chamber 110.

In some embodiments, a controller 180 is coupled to the mass flow controllers MFC1 and MFC2, the valves V11, V12, V21, V22, V3, V4, the vacuum control valve V5, the plasma generator 120 and power supply 122, a temperature controller of the heating device 160, and other suitable system components for operating the apparatus 100. In some implementations, fewer or more components can be coupled to the controller 180. The controller 180 may include a processor 182, a computer readable medium 184, and an input/output (I/O) interface 186. The processor 182 is used to perform calculations related to controlling at least some of the vacuum pressure, gas flow rates, plasma generation, the heating temperature, and other system parameters. A computer readable medium 184 (also referred to as a database or a memory) is coupled to the processor 182 in order to store data used by the processor and other system elements. Using the processor 182, the memory 184, and the I/O interface 186, a user is able to operate the system to form TMDC layer as described herein.

The processor 182 may include dedicated circuitry, ASICs, combinatorial logic, other programmable processors, combinations thereof, and the like. The processor 182 can execute instructions and data. For example, the processor 182 embodies at least part of the instructions for performing the method in accordance with the present disclosure in software, firmware and/or hardware. The computer readable medium 184 may include a hard disk drive, flash memory, a floppy disk drive along with associated removable media, an optical drive, removable media cartridges, and other like storage media. The computer readable medium 184 can storing instructions and data executed by the processor 182.

Figure 1B:
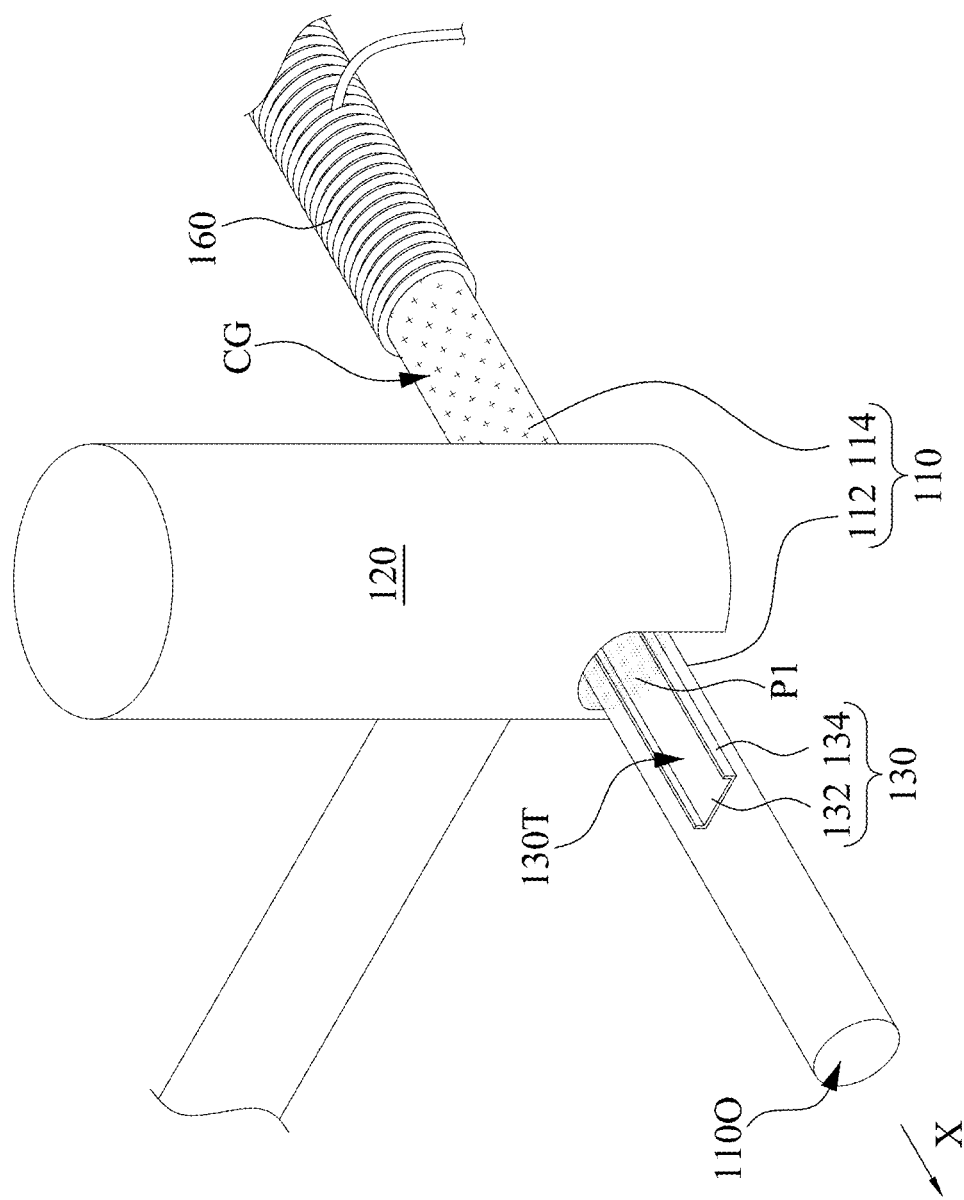
FIG. 1B shows a perspective view of a portion of the apparatus of FIG. 1A.

Reference is made to both FIGS. 1A and 1B. FIG. 1B shows a perspective view of a portion of the apparatus 100 of FIG. 1A. The substrate holder 130 may have a trench 130T facing the plasma reactor 120. In some embodiments, the substrate holder 130 have a base portion 132 and protruding edges 134 at opposite sidewalls of the base portion 132, thereby forming the trench 130T. The base portion 132 and protruding edges 134 may extend along a direction X that the process chamber 110 extends along. For example, the gas inlet 110I (referring to FIG. 1B) and the gas outlet 110O of the process chamber 110 are at opposite sides of the process chamber 110 along the direction X. The substrate W (referring to FIG. 1A) may be placed between the substrate holder 130 and the plasma reactor 120 and supported by the protruding edges 134. Through the configuration, the substrate W (referring to FIG. 1A) may cover at least a portion of the trench 130T.

In FIG. 1B, as aforementioned, the chalcogen precursor 200 (referring to FIG. 1A) is placed in the portion 114 of the processing chamber 110 and surrounded by the heating device 160. When the gas sources 152 and 154 (referring to FIG. 1A) provide a gas flow for forming plasma P1, the heated chalcogen precursor 200 may add chalcogen gas to the gas flow. For example, a gas flow CG containing chalcogen, indicated by cross-dotted pattern, may fill up the portion 114 of the processing chamber 110.

In the illustrated embodiments, the plasma generator 120 is placed over a top of the process chamber 110, and straddles lateral sides of the process chamber 110. The plasma generator 120 may not extend to a position directly below the process chamber 110. Through the configuration, an energy received from the microwave at a higher position in the process chamber 110 is greater than an energy received from the microwave at a lower position in the process chamber 110, such that the plasma P1 is mainly generated in the higher portion of the process chamber 110.

Figure 2:
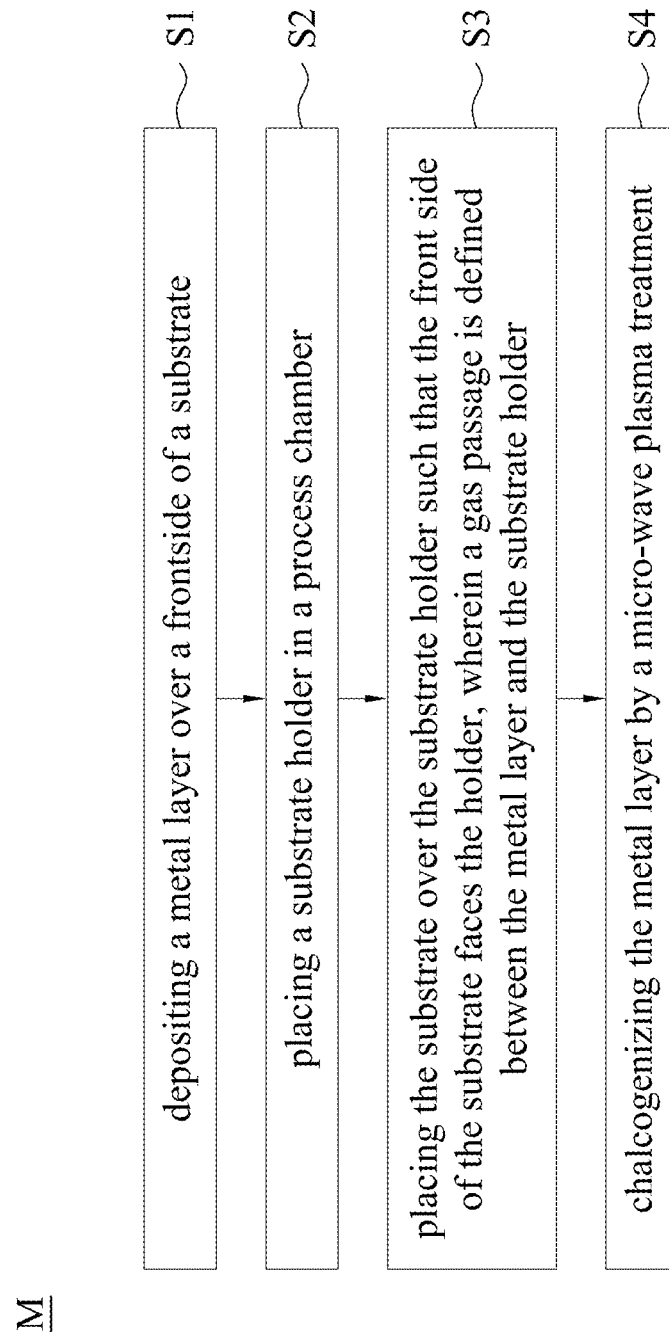
FIG. 2 is a flow chart of a method for forming a TMDC layer according to some embodiments of the present disclosure.

FIG. 2 is a flow chart of a method M for forming a TMDC layer according to some embodiments of the present disclosure. FIGS. 3-6A illustrate a method for forming a TMDC layer according to some embodiments of the present disclosure. The method M may include steps S1-S4. At step S1, a metal layer is deposited over a frontside of a substrate. At step S2, a substrate holder is placed in a process chamber. At step S3, the substrate is placed over the substrate holder such that the frontside of the substrate faces the holder, wherein a gas passage is defined between the metal layer and the substrate holder. At step S4, the metal layer is chalcogenized by a micro-wave plasma treatment. It is understood that additional steps may be provided before, during, and after the steps S1-S4 shown by FIG. 2, and some of the steps described below can be replaced or eliminated for additional embodiments of the method. The order of the operations/processes may be interchangeable.

Figure 3:
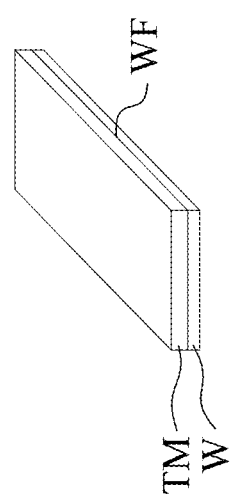

Referring to FIGS. 2 and 3, the method M begins at step S1, where a metal layer TM is deposited over a frontside WF of a substrate W. In some embodiments, the substrate W is a semiconductor substrate with transistors and an interconnect structure thereon. The substrate W is an intermediate structure of an IC manufacturing process, which can be the substrate illustrated in the embodiments of FIGS. 17A-35 or the embodiments of FIGS. 36-43 later. The substrate W may include a surface layer at its frontside WF. For example, the surface layer of the substrate W may include a dielectric material, a metal material, a semiconductor material, the like, or the combination thereof.

The metal layer TM is deposited over the surface layer of the substrate W. The metal layer TM may include a transition metal, such as Mo, W, Pd, Pt, the like, or the combination thereof. The deposition of the metal layer TM may include physical vapor deposition (PVD) (e.g., E-gun evaporation deposition or thermal evaporation deposition), atomic layer deposition (ALD), chemical vapor deposition (CVD), the like, or the combination thereof.

In some embodiments, after the deposition of the metal layer TM, the metal layer TM may be optionally patterned into a patterned metal layer by suitable lithography process and etching process. For example, a mask layer (e.g., silicon nitride layer) is deposited over the metal layer TM, and a photoresist layer is coated over the mask layer and patterned by the lithography process. Subsequently, the mask layer is patterned using the patterned photoresist layer as etch mask. Then, the metal layer TM is patterned using the patterned mask layer as etch mask. The patterning may include one or more etching process that etches the material of the metal layer TM at a faster rate than etches the mask layer and etches the surface layer of the substrate W. After the patterning, portions of the metal layer exposed by the patterned mask layer are etched away by suitable etching process, and portions of the metal layer covered by the patterned mask layer remain after the etching process.

Figure 4:
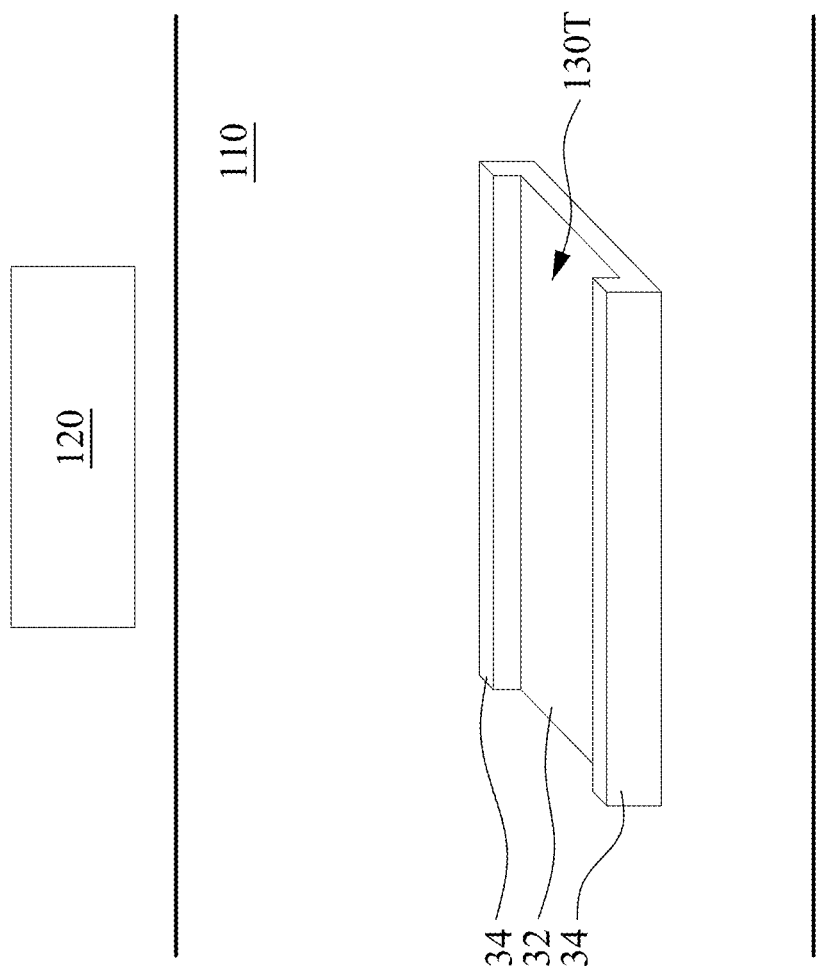

Reference is made to FIGS. 2 and 4. The method M proceeds to step S2, where a substrate holder 130 is placed in the process chamber 110. As aforementioned, the substrate holder 130 may have a trench 130T facing the plasma reactor 120. In the figures, the plasma generator 120 is illustrated as over the top of the process chamber 110, and it is understood that the plasma generator 120 may straddle lateral sides of the process chamber 110 as shown in FIG. 1B.

Figure 5A:
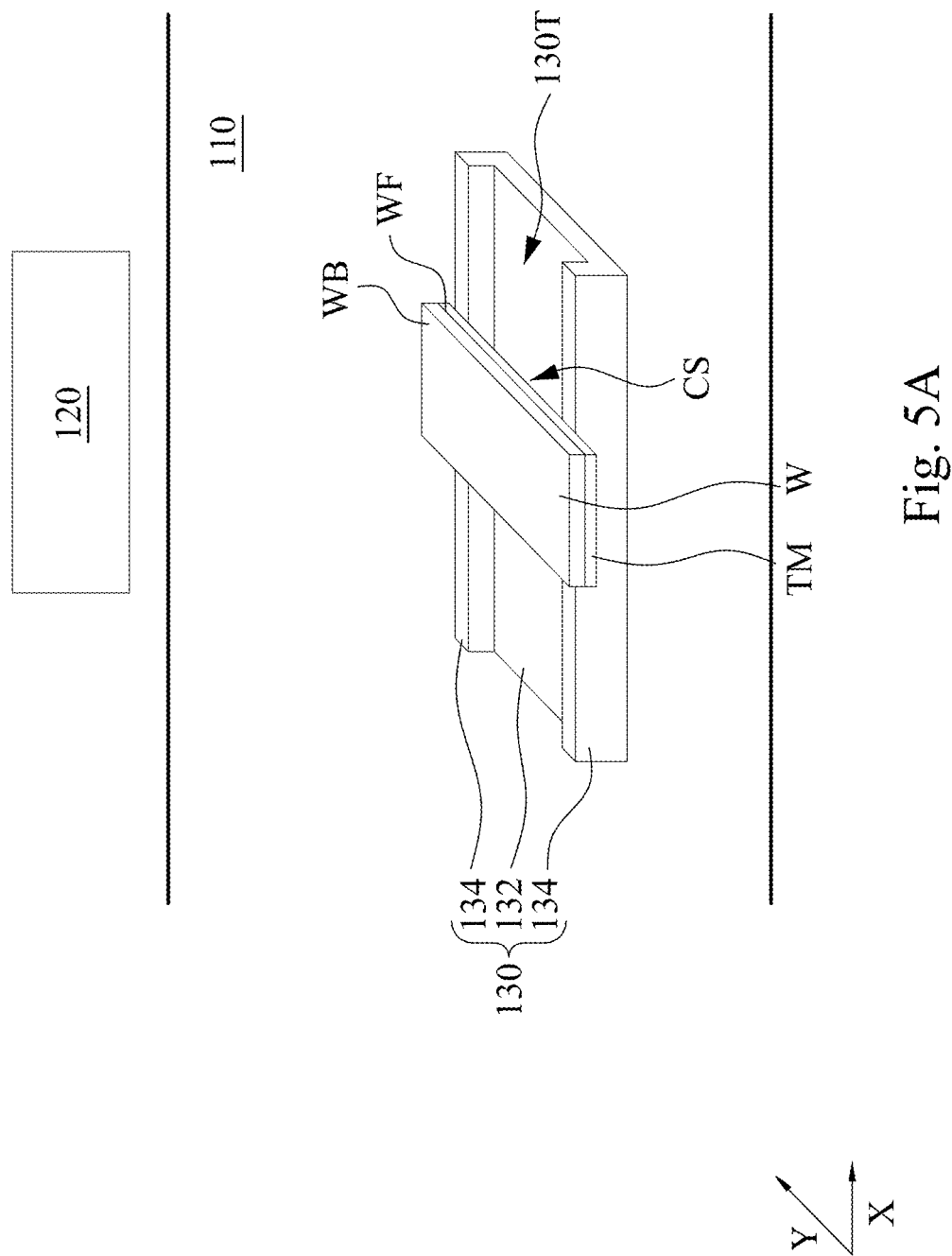
Figure 5B:
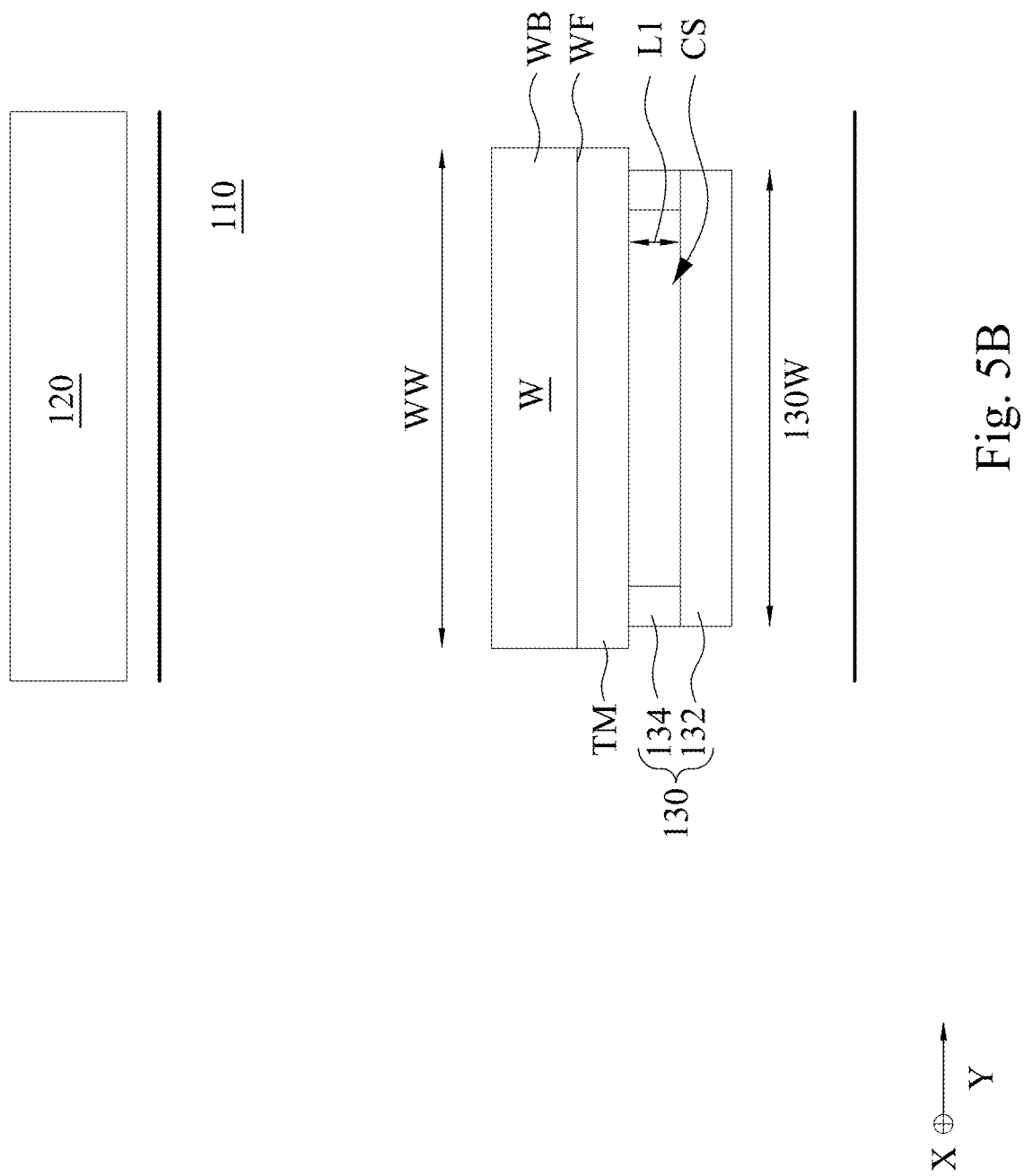

Reference is made to FIGS. 2 and 5A and 5B. FIG. 5B is a cross-sectional view of FIG. 5A. The method M proceeds to step S3, where the substrate W is placed over the substrate holder 130, such that the frontside WF of the substrate W faces the substrate holder 130. A backside WB of the substrate W, opposite to the frontside WF, may face the plasma reactor 120. In other words, the frontside WF of the substrate W faces away from the plasma reactor 120, which means the substrate W is placed on the substrate holder 130 in an up-side down manner. By using protruding edges 134 supporting the substrate W, a gas passage CS is defined between the metal layer TM and the substrate holder 130, which in turn allows for precursor gas flowing across the frontside WF of the substrate W and hence reacting with the metal layer TM to form TMDC on the frontside WF of the substrate W. The gas passage CS may have a gap height L1 (i.e., a distance between the metal layer TM and the substrate holder 130) in a range from about 100 micrometers to about 3 millimeters, or in a range from about 100 micrometers to about 750 micrometers. If the gap height L1 of the gas passage CS is less than about 100 micrometers, insufficient gas may flow through the gas passage CS, which may lower the speed for chalcogenizing the metal layer TM into a TMDC layer in subsequent process. If the gap height L1 of the gas passage CS is greater than about 3 millimeters, the substrate W may be placed outside the process tube.

In some embodiments, a width WW of the substrate W (referring to FIG. 1A) measured along a direction Y is greater than a width 130W of the substrate holder 130 measured along the direction Y. In the figures, the direction X and Y may be parallel with a top surface of the substrate W and orthogonal to each other. Through the configuration, the substrate W (referring to FIG. 1A) may be supported by the protruding edges 134 of the substrate holder 130 without contacting the base portion 132 of the substrate holder 130.

Figure 6A:
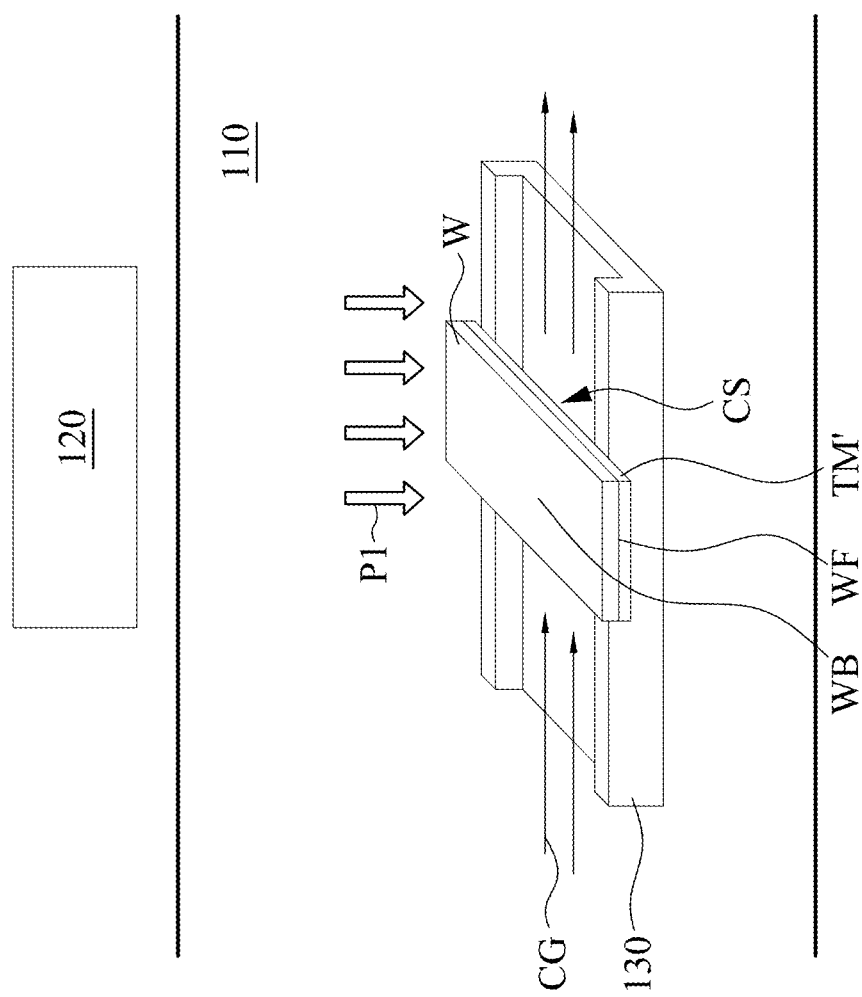

Reference is made to FIGS. 2 and 6A. The method M proceeds to step S4, where the metal layer TM is chalcogenized by a micro-wave plasma treatment. In the present embodiments, a gas flow CG containing chalcogen is directed through the gas passage CS, and the plasma reactor 120 is used to ionize the gas flow CG to create a plasma P1 around the substrate W in the process chamber 110. In some embodiments, the gas sources 152 and 154 (referring to FIG. 1A) is configured to provide a gas flow containing a mixture of Ar and $H_2$ to the process chamber 110. After the gas flow CG passes the portion 114 of the process chamber 110 (referring to FIG. 1A), the heated chalcogen precursor 200 may add chalcogen gas to the gas flow CG. The plasma reactor 120 receives microwaves from the power supply 122, the microwaves ionize the gas flow CG with the chalcogen gas and thus generates plasma P1 when microwave energy is high enough. The metal layer TM on the frontside WF of the substrate W reacts with the chalcogen in the plasma P1, and turn to a TMDC layer TM'. In some embodiments, depending on the chalcogen contained in the gas flow CG, the chalcogenizing process (e.g., turning the metal layer TM into the TMDC layer TM') may be referred to as sulfurizing process, selenizing process, or the like. During the chalcogenizing process, some species may be in-situ doped into the TMDC layer by fluidly connecting the doping source to the gas inlet 110I (referring to FIG. 1A).

TMDCs are a class of materials with the chemical formula $MX_2$, wherein M is a transition metal element such as titanium, vanadium, cobalt, nickel, zirconium, molybdenum, technetium, rhodium, palladium, hafnium, tantalum, tungsten, rhenium, iridium, platinum, and X is a chalcogen such as sulfur, selenium, or tellurium. Examples of TMDC include $MoS_2$, $WS_2$, $WSe_2$, $MoSe_2$, $MoTe_2$, $WTe_2$, the like, or a combination thereof. Once formed, the TMDC layer TM' is in a layered structure with one or a plurality of two-dimensional layers of the general form X-M-X, with the chalcogen atoms in two planes separated by a plane of metal atoms.

Figure 6B:
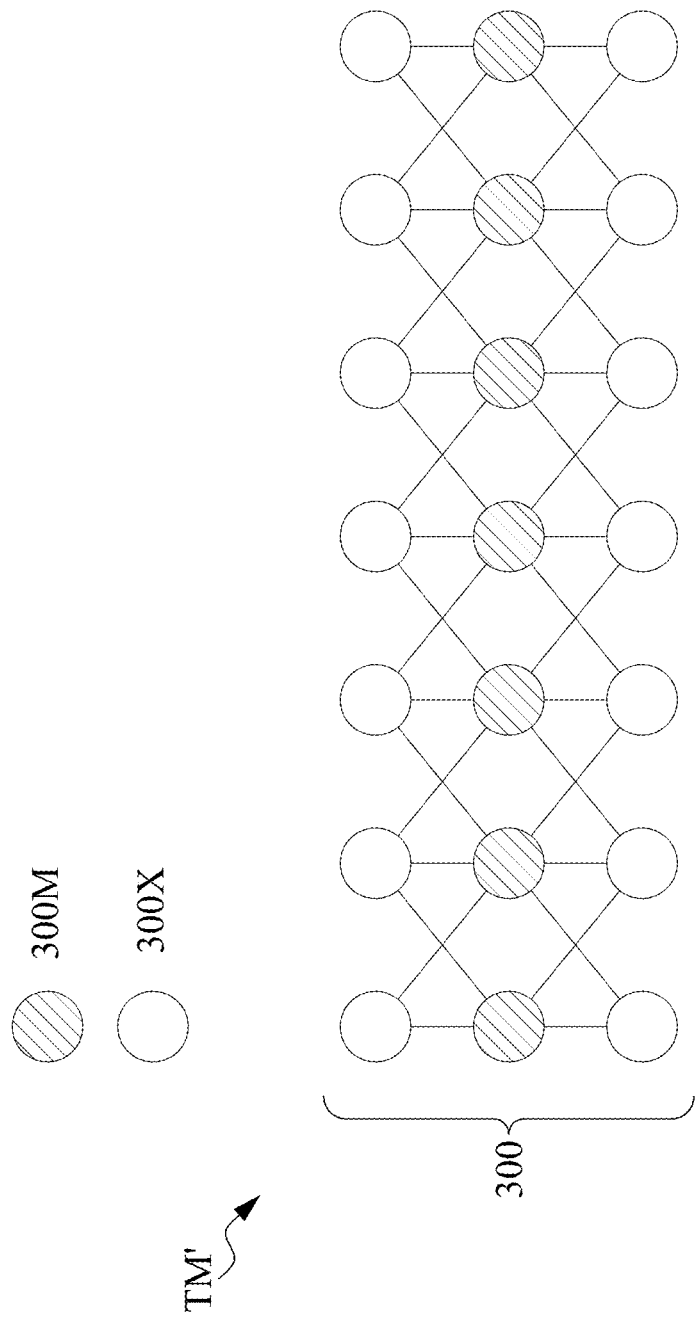
FIG. 6B illustrates a schematic view of a mono-layer of an example TMDC layer in accordance with some example embodiments.

The TMDC layer TM' may be a mono-layer or may include a few mono-layers, depending on thickness of the metal layer TM (referring to FIG. 3). FIG. 6B illustrates a schematic view of a mono-layer 300 of an example TMDC layer TM' in accordance with some example embodiments. In FIG. 6B, the one-molecule thick TMDC layer 300 comprises transition metal atoms 300M and chalcogen atoms 300X. The transition metal atoms 300M may form a layer in a middle region of the one-molecule thick TMDC layer 300, and the chalcogen atoms 300X may form a first layer over the layer of transition metal atoms 300M, and a second layer underlying the layer of transition metal atoms 300M. The transition metal atoms 300M may be W atoms or Mo atoms, while the chalcogen atoms 300X may be S atoms, Se atoms, or Te atoms. In the example of FIG. 6B, each of the transition metal atoms 300M is bonded (e.g., by covalent bonds) to six chalcogen atoms 300X, and each of the chalcogen atoms 300X is bonded (e.g. by covalent bonds) to three transition metal atoms 300M. Throughout the description, the illustrated cross-bonded layers including one layer of transition metal atoms 300M and two layers of chalcogen atoms 300X in combination are referred to as a mono-layer 300 of the TMDC layer TM'.

In some embodiments, during the plasma treatment, the operating power of the power supply 122 may be in a range from about 20 W to about 100 W. If the power is lower than about 20 W, it is hard to form plasma. If the power is higher than about 100 W, the substrate or a peripheral region of the substrate may be damaged by plasma.

In some embodiments, during the plasma treatment, a flow rate of the gas flow CG provided by the gas sources 152 and 154 (referring to FIG. 1A) is in a range from about 1 standard cubic centimeter per minute (sccm) to about 50 sccm. The gas flow CG may include a reactive gas mixture of $H_2$, Ar, and $H_2S$. If the flow rate of the gas flow CG is lower than about 1 sccm, it is hard to form plasma. If the flow rate of the gas flow CG is greater than about 50 sccm, the chalcogen gas (e.g., $H_2S$) may move too fast to react with metal film, and the pressure may be too high to form plasma.

In some embodiments, during the plasma treatment, the process pressure of the process chamber 110, for example, monitored by the pressure gauge PG (referring to FIG. 1A), is in a range from several mTorrs to hundreds of mTorrs. For example, the process pressure of the process chamber 110 may be in a range from about $8 \times 10^{-2}$ torr to about $9 \times 10^{-2}$ torr. If the pressure is higher than about $9 \times 10^{-2}$ torr, the ionization efficiency is low, and it may not be easy to form plasma. If the pressure is lower than about $8\times10^{-2}$ torr, the voltage to break down the gas is high, and therefore it may not be easy to form plasma.

In some embodiments, a time duration for performing the plasma treatment is in a range from about 1 minute to about 15 minutes. If the time duration is less about about 1 minute, the chalcogenizing reaction may be incomplete, which may result in non-uniform chalcogenized metal layers. If the time duration is greater than about 15 minutes, long-time exposure to plasma may result in rough surface damage, and it may unnecessarily increase process time.

Referring back to FIG. 6A. In some embodiments of the present disclosure, since the microwave plasma is reaction trigger, the plasma can be formed intensively with a high energy in the desired region, such that a transition metal layer TM (referring to FIG. 3) can be turned into a TMDC layer TM' without heating the substrate W (e.g., using a heating device in contact with the substrate W to directly heat the substrate W). Through the configuration, the TMDC layer TM' is synthesized at a low temperature. For example, a temperature of the process chamber 110 can be controlled below about the 400° C., which may reduce the thermal budget. Thermal budget may be referred to as total amount of thermal energy transferred to the wafer during the given elevated temperature operation, and low thermal budget is desired in IC manufacturing to prevent dopant redistribution. Also, in some embodiments of the present disclosure, the TMDC layer TM' is formed without heating the substrate W (e.g., using a heating device in contact with the substrate W to directly heat the substrate W), thereby the process for heating and cooling the substrate W is not required, which in turn will lead to short process time.

Furthermore, by placing the substrate W upside down, the plasma P1 is impinged on the backside WB of the substrate W. While the plasma P1 may bombard the backside WB of the substrate, the frontside WF of the substrate W is protected from being bombarded by the plasma. Through the configuration, the TMDC layer TM' on the frontside WF of the substrate W may not be damaged by the plasma P1.

In some further embodiments, by depositing the transition metal layer TM (referring to FIG. 3) with suitable thicknesses and etching the transition metal layer TM (referring to FIG. 3) with desired patterns, the resultant TMDC layer TM' may be formed with suitable thicknesses and desired patterns.

Figure 7B:
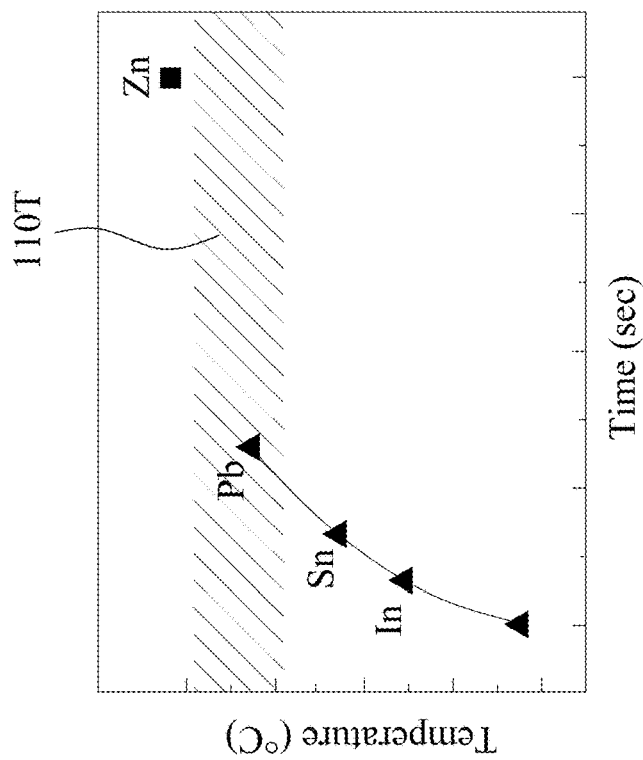
FIG. 7B shows a temperature of a process chamber of an apparatus for forming a TMDC layer according to some embodiments of the present disclosure.
Figure 7A:
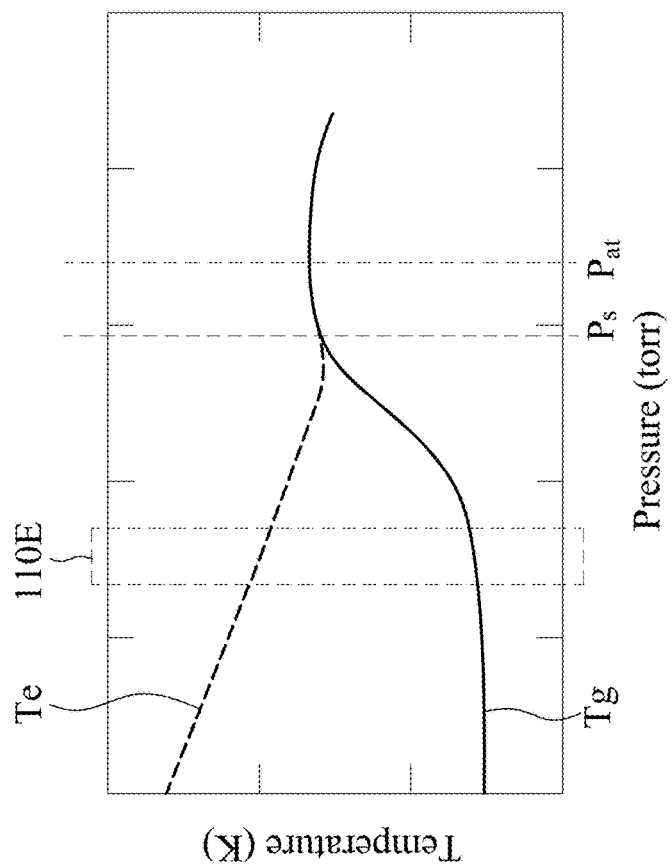
FIG. 7A is a chart of electron temperature and gas temperature versus pressure according to some embodiments of the present disclosure.

FIG. 7A is a chart of electron temperature (Te) and gas temperature (Tg) versus pressure. The electron temperature (Te) may represent the temperature of electrons in a chamber. The gas temperature (Tg) means the temperature of ions and neutral atoms in the chamber, which may dominate a temperature of the process chamber. Local thermal equilibrium is not maintained at pressure much lower than the atmospheric pressure $P_{at}$. The beginning of the thermal non-equilibrium may be indicated as a pressure $P_s$. At high pressures (e.g., higher than the pressure $P_s$), a thermal plasma (or hot plasma) may occur with Te~Tg. At low pressures (e.g., lower than the pressure $P_s$), a non-thermal plasma (or cold plasma) occurs with Te>>Tg.

In some embodiments of the present disclosure, the portion 112 of the process chamber 110 (referring to FIGS. 1A, 1B, and 6A) for forming the TMDC layer is controlled at the region 110E. As the pressure of the portion 112 of the process chamber 110 (referring to FIGS. 1A, 1B, and 6A) is lower than the pressure $P_{at}$, the gas temperature (Tg) of the gas in the portion 112 of the process chamber 110 is much lower than the electron temperature (Te) of the gas in the portion 112 of the process chamber 110. As a result, the process chamber 110 can be kept at a low temperature.

FIG. 7B shows a temperature of a process chamber 110 of an apparatus 100 (referring to FIGS. 1A, 1B, and 6A) for forming a TMDC layer according to some embodiments of the present disclosure. In some embodiments, various metals having different melting points are disposed in the process chamber 110 for testing a temperature of the portion 112 of the process chamber 110 (referring to FIGS. 1A and 1B). By checking the melting conditions of these metals, a temperature of the portion 112 of the process chamber 110 (referring to FIGS. 1A and 1B) can be inferred. For example, by checking the melting condition of these metals, it may be concluded that the temperature of the portion 112 of the process chamber 110 (referring to FIGS. 1A and 1B) is higher than melting points of In and Sn, overlapping a melting point of Pb (e.g., about 328° C.), and lower than a melting points of Zn (e.g., about 420° C.). As a result, the temperature of the portion 112 of the process chamber 110 can be indicated as a temperature range 110T in the figure, in which the temperature range 110T may range from about 300° C. to about 400° C., or from about 328° C. to about 420° C.

FIGS. 8A and 8B respectively show Raman spectra of a sulfurized Mo layer and a sulfurized W layer in accordance with some embodiments of the present disclosure. The Raman spectra may, as an example, be obtained by performing Raman spectroscopy on the layers after the plasma treatments. The existence of $MX_2$ (e.g., $MoS_2$ and $WS_2$) in the layers is confirmed by a first characteristic peak $E^1_{2g}$ and a second characteristic peak $A_{1g}$ for $MX_2$, wherein the prominent peaks at $E^1_{2g}$ and $A_{1g}$ correspond to in-plane and out-of-plane vibrations of atoms. Through the Raman spectra shown by FIGS. 8A and 8B, the sulfurized Mo layer and the sulfurized W layer are considered as a $MoS_2$ layer and $WS_2$ layer, respectively.

In the Raman spectrum shown in FIG. 8A, the first characteristic peak $E^1_{2g}$ is located in a range from about 380 $cm^{-1}$ to about 384 $cm^{-1}$, and the second characteristic peak $A_{1g}$ is located in a range from about 403 $cm^{-1}$ to about 408 $cm^{-1}$. It is noted that the positions of the first characteristic peak $E^1_{2g}$ and the second characteristic peak $A_{1g}$ for $MoS_2$ can vary within the above-mentioned ranges depending on the number of the $MoS_2$ layers. If the number of the $MoS_2$ layers decreases, the first characteristic peak $E^1_{2g}$ may slightly shift to right, and the second characteristic peak $A_{1g}$ may slightly shift to left. A distance $D_{EA}$ between the first characteristic peak $E^1_{2g}$ and the second characteristic peak $A_{1g}$ may decrease as the number of the $MoS_2$ layers decreases. For example, the distance $D_{EA}$ is in a range from about 19 $cm^{-1}$ to about 25 $cm^{-1}$, corresponding to one to five or more $MoS_2$ layers.

In the Raman spectrum shown in FIG. 8B, the first characteristic peak $E^1_{2g}$ is located in a range from about 349 $cm^{-1}$ to about 353 $cm^{-1}$, and the second characteristic peak $A_{1g}$ is located in a range from about 410 $cm^{-1}$ to about 413 $cm^{-1}$. It is noted that the positions of the first characteristic peak $E^1_{2g}$ and the second characteristic peak $A_{1g}$ for $WS_2$ can vary within the above-mentioned ranges depending on the number of the $WS_2$ layers. If the number of the $WS_2$ layers decreases, the first characteristic peak $E^1_{2g}$ may slightly shift to right, and the second characteristic peak $A_{1g}$ may slightly shift to left. A distance $D_{EA}$ between the first characteristic peak $E^1_{2g}$ and the second characteristic peak $A_{1g}$ may decrease as the number of the $WS_2$ layers decreases. For example, the distance $D_{EA}$ is in a range from about 60 cm$^{-1}$ to about 65 cm$^{-1}$, corresponding to one to five or more WS$_2$ layers.

FIGS. 9A-9E show Raman spectra of sulfurized Mo layers over various substrates under different operating powers in accordance with some embodiments of the present disclosure. In FIGS. 9A-9E, the operating powers increase from P #1 to P #5, and the deposition times are substantially the same. FIGS. 9A-9E show Raman spectra of the sulfurized Mo layers over a SiO$_2$ layer, a low-k dielectric layer, a high-k dielectric layer, a sapphire substrate, and a SiO$_2$ layer, respectively. Through the Raman spectra shown by FIGS. 9A-9E, it is evidenced that the sulfurized Mo layers on the SiO$_2$ layer, the low-k dielectric layer, the high-k dielectric layer, the sapphire substrate, are MoS$_2$ layers.

Figure 9B:
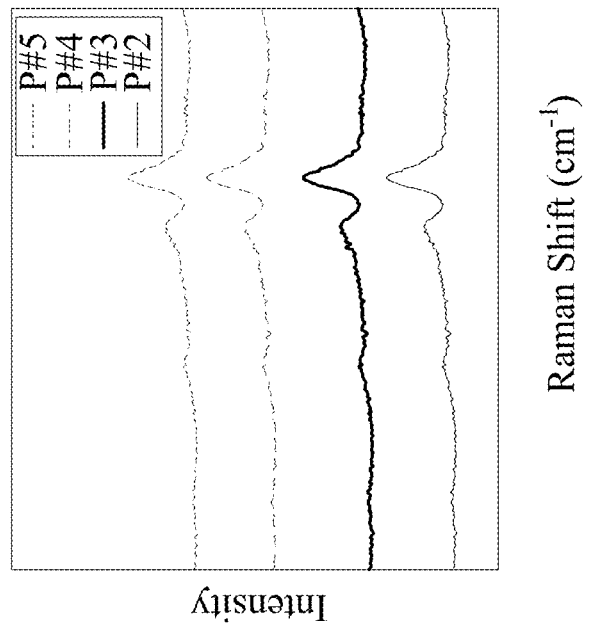
FIGS. 9A-9E shows Raman spectra of sulfurized Mo layers over various substrates under different operating powers in accordance with some embodiments of the present disclosure.
Figure 9A:
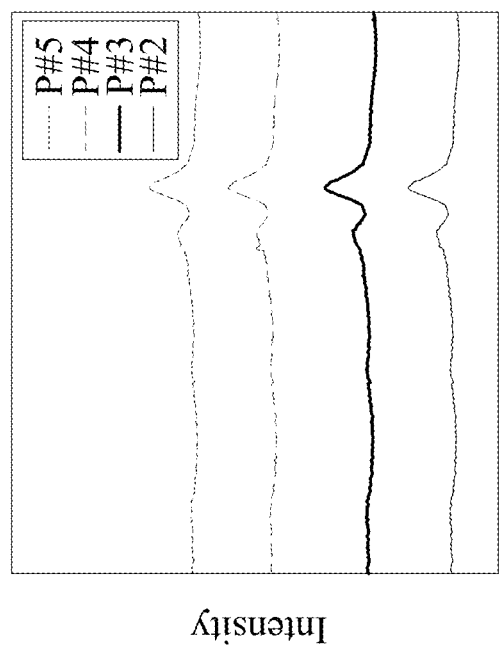
Figure 9D:
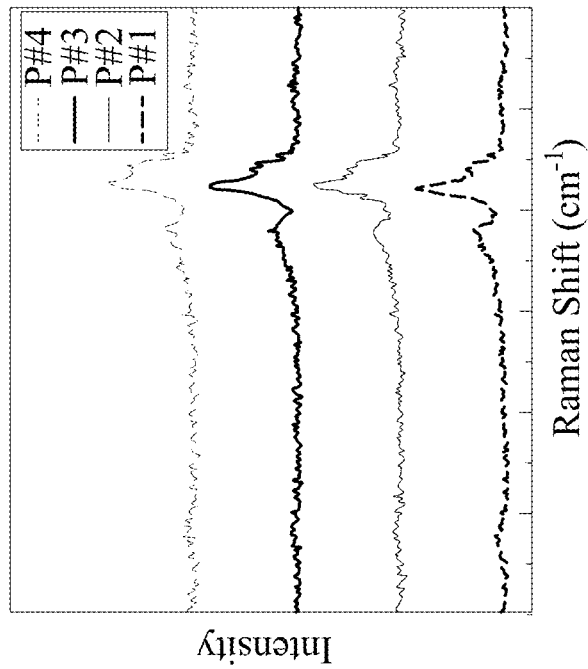
Figure 9C:
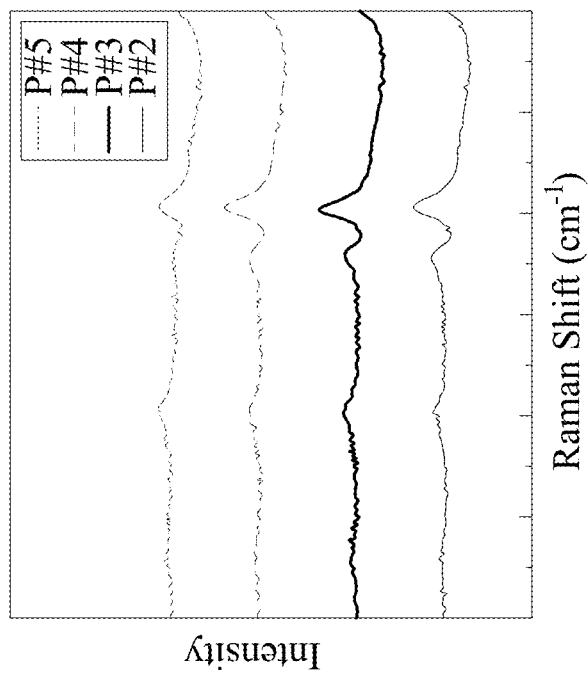
Figure 9F:
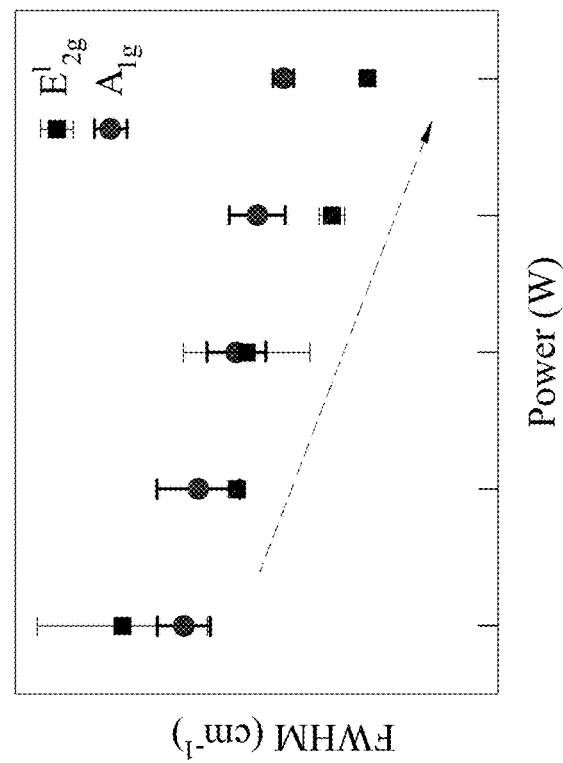
FIG. 9F shows a relationship between the operating powers and the full width at half maximum (FWHM) of FIG. 9E.
Figure 9E:
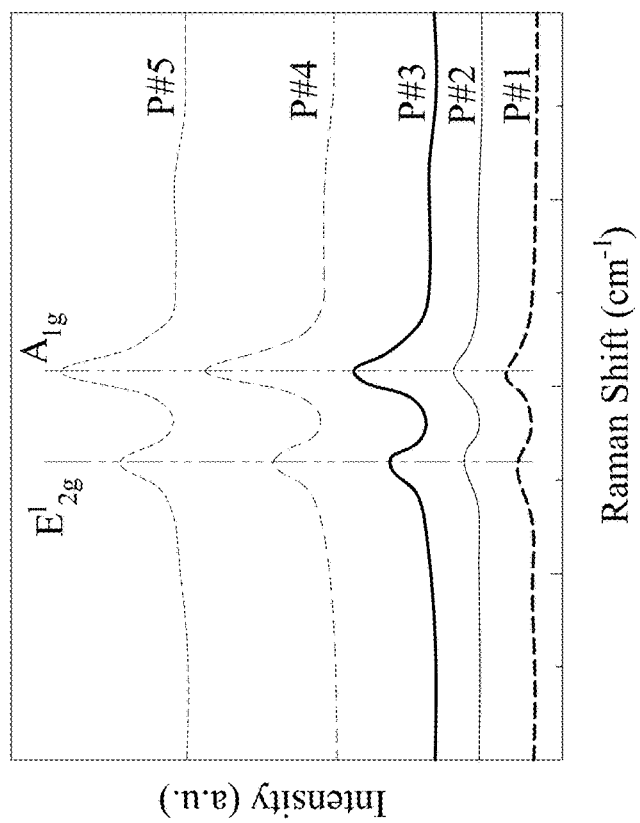

FIG. 9F shows a relationship between the operating powers and the full width at half maximum (FWHM) of the characteristic peaks $E^1_{2g}$ and $A_{1g}$ of FIG. 9E. As the operating power is increased, the FWHM of the characteristic peaks $E^1_{2g}$ and $A_{1g}$ and their error bars decrease. This indicates that the higher operating power may bring out more consistent quality in resultant MoS$_2$ layer.

Figure 10C:
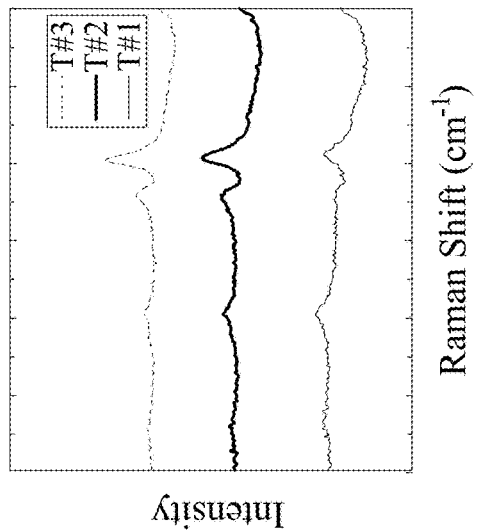
FIGS. 10A-10C shows Raman spectra of sulfurized Mo layers over various substrates under different deposition times in accordance with some embodiments of the present disclosure.
Figure 10B:
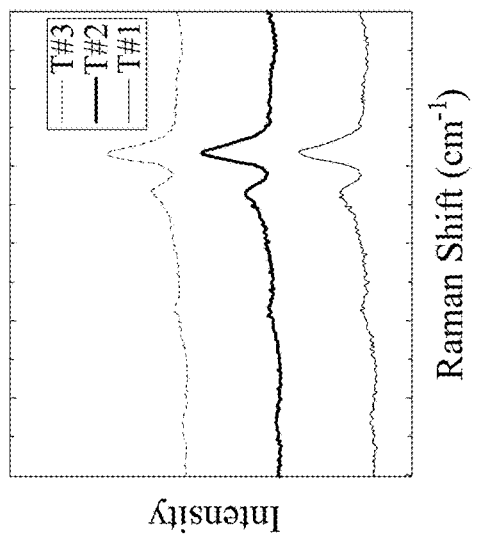
Figure 10A:
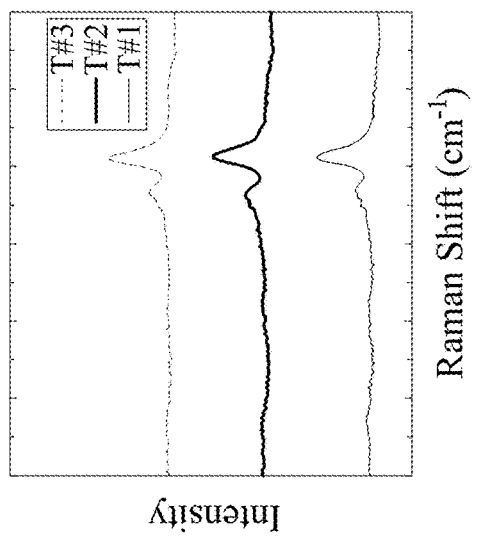

FIGS. 10A-10C show Raman spectra of sulfurized Mo layers over various substrates under different deposition times in accordance with some embodiments of the present disclosure. In FIGS. 10A-10C, the deposition times increase from T #1 to T #3, and the operating powers are substantially fixed the same. FIGS. 10A-10C show Raman spectra of the sulfurized Mo layers over a SiO$_2$ layer, a low-k dielectric layer, and a high-k dielectric layer, respectively. Through the Raman spectra, it is evidenced that the sulfurized Mo layers over the SiO$_2$ layer, the low-k dielectric layer, and the high-k dielectric layer, are MoS$_2$ layers.

The figures also show that the longer deposition time result in small FWHM, which is an indicative of strong signal of the resultant MoS$_2$ layer. As a result, the longer deposition time may result in better quality in resultant MoS$_2$ layer. Also, comparing FIG. 10C to FIGS. 10A and 10B, it seems that the FWHM of the Raman spectrum of FIG. 10C is greater than the FWHMs of the Raman spectrums of FIGS. 10A and 10B. This may indicate that the MoS$_2$ layers over the SiO$_2$ layer and the low-k dielectric layer have better film quality than the MoS$_2$ layer over the high-k dielectric layer does.

Figure 11B:
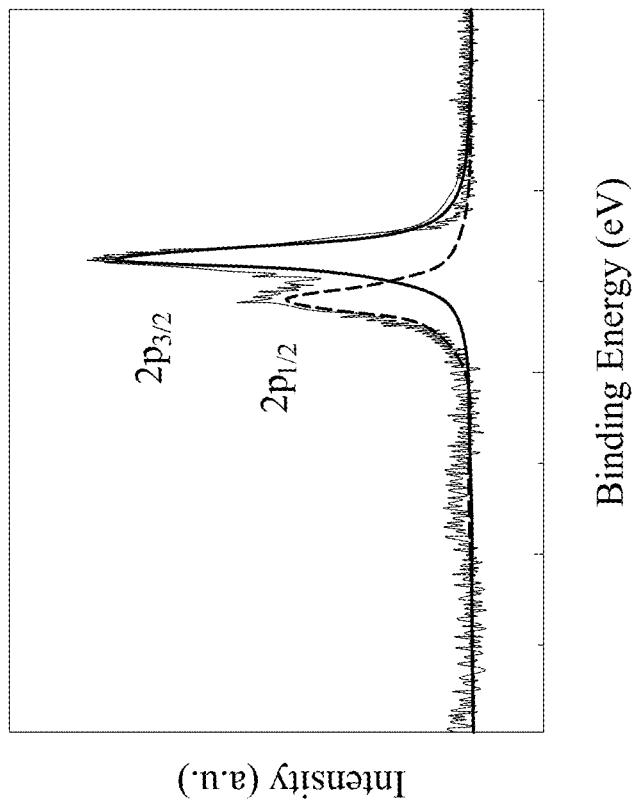
FIGS. 11A and 11B respectively show molybdenum (Mo) and sulfur(S) X-ray photoelectron spectroscopy (XPS) data of a resultant layer in accordance with some embodiments of the present disclosure.
Figure 11A:
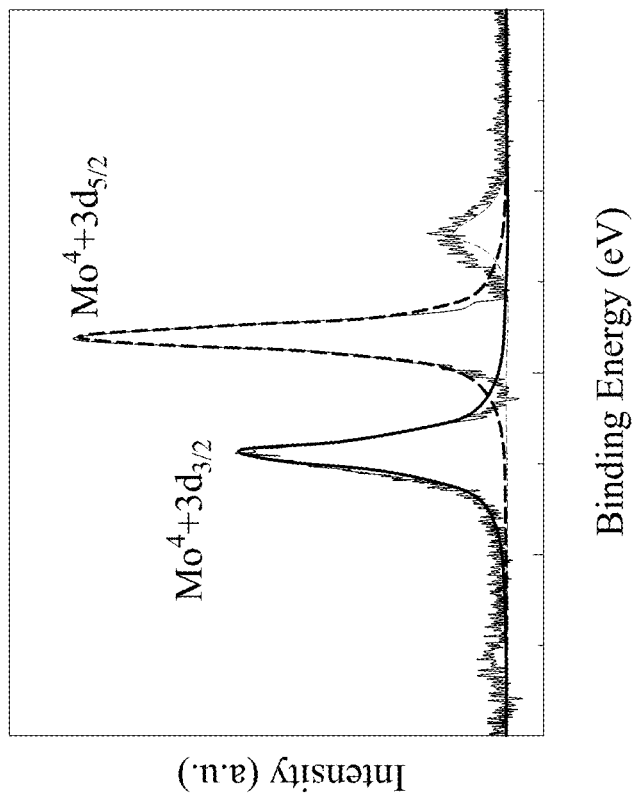

FIGS. 11A and 11B respectively show molybdenum (Mo) and sulfur (S) X-ray photoelectron spectroscopy (XPS) data of a resultant sulfurized Mo layer in accordance with some embodiments of the present disclosure. The binding energy and atomic ratio of a resultant sulfurized Mo layer is checked using X-ray photoelectron spectroscopy (XPS). In FIG. 11A, the two peaks of Mo binding energy correspond to Mo$^{4+}$3d$_{5/2}$ and Mo$^{4+}$3d$_{3/2}$, respectively. In FIG. 11B, the two peaks of S binding energy correspond to 2p$_{3/2}$ and 2p$_{1/2}$, respectively. As confirmed by FIGS. 11A and 11B, the element composition ratio of S:Mo is in a range from about 1.9:1 to about 2.1:1, such as about 2:1. This indicates that the resultant sulfurized Mo layer is a MoS$_2$ layer.

Figure 12B:
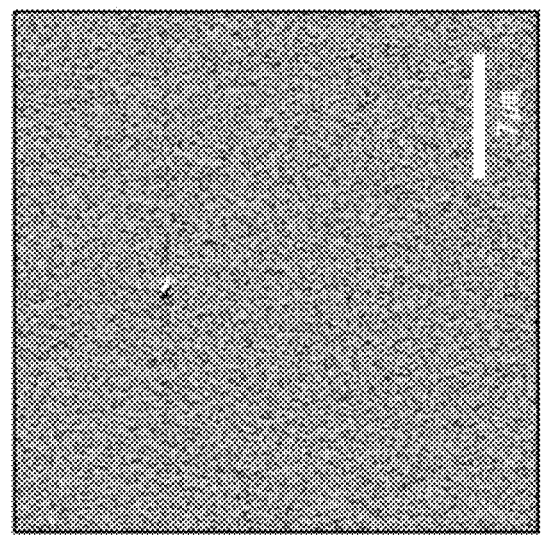
FIGS. 12A and 12B shows Atomic Force Microscope (AFM) of resultant $MoS_2$ layers over various substrates in accordance with some embodiments of the present disclosure.
Figure 12A:
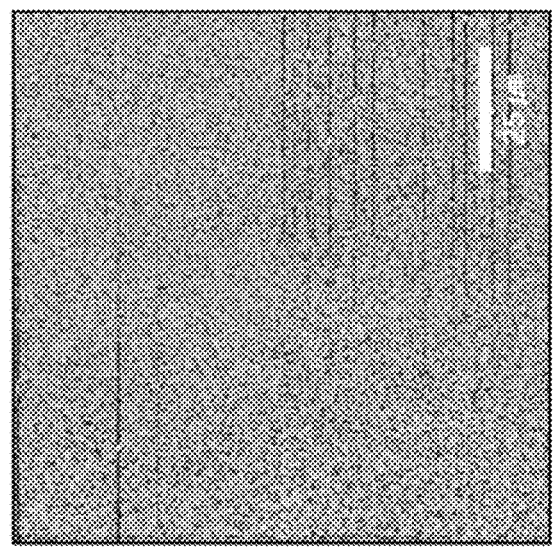

FIGS. 12A and 12B shows Atomic Force Microscope (AFM) of resultant MoS$_2$ layers over a high-k dielectric layer and a SiO$_2$ layer, respectively, in accordance with some embodiments of the present disclosure. The operating powers during the plasma treatment for forming the TMDC are the same for MoS$_2$ layers in the FIGS. 12A and 12B. A large area TMDC layer is synthesized regardless of material of the surface layer of the substrate. As confirmed by FIGS. 12A and 12B, the resultant MoS$_2$ layers over the high-k dielectric layer (FIG. 12A) and over the SiO$_2$ layer (FIG. 12B) have very small surface roughness. In the context, a surface roughness may be represented by a centerline averaged roughness, Ra, which is the average area per unit length that is off the center line (mean). Stated differently, Ra is arithmetic average of plural absolute values of a roughness profile ordinates. By analyzing the AFM, it is confirmed that the surface roughness (e.g., Ra) of the resultant MoS$_2$ layers are below 1 nanometer. For example, the surface roughness (e.g., Ra) of the MoS$_2$ layer illustrated in FIG. 12A may be in a range from about 0.5 nm to about 0.6 nm (e.g., about 0.536 nm), and the surface roughness (e.g., Ra) of the MoS$_2$ layer illustrated in FIG. 12B may be in a range from about 0.8 nm to about 0.9 nm (e.g., about 0.889 nm).

Figure 13B:
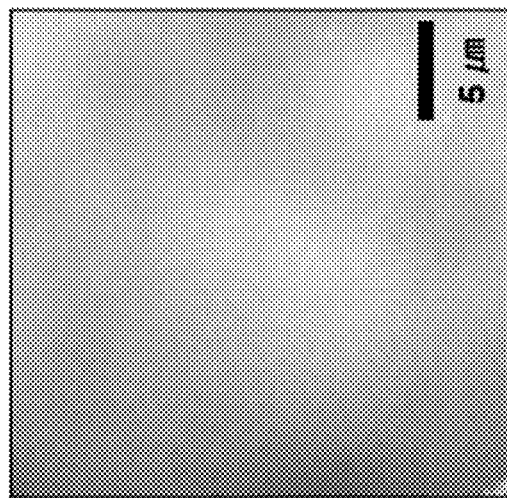
FIGS. 13A and 13B respectively shows AFM of a Mo layer over a dielectric layer prior to plasma treatment and a corresponding $MoS_2$ layer over the dielectric layer after plasma treatment in accordance with some embodiments of the present disclosure.
Figure 13A:
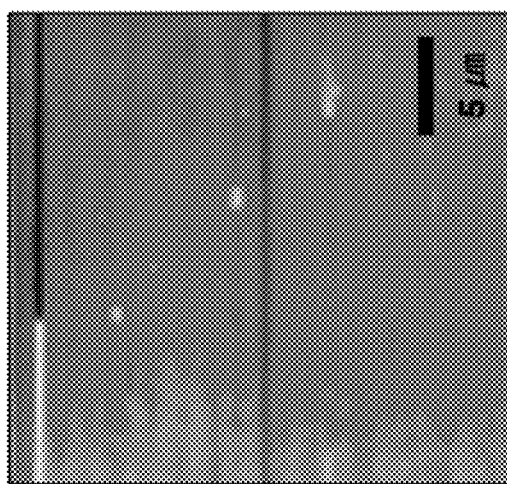

FIGS. 13A and 13B respectively shows AFM of a Mo layer over a dielectric layer prior to plasma treatment and a corresponding MoS$_2$ layer over the dielectric layer after plasma treatment in accordance with some embodiments of the present disclosure. As shown by FIG. 13A, prior to the plasma treatment, the Mo layer has very small surface roughness (e.g., Ra), which is below 1 nanometer. For example, the surface roughness (e.g., Ra) of the Mo layer illustrated in FIG. 13A may be in a range from about 0.3 nm to about 0.4 nm (e.g., about 0.37 nm). After the plasma treatment, as shown by FIG. 13B, the MoS$_2$ layer has very small surface roughness (e.g., Ra), which is below 1 nanometer. For example, the surface roughness (e.g., Ra) of the MoS$_2$ layer illustrated in FIG. 13B may be in a range from about 0.6 nm to about 0.7 nm (e.g., about 0.66 nm). This indicates that the plasma treatment shows little or no influence in roughness, which is highly potential application in back-end processes.

Figure 14:
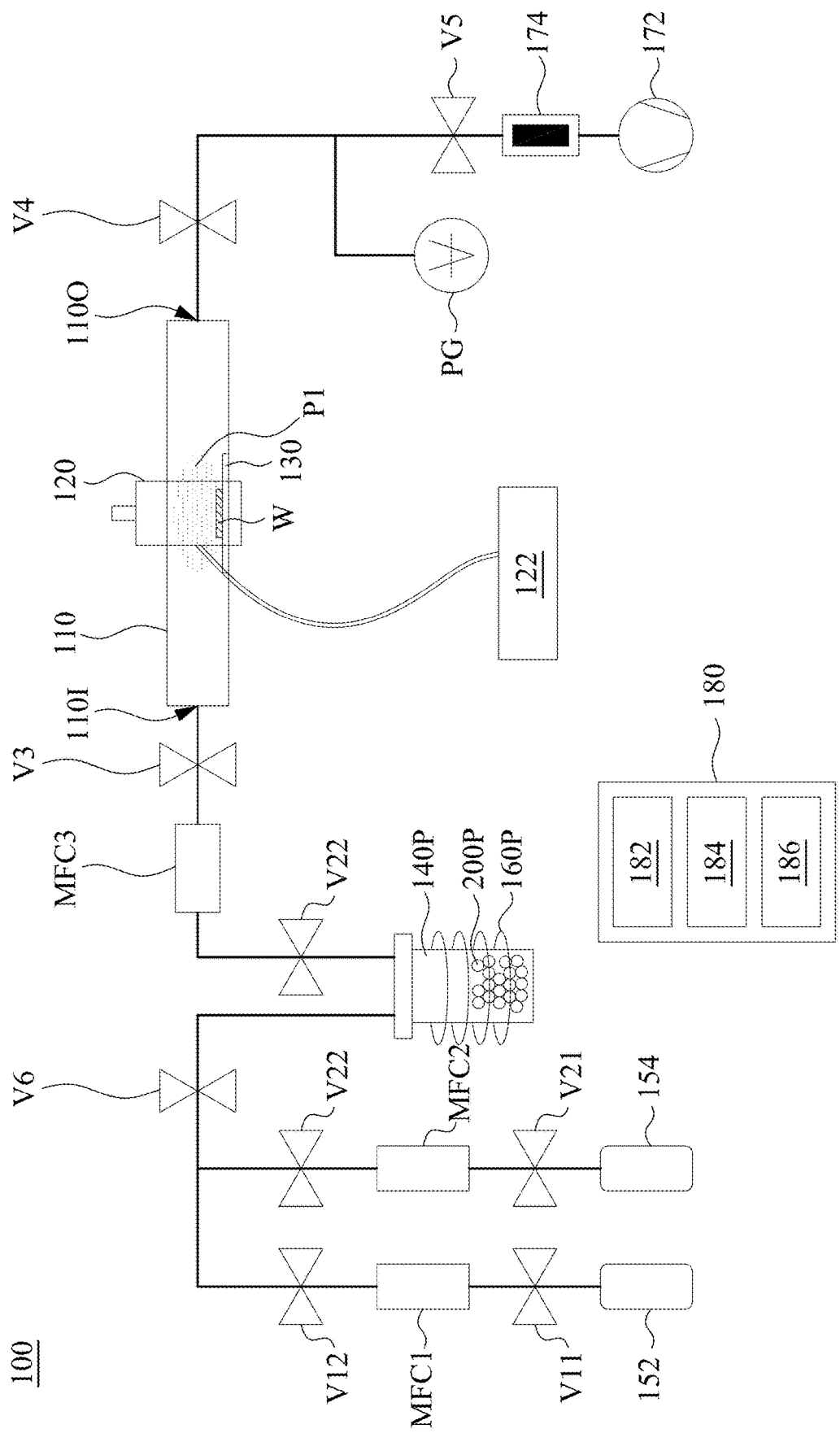
FIG. 14 is a schematic side view of an apparatus for forming a TMDC layer according to some embodiments of the present disclosure.

FIG. 14 is a schematic side view of an apparatus for forming a TMDC layer according to some embodiments of the present disclosure. The present embodiments are similar to those illustrated in the embodiments of FIG. 1A, except that a chalcogen precursor 200P in the form of powder is used for providing chalcogen element to plasma P1. For example, the chalcogen precursor 200P may include S, Se, Te powder. In the present embodiments, the chalcogen precursor 200P is stored external to the process chamber 110. For example, the chalcogen precursor 200P is stored in a container 140P, which is fluidly communicated with the gas sources 152 and 154 and surrounded by a heating device 160P. The heating device 160P may heat the chalcogen precursor 200P and melt the chalcogen precursor 200P, thereby producing the appropriate amount of the chalcogen containing precursor in the vapor phase. Therefore, while the gas sources 152 and 154 provide gas flow for forming plasma P1, the heated chalcogen precursor 200P may add chalcogen gas to the gas flow. For example, in some embodiments where the chalcogen precursor 200P contains sulfur, which may have a melting point at about 120° C., a temperature of the heating device 160P may be in a range from about 120° C. to about 200° C. If the temperature of the heating device 160P is lower than about 120° C., sulfur may not melt, and little chalcogen gas is produced. If the temperature of the heating device 160P is higher than about 200° C., the sulfur may melt too soon, the sulfur may evaporate and consume too fast, which may result in high cost.

The mass flow controllers MFC1 and MFC2 may be utilized to control the flow rate of the gases from the gas sources 152 and 154 to the container 140P, and a mass flow controller MFC3 may be utilized to control the flow rate of the gas flow containing the chalcogen elements from the container 140P to the processing chamber 110. Additional valves V6 and V7 can be utilized to control the gas flow entering the container 140P and released from the container 140P, respectively. The controller 180 may be coupled to the mass flow controllers MFC1-MFC3, the valves V11, V12, V21, V22, V3, V4, V6, V7, the vacuum control valve V5, the plasma generator 120 and power supply 122, the heating device 160P, and other suitable system components for operating the apparatus 100 (e.g., controlling at least some of the vacuum pressure, gas flow rates, plasma generation, the heating temperature, and other system parameters). Other details of the present embodiments are similar to those illustrated in the embodiments of FIG. 1A, and therefore not repeated herein.

Figure 15:
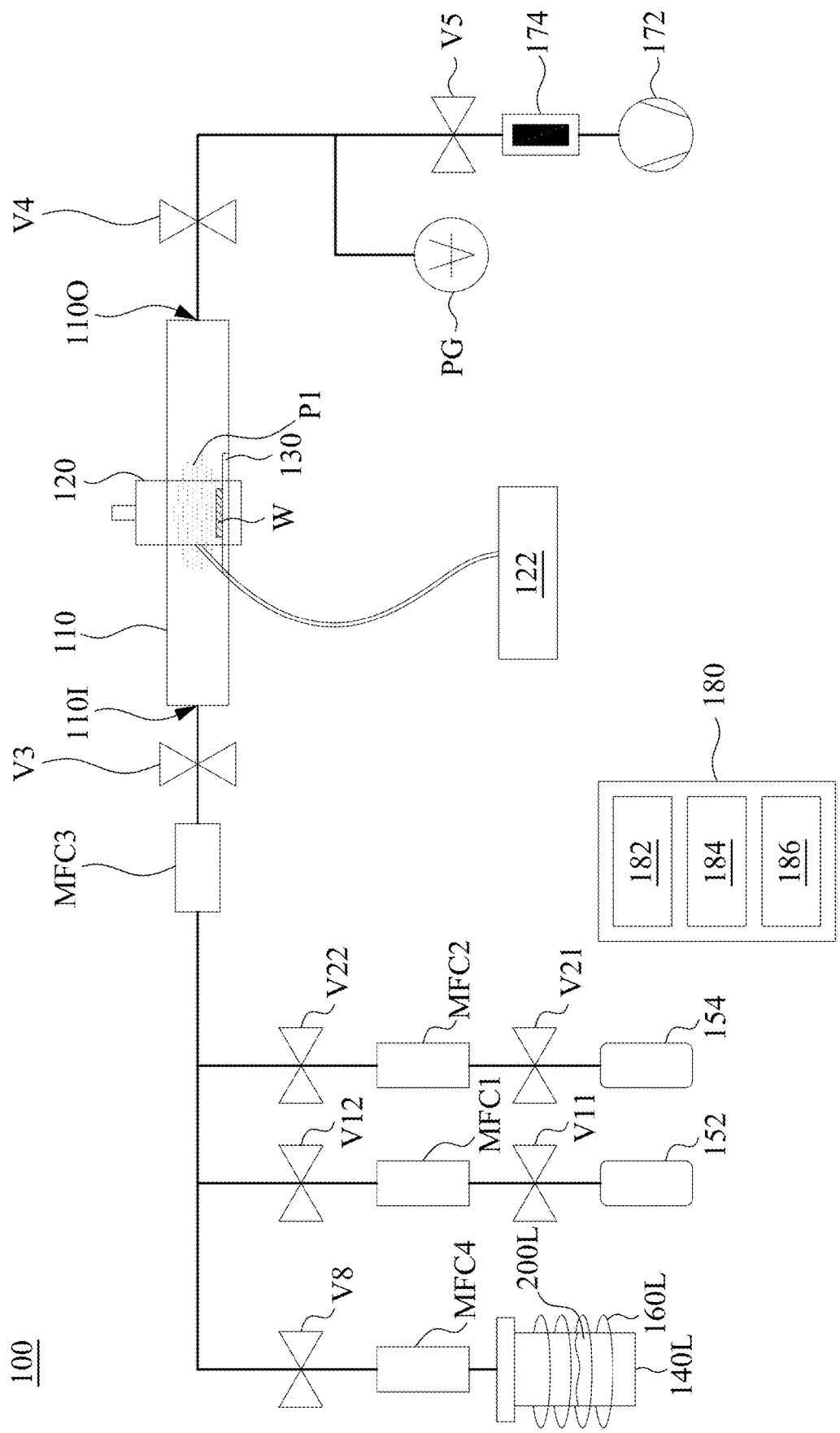
FIG. 15 is a schematic side view of an apparatus for forming a TMDC layer according to some embodiments of the present disclosure.

FIG. 15 is a schematic side view of an apparatus for forming a TMDC layer according to some embodiments of the present disclosure. The present embodiments are similar to those illustrated in the embodiments of FIG. 1A, except that a chalcogen precursor 200L in liquid form is used for providing chalcogen element to plasma P1. For example, the chalcogen precursor 200L may include chalcogen liquids, such as $C_2H_6S$, $SeF_4$, or the like. In the present embodiments, the chalcogen precursor 200L is stored external to the process chamber 110. For example, the chalcogen precursor 200L is stored in a container 140L, which is fluidly communicated with the gas sources 152 and 154. In some embodiments, the container 140L may be surrounded by a heating device 160L. The heating device 160L may heat and vaporize the chalcogen precursor 200L, thereby producing the appropriate amount of the chalcogen containing precursor in the vapor phase. Therefore, while the gas sources 152 and 154 provide gas flow for forming plasma P1, the heated chalcogen precursor 200L may add chalcogen gas to the gas flow. For example, in some embodiments where the chalcogen precursor 200L contains $SeF_4$, a temperature of the heating device 160L may be in a range from about 25° C. to about 80° C. If the temperature of the heating device 160L is below about 25° C., little chalcogen gas is produced. If the temperature of the heating device 160L is above about 80° C., the sulfur may evaporate and consume too fast, which may result in high cost. In some other embodiments where the chalcogen precursor 200L contains $C_2H_6S$, the heating device 160L may be omitted.

A mass flow controller MFC4 may be utilized to control the flow rate of the chalcogen gas from the container 140L to the gas flow provided by the gas sources 152 and 154, and to the processing chamber 110. An additional valve V8 can be utilized to control the chalcogen gas released from the container 140L. The controller 180 may be coupled to the mass flow controllers MFC1, MFC2, MFC4, the valves V11, V12, V21, V22, V3, V4, V8, the vacuum control valve V5, the plasma generator 120 and power supply 122, the heating device 160L, and other suitable system components for operating the apparatus 100 (e.g., controlling at least some of the vacuum pressure, gas flow rates, plasma generation, the heating temperature, and other system parameters). Other details of the present embodiments are similar to those illustrated in the embodiments of FIG. 1A, and therefore not repeated herein.

Figure 16:
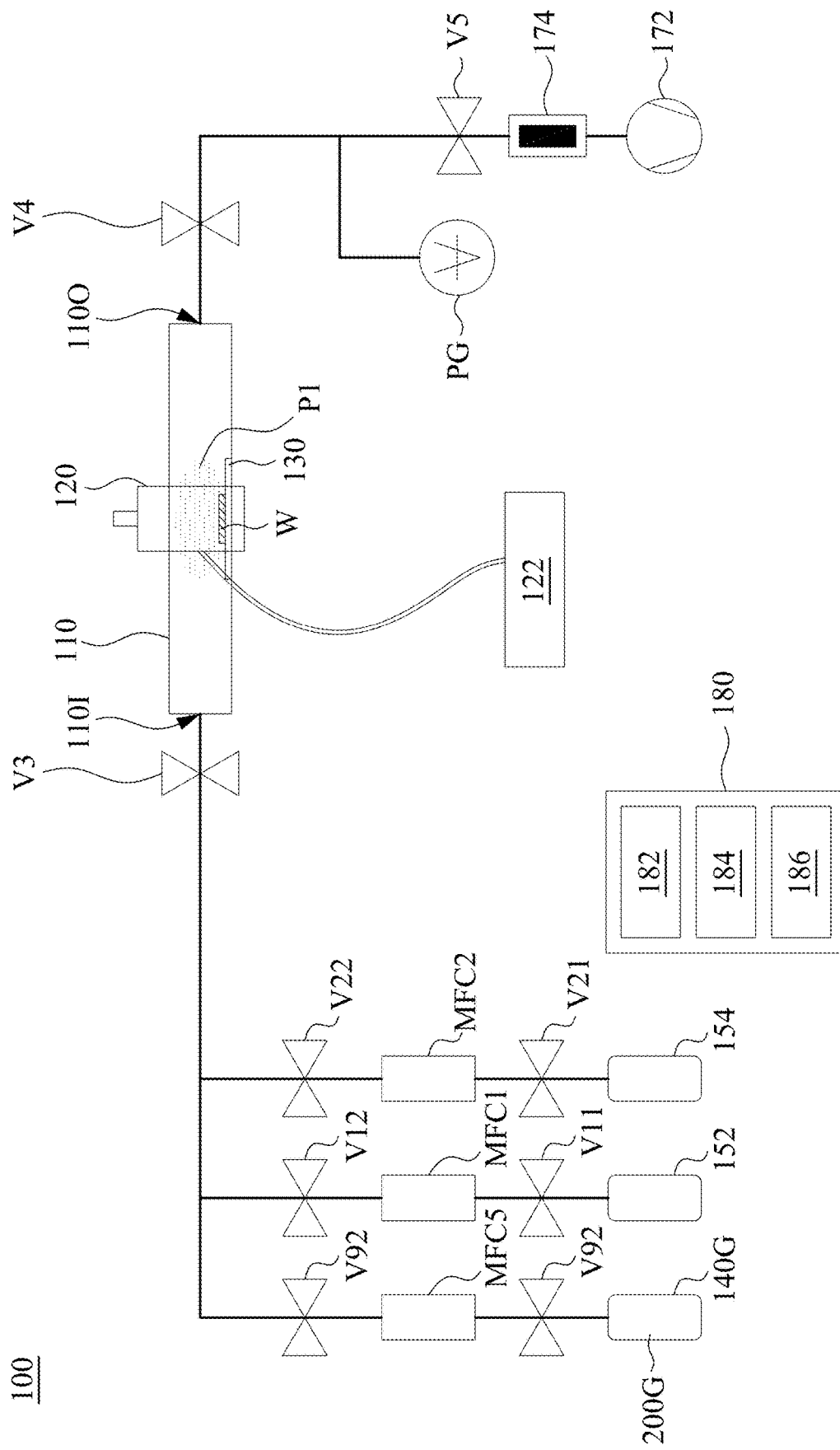
FIG. 16 is a schematic side view of an apparatus for forming a TMDC layer according to some embodiments of the present disclosure.

FIG. 16 is a schematic side view of an apparatus for forming a TMDC layer according to some embodiments of the present disclosure. The present embodiments are similar to those illustrated in the embodiments of FIG. 1A, except that a chalcogen precursor 200G in gas form is used for providing chalcogen element to plasma P1. For example, the chalcogen precursor 200G may include chalcogen gases, such as $H_2S$, $SeF_6$, $CH_4S$, $WF_6$, or the like. In the present embodiments, the chalcogen precursor 200G is stored external to the process chamber 110. For example, the chalcogen precursor 200G is stored in a container 140G, which is fluidly communicated with the gas sources 152 and 154. While the gas sources 152 and 154 provide gas flow for forming plasma P1, the chalcogen gas (i.e., chalcogen precursor 200G) may be added to the gas flow. In the present embodiments, since the chalcogen precursor 200G is stored in gas form, no heating device is needed for heating the container 140G and vaporizing the chalcogen precursor 200G.

A mass flow controller MFC5 may be utilized to control the flow rate of the chalcogen precursor 200G from the container 140G to the gas flow provided by the gas sources 152 and 154, and to the processing chamber 110. Additional valves V91 and V92 can be utilized to control the chalcogen precursor 200G released from the container 140G and from the mass flow controller MFC5. The controller 180 may be coupled to the mass flow controllers MFC1, MFC2, MFC5, the valves V11, V12, V21, V22, V3-V4, V91, V92, the vacuum control valve V5, the plasma generator 120 and power supply 122, and other suitable system components for operating the apparatus 100 (e.g., controlling at least some of the vacuum pressure, gas flow rates, plasma generation, the heating temperature, and other system parameters). Other details of the present embodiments are similar to those illustrated in the embodiments of FIG. 1A, and therefore not repeated herein.

In FIGS. 14-16, the chalcogen gas from the chalcogen precursors 200L and 200G has a high flowability than the chalcogen gas from the chalcogen precursor 200P. Therefore, the container 140L and 140G storing the chalcogen precursors 200L and 200G are arranged as a gas source connected with the gas sources 152 and 154 in parallel. On the other hand, the container 140P storing the chalcogen precursor 200P is connected with the gas sources 152 and 154 in series.

Figure 17A:
FIGS. 17A and 17B are flow charts of a method for forming an integrated circuit device according to some embodiments of the present disclosure.
Figure 17B:
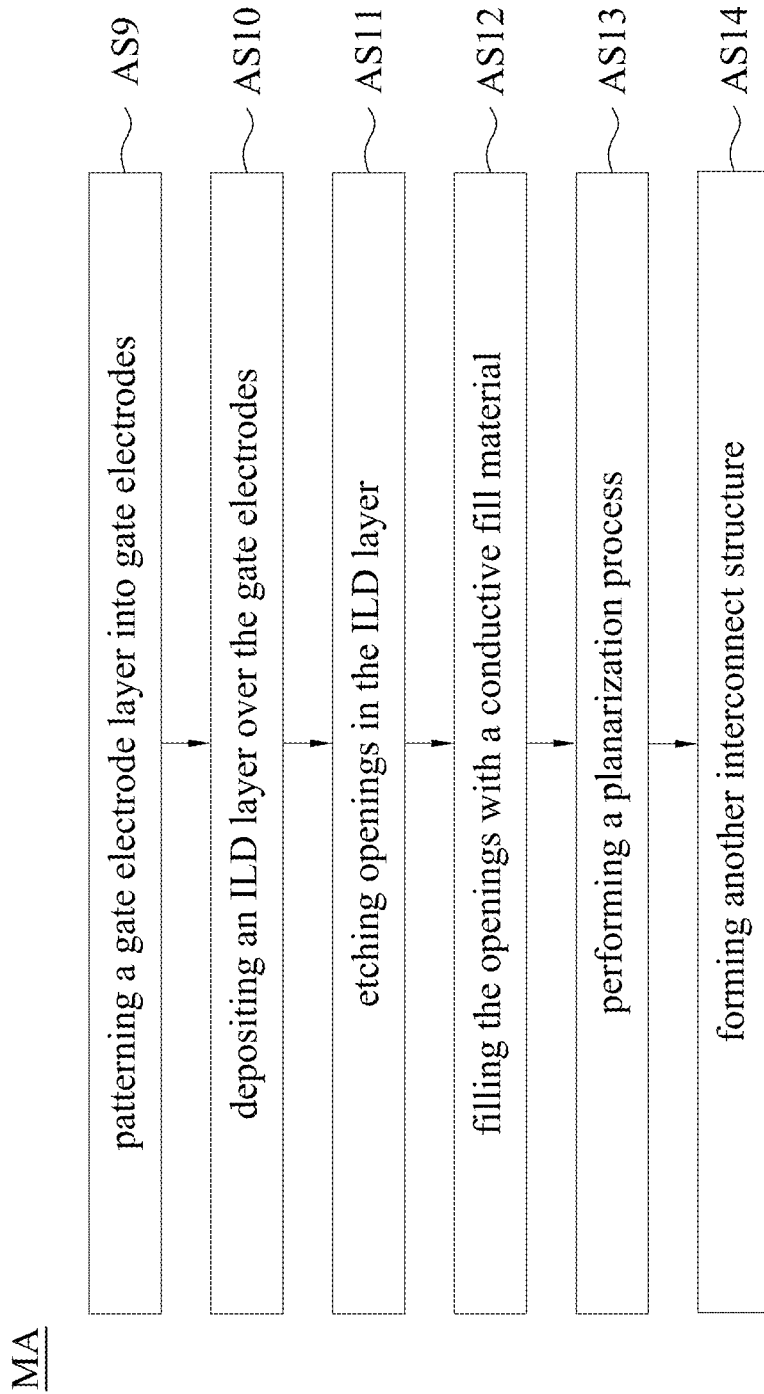

FIGS. 17A and 17B are flow charts of a method MA for forming an integrated circuit device according to some embodiments of the present disclosure. FIGS. 18-35 illustrate a method for forming an integrated circuit device according to some embodiments of the present disclosure. The method MA may include steps AS1-AS14. It is understood that additional steps may be provided before, during, and after the steps AS1-AS14 shown by FIGS. 17A and 17B, and some of the steps described below can be replaced or eliminated for additional embodiments of the method. The order of the operations/processes may be interchangeable.

Figure 18:
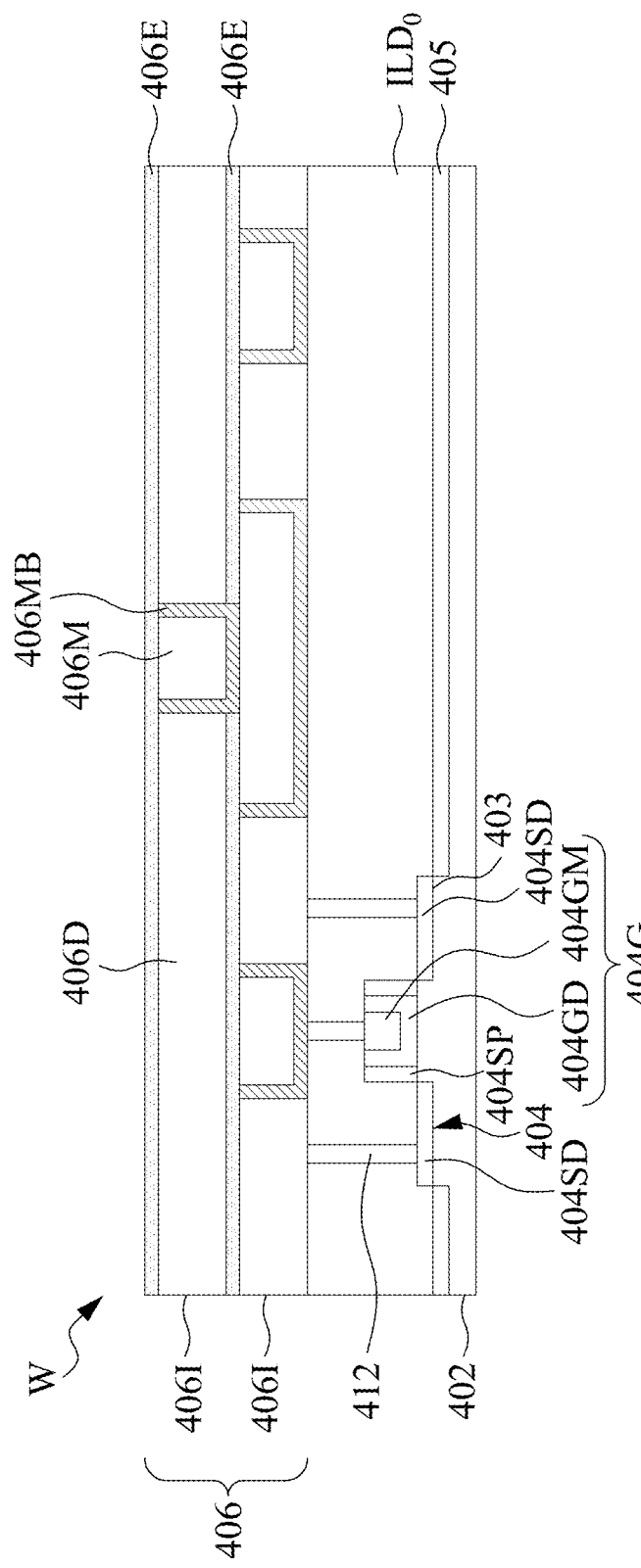
FIGS. 18-35 illustrate a method for forming an integrated circuit device according to some embodiments of the present disclosure.

Referring to FIGS. 17A and 18, the method MA begins at step AS1, where a substrate is provided with an interconnect structure. FIG. 18 illustrates a cross sectional view of an intermediate structure of a wafer W in an IC manufacturing process. In FIG. 18, the semiconductor wafer W is an intermediate structure of an IC manufacturing process where transistors and an interconnect structure have been formed. In some embodiments, the semiconductor wafer W may comprise a substrate 402. The substrate 402 may comprise, for example, bulk silicon, doped or undoped, or an active layer of a semiconductor-on-insulator (SOI) substrate. Generally, an SOI substrate comprises a layer of a semiconductor material, such as silicon, formed on an insulator layer. The insulator layer may be, for example, a buried oxide (BOX) layer or a silicon oxide layer. The insulator layer is provided on a substrate, such as a silicon or glass substrate. Alternatively, the substrate 402 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 404 (illustrated in FIG. 18 as a single transistor) are formed on the substrate 402. The one or more active and/or passive devices 404 may include various N-type metal-oxide semiconductor (NMOS) and/or P-type metal-oxide semiconductor (PMOS) devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In some embodiments, an interconnect structure 406 is formed over the one or more active and/or passive devices 404 and the substrate 402. The interconnect structure 406 electrically interconnects the one or more active and/or passive devices 404 to form functional electrical circuits within the semiconductor structure. The interconnect structure 406 may comprise one or more metallization layers. The metallization layers comprise one or more horizontal interconnects, such as conductive lines, respectively extending horizontally or laterally in dielectric layers and vertical interconnects, such as conductive vias, respectively extending vertically in dielectric layers. Formation of the interconnect structure 406 can be referred to as a back-end-of-line (BEOL) process.

Contact plugs 412 electrically couple the overlying interconnect structure 406 to the underlying devices 404. In the depicted embodiments, the devices 404 are fin field-effect transistors (FinFET) that are three-dimensional MOSFET structure formed in fin-like strips of semiconductor protrusions 403 referred to as fins. The cross-section shown in FIG. 18 is taken along a longitudinal axis of the fin in a direction parallel to the direction of the current flow between the source/drain regions 404SD. The fin 403 may be formed by patterning the substrate 402 using photolithography and etching techniques. For example, a spacer image transfer (SIT) patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 403 by etching a trench into the substrate 402 using, for example, reactive ion etching (RIE). FIG. 18 illustrates a single fin 403, although the substrate 402 may comprise any number of fins. In some other embodiments, the devices 404 are planar transistors or gate-all-around (GAA) transistors.

Shallow trench isolation (STI) regions 405 formed on opposing sidewalls of the fin 403. STI regions 405 may be formed by depositing one or more dielectric materials (e.g., silicon oxide) to completely fill the trenches around the fins and then recessing the top surface of the dielectric materials. The dielectric materials of the STI regions 405 may be deposited using a high density plasma chemical vapor deposition (HDP-CVD), low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 405 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 405 such that an upper portion of fins 403 protrudes from surrounding insulating STI regions 405. In some cases, the patterned hard mask used to form the fins 403 may also be removed by the planarization process.

In some embodiments, a gate structure 404G of the FinFET device 404 is a high-k, metal gate (HKMG) gate structure that may be formed using a gate-last process flow. In a gate-last process flow a sacrificial dummy gate structure (not shown) is formed after forming the STI regions 405. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 405. As described in greater detail below, the dummy gate structure may be replaced by the HKMG gate structure 404G as illustrated in FIG. 18. The materials used to form the dummy gate structure and hard mask may be deposited using any suitable method such as CVD, plasma-enhanced CVD (PECVD), atomic layer deposition (ALD), plasma-enhanced ALD (PEALD) or the like, or by thermal oxidation of the semiconductor surface, or combinations thereof.

In FIG. 18, source/drain regions 404SD and spacers 404SP of the device 404 are formed, for example, self-aligned to the dummy gate structures. Spacers 404SP may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 404SP along the sidewalls of the dummy gate structures extending laterally onto a portion of the surface of the fin 403.

Source/drain regions 404SD are semiconductor regions in direct contact with the semiconductor fin 403. In some embodiments, the source/drain regions 404SD may comprise heavily-doped regions and relatively lightly-doped drain extensions, or lightly-doped drain (LDD) regions. Generally, the heavily-doped regions are spaced away from the dummy gate structures using the spacers 404SP, whereas the LDD regions may be formed prior to forming spacers 404SP and, hence, extend under the spacers 404SP and, in some embodiments, extend further into a portion of the semiconductor fin 403 below the dummy gate structure. The LDD regions may be formed, for example, by implanting dopants (e.g., As, P, B, In, or the like) using an ion implantation process.

The source/drain regions 404SD may comprise an epitaxially grown region. For example, after forming the LDD regions, the spacers 404SP may be formed and, subsequently, the heavily-doped source and drain regions may be formed self-aligned to the spacers 404SP by first etching the fins to form recesses, and then depositing a crystalline semiconductor material in the recess by a selective epitaxial growth (SEG) process that may fill the recess and may extend further beyond the original surface of the fin 403 to form raised source/drain epitaxy structures. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy (VPE, SPE, LPE), or metal-organic CVD (MOCVD), or molecular beam epitaxy (MBE), or the like. A high dose (e.g., from about $10^{14}$ $cm^{-2}$ to $10^{16}$ $cm^{-2}$) of dopants may be introduced into the heavily-doped source and drain regions 404SD either in situ during SEG, or by an ion implantation process performed after the SEG, or by a combination thereof.

Once the source/drain regions 404SD are formed, a first interlayer dielectric (ILD) layer (e.g., lower portion of the ILD layer $ILD_0$) is deposited over the source/drain regions 404SD. In some embodiments, a contact etch stop layer (CESL) (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer. The HKMG gate structures 404G may then be formed by first removing the dummy gate structures using one or more etching techniques, thereby creating recesses between respective spacers 404SP. Next, a replacement gate dielectric layer 404GD comprising one or more dielectrics, followed by a replacement gate metal layer 404GM comprising one or more metals, are deposited to completely fill the recesses. Excess portions of the gate structure layers 404GD and 404GM may be removed from the top surface of first ILD using, for example, a CMP process. The resulting structure may include remaining portions of the HKMG gate layers 404GD and 404GM inlaid between respective spacers 404SP.

The gate dielectric layer 404GD includes, for example, a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the gate metal layer 404GM may be a multilayered metal gate stack comprising a barrier layer, a work function layer, and a gate-fill layer formed successively on top of gate dielectric layer 404GD. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, PVD, ALD, PEALD, electrochemical plating (ECP), electroless plating and/or the like.

After forming the HKMG structure 404G, a second ILD layer is deposited over the first ILD layer, and these ILD layers are in combination referred to as the ILD layer $ILD_0$, as illustrated in FIG. 18. In some embodiments, the insulating materials to form the first ILD layer and the second ILD layer may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer and the second ILD layer may be deposited using any suitable method, such as CVD, physical vapor deposition (PVD), ALD, PEALD, PECVD, SACVD, FCVD, spin-on, and/or the like, or a combination thereof. Conductive contact plugs 412 may be formed in the ILD layer $ILD_0$ using photolithography, etching, and deposition techniques. In the example illustrated in FIG. 18, the contact plugs 412 make electrical connections to the gate structure 404G and the source/drain regions 404SD of the device 404.

After forming the contact plugs 412, the interconnect structure 406 including multiple interconnect levels may be formed, stacked vertically above the contact plugs 412 formed in the ILD layer $ILD_0$, in accordance with a back end of line (BEOL) scheme adopted for the integrated circuit design. In the illustrated embodiments, the interconnect structure 406 may include plural interconnect layers 406I, and each of the interconnect layer 406I may has an ILD layer 406D and conductive features 406M (e.g., conductive vias, conductive lines, or the combination thereof) surrounded by the ILD layer 406D. In some embodiments, an etch stop layer 406E may be formed between every two adjacent interconnect layers 406I. These etch stop layers 406E may include a dielectric material different from the ILD layers 406D of the interconnect structure 406. For example, the etch stop layers 406E may include silicon nitride, silicon carbide, silicon oxynitride, silicon oxycarbide, silicon carbon nitride, the like, or the combination thereof. In the BEOL scheme illustrated in FIG. 18, various interconnect levels have similar features. However, it is understood that other embodiments may utilize alternate integration schemes wherein the various interconnect levels may use different features. For example, the source/drain contact plugs 412, which are shown as vertical connectors, may be extended to form conductive lines which transport current laterally.

In some embodiments, the ILD layer 406D may include low-k dielectric materials having k values, for example, lower than about 4.0 or even 2.0. For example, the ILD layer 406D may be made of, for example, phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like, formed by any suitable method, such as spin-on coating, chemical vapor deposition (CVD), plasma-enhanced CVD (PECVD), or the like. The conductive feature 406M may include conductive materials such as copper, aluminum, tungsten, combinations thereof, or the like. In some embodiments, the conductive feature 406M may further comprise one or more barrier/adhesion layers 406MB to protect the respective ILD layer 406D from metal diffusion (e.g., copper diffusion) and metallic poisoning. The one or more barrier/adhesion layers may comprise titanium, titanium nitride, tantalum, tantalum nitride, the like, or the combination thereof.

Figure 19:
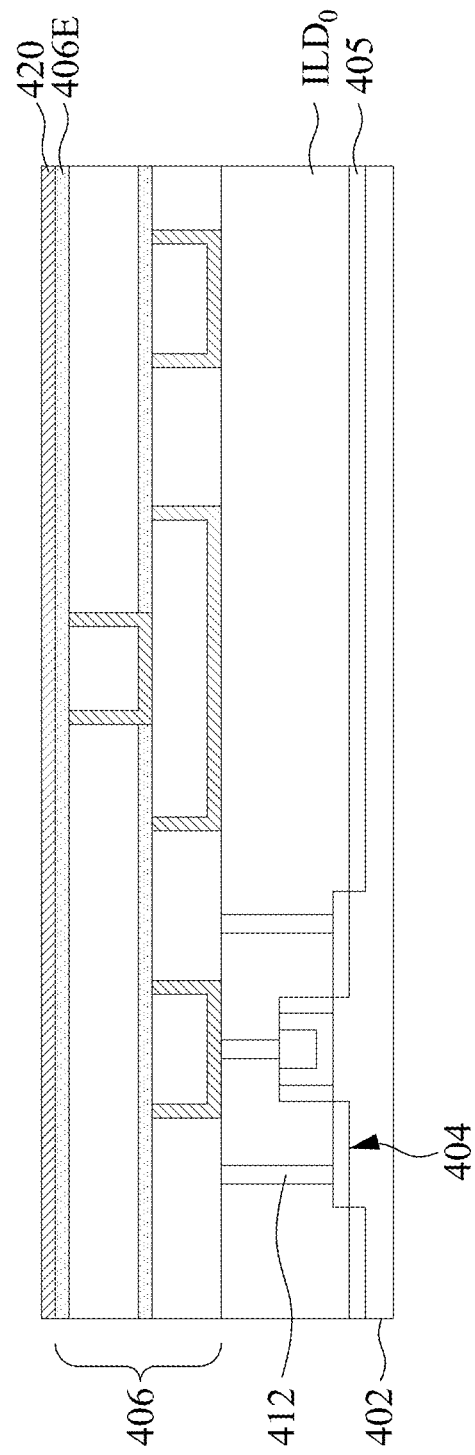

Reference is made to FIG. 17A and FIG. 19, the method MA proceeds to step AS2, where a first metal film 420 is deposited over the interconnect structure 406. The first metal film 420 may include a transition metal, such as Mo, W, Pd, Pt, the like, or the combination thereof. The deposition of the first metal film 420 may include PVD (e.g., E-gun evaporation deposition or thermal evaporation deposition), ALD, CVD, the like, or the combination thereof.

Figure 20:
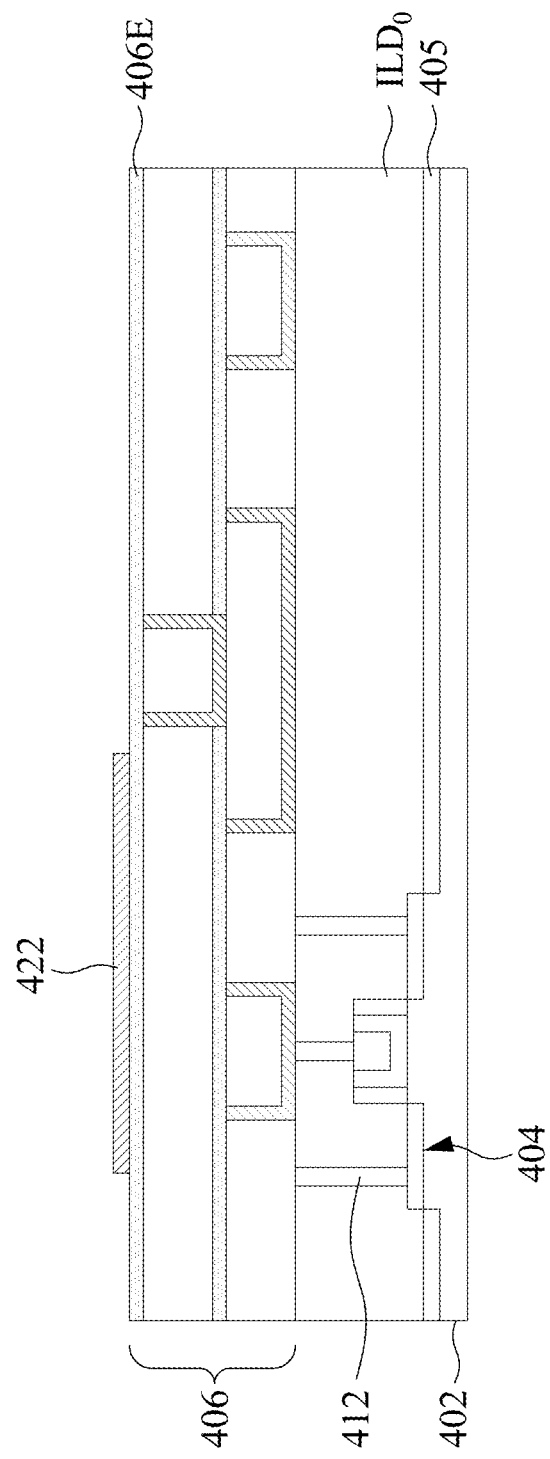

Reference is made to FIG. 17A and FIG. 20, the method MA proceeds to step AS3, where, the first metal film 420 (referring to FIG. 19) is patterned to form a first metal layer 422. For example, a mask layer is first formed over the first metal film 420 (referring to FIG. 19) and then patterned to form a patterned mask, and then an etching process is performed on the first metal film 420 (referring to FIG. 19) by using the patterned mask layer as an etch mask, thus patterning the first metal film 420 (referring to FIG. 19) into the first metal layer 422. In some embodiments, the patterned mask layer may comprise an organic material, such as a photoresist material, and may be formed using a spin-on coating process, followed by patterning the photoresist material to have the pattern using suitable lithography techniques. In some embodiments, the etching process may include wet etch, dry etch, or the combination thereof. The topmost layer of the interconnect structure 406 (e.g., the etch stop layer 406ESL) may have a higher etch resistance to the etching process than that of the first metal film 420 (referring to FIG. 19), thereby protecting the underlying elements from being etched.

Figure 21:
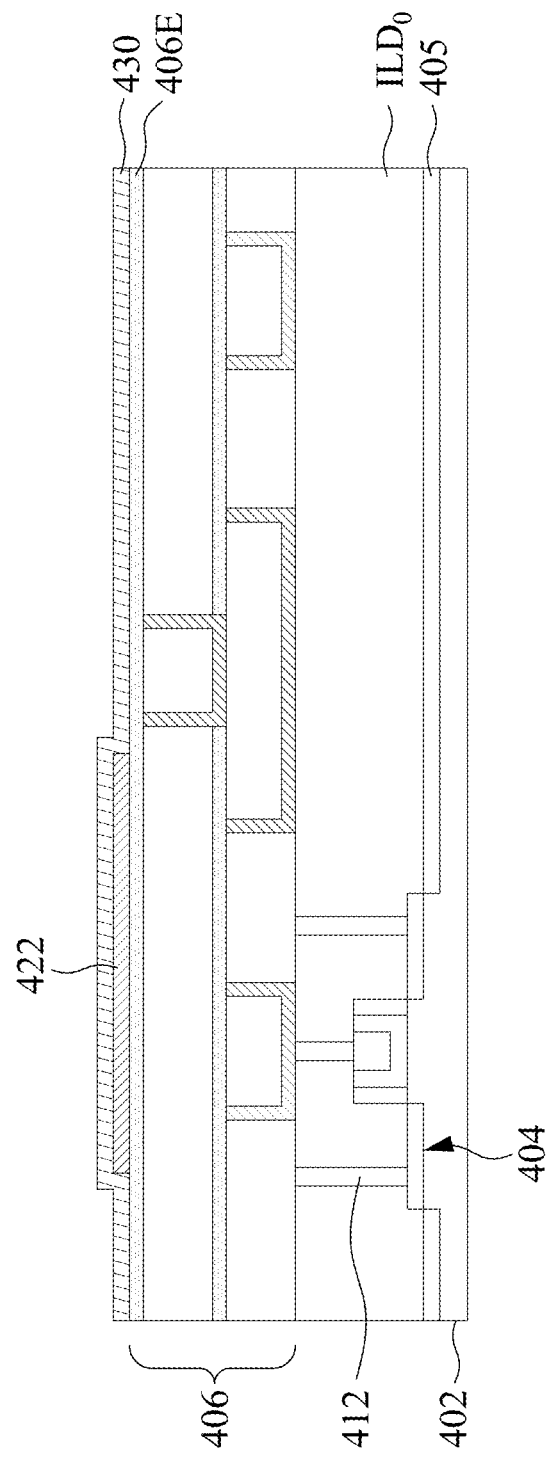

Reference is made to FIG. 17A and FIG. 21, the method MA proceeds to step AS4, where, a second metal film 430 is deposited over an interconnect structure. The second metal film 430 may include a transition metal, such as Mo, W, Pd, Pt, the like, or the combination thereof. The second metal film 430 comprises a material different from that of the first metal layer 422. The deposition of the second metal film 430 may include PVD (e.g., E-gun evaporation deposition or thermal evaporation deposition), ALD, CVD, the like, or the combination thereof.

Figure 22:
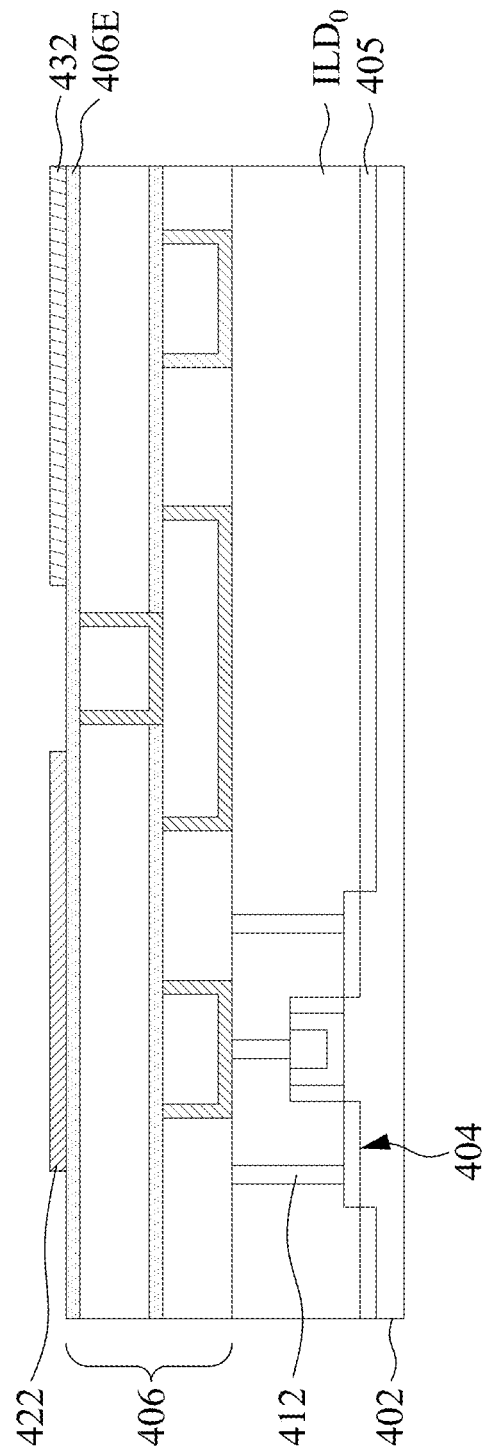

Reference is made to FIG. 17A and FIG. 22, the method MA proceeds to step AS5, where the second metal film 430 (referring to FIG. 21) is patterned to form a second metal layer 432. For example, a mask layer is first formed over the second metal film 430 (referring to FIG. 21) and then patterned to form a patterned mask, and then an etching process is performed on the second metal film 430 (referring to FIG. 21) by using the patterned mask layer as an etch mask, thus patterning the second metal film 430 (referring to FIG. 21) into the second metal layer 432. The first and second metal layers 422 and 432 serve to form TMDC layers with different compositions in subsequent processing. Materials of the first and second metals depend on target conductivity types of resultant transistors. For example, when the first metal layer 422 is Mo, it can be used to form a $MoS_2$ layer that may be suitable for serving as active regions of n-type FETs that use electrons as channel carriers in the $MoS_2$ channel, and when the second metal layer is W, it can be used to form $WS_2$ that may be suitable for serving as active regions of p-type FETs that use holes as channel carriers in the $WS_2$ channel. In some embodiments, the patterned mask layer may comprise an organic material, such as a photoresist material, and may be formed using a spin-on coating process, followed by patterning the photoresist material to have the pattern using suitable lithography techniques. In some embodiments, the etching process may include wet etch, dry etch, or the combination thereof. The topmost layer of the interconnect structure 406 (e.g., the etch stop layer 406ESL) may have a higher etch resistance to the etching process than that of the second metal film 430 (referring to FIG. 21), thereby protecting the underlying interconnect structure 406 from being etched.

Figure 23:
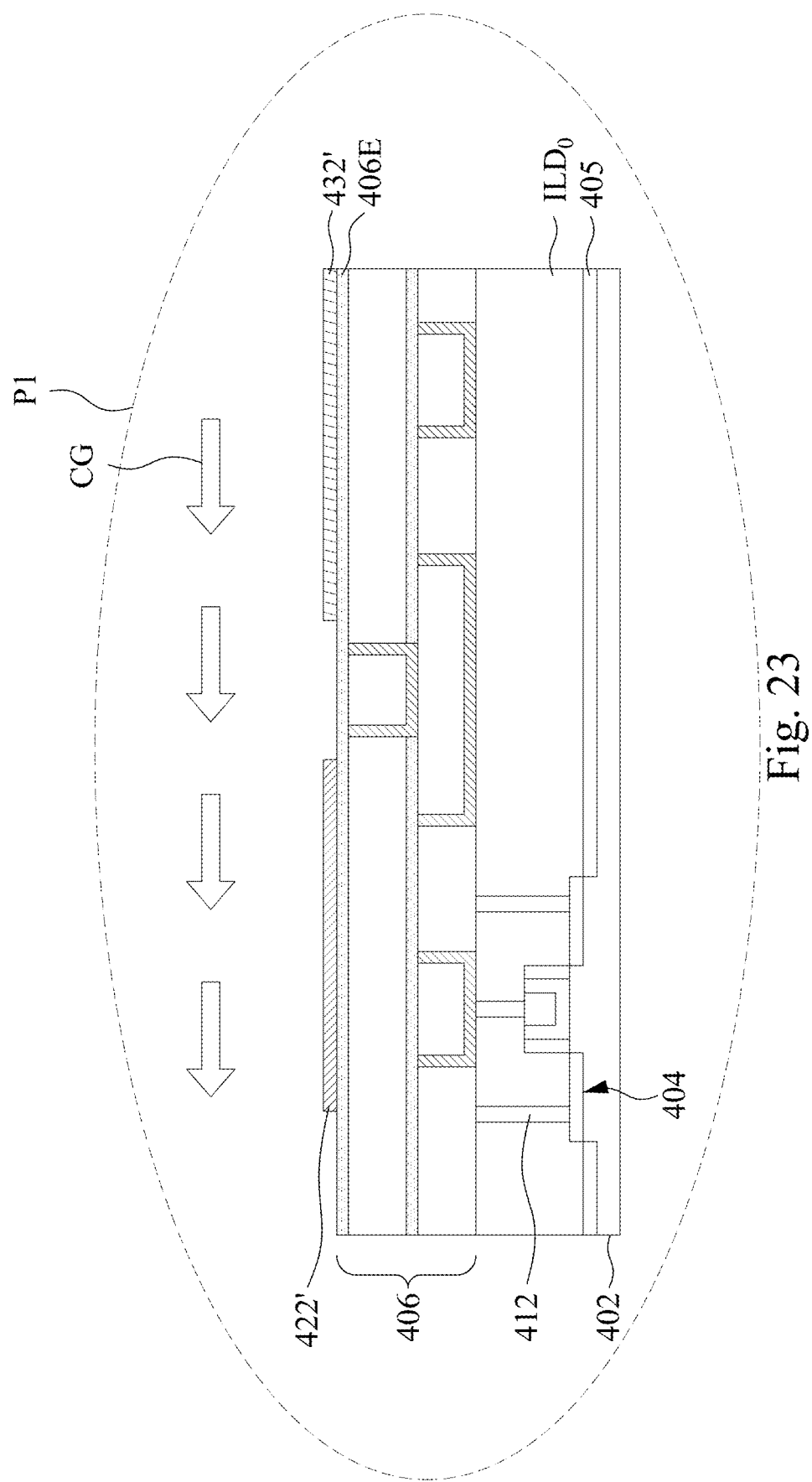

Reference is made to FIG. 17A and FIG. 23, the method MA proceeds to step AS6, where a plasma treatment is performed to chalcogenize the first and second metal layers 422 and 432 (referring to FIG. 22). As illustrated previously in FIGS. 1A-6A, the plasma treatment may use a microwave plasma P1 containing chalcogen brought by the gas flow CG. Through the plasma treatment, the first and second metal layers 422 and 432 (referring to FIG. 22) are respectively converted into TMDC layers 422' and 432', which have high channel mobility, a high current ON/OFF ratio, and a good sub-threshold swing. For example, in some embodiments where the first and second metal layers 422 and 432 (referring to FIG. 22) are respectively a Mo layer and a W layer, when the gas flow CG contains sulfur, the formed TMDC layers 422' and 432' are respectively a $MoS_2$ layer and a $WS_2$ layer.

Figure 24:
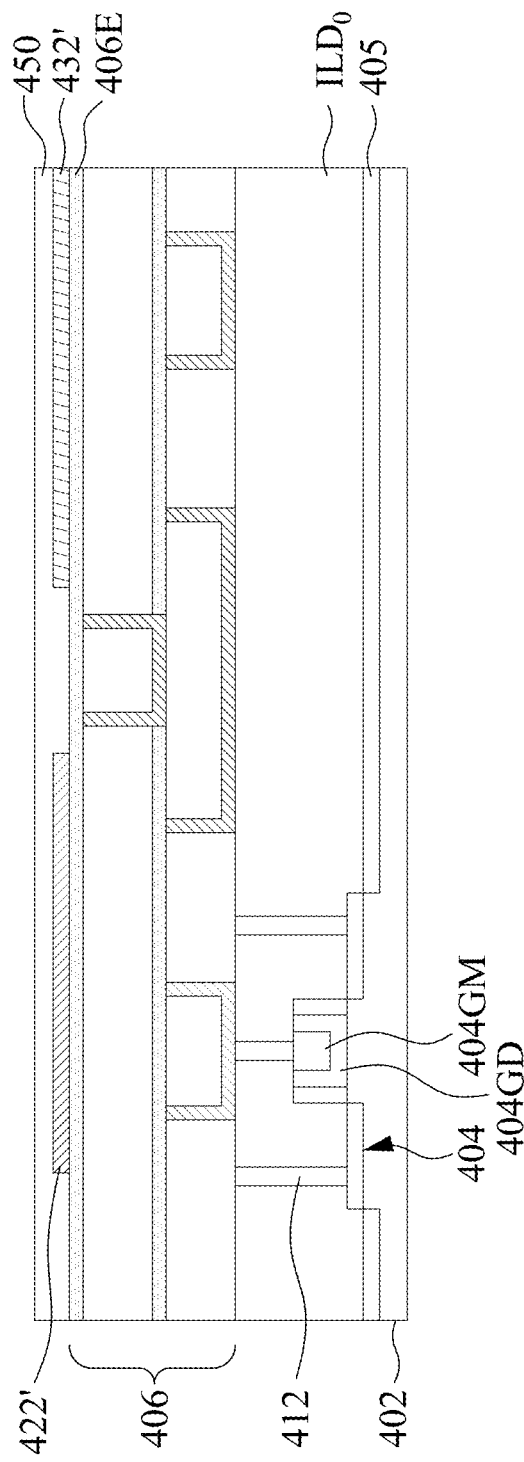

Reference is made to FIG. 17A and FIG. 24, the method MA proceeds to step AS7, where a dielectric layer 450 is deposited over the TMDC layers 422' and 432'. The dielectric layer 450 may include suitable dielectric materials for electrically isolating the TMDC layers 422' and 432' from gate electrodes subsequently formed. The dielectric layer 450 may be referred to as a gate dielectric layer in some embodiments. In some embodiments, the dielectric layer 450 includes a high-k dielectric material such as oxides and/or silicates of metals (e.g., oxides and/or silicates of Hf, Al, Zr, La, Mg, Ba, Ti, and other metals), silicon nitride, silicon oxide, and the like, or combinations thereof, or multilayers thereof. In some embodiments, the dielectric layer 450 may be include low-k dielectric materials, such as phosphosilicate glass (PSG), borophosphosilicate glass (BPSG), fluorosilicate glass (FSG), SiOxCy, Spin-On-Glass, Spin-On-Polymers, silicon oxide, silicon oxynitride, combinations thereof, or the like. In some embodiments, the dielectric layer 450 includes similar materials as the gate dielectric layer 404GD in the transistor 404 below the interconnect structure 406. The dielectric layer 450 may be formed by any suitable method, such as spin-on coating, chemical vapor deposition (CVD), plasma-enhanced CVD (PECVD), or the like.

Figure 25:
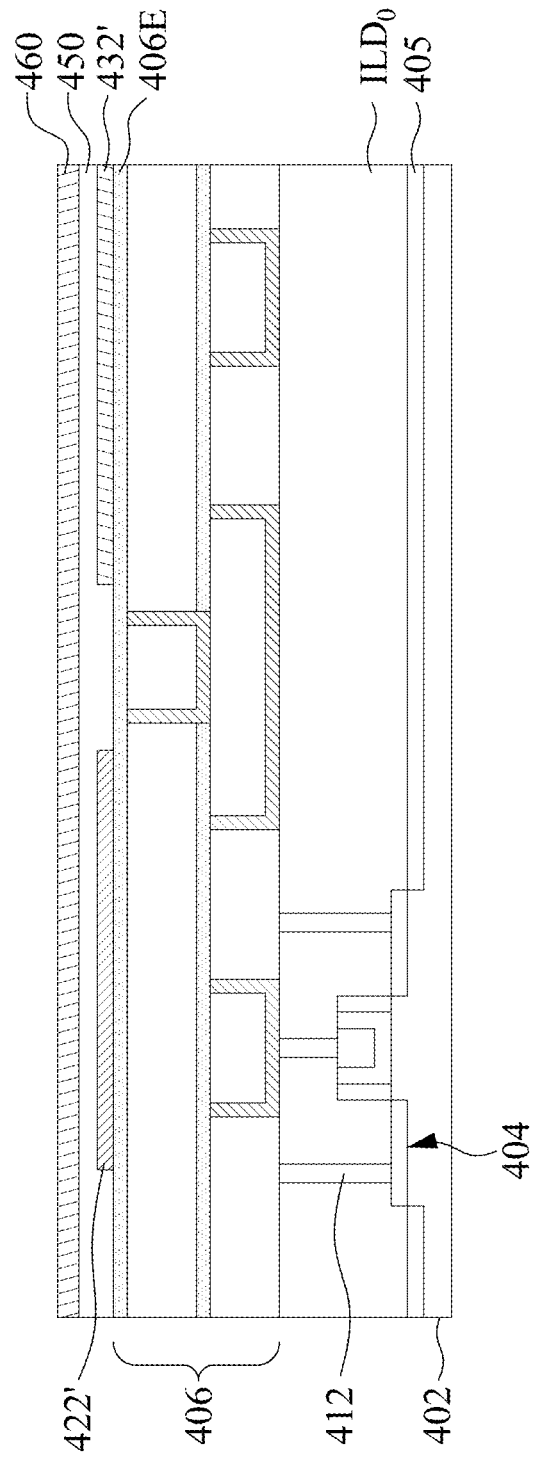

Reference is made to FIG. 17A and FIG. 25, the method MA proceeds to step AS8, where a gate electrode layer 460 is deposited over the dielectric layer 450. The gate electrode layer 460 may include suitable conductive material, such as metal (e.g., W) or polycrystalline-silicon (poly-Si). In some embodiments, the gate electrode layer 460 includes similar materials as the gate metal layer 404GM in the device 404 below the interconnect structure 406. The gate electrode layer 460 may be deposited by CVD, physical vapor deposition (PVD), sputter deposition, or other techniques suitable for depositing conductive materials.

Figure 26:
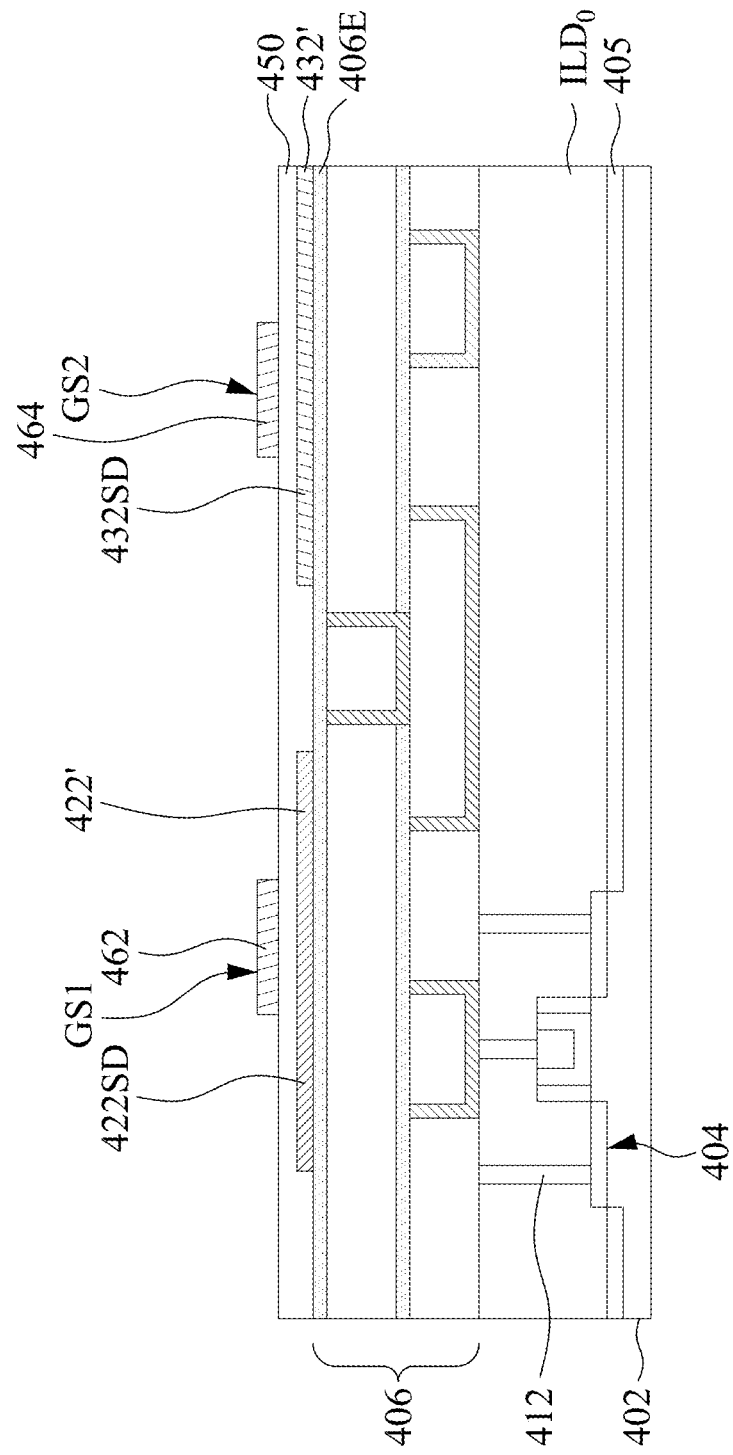

Reference is made to FIG. 17B and FIG. 26, the method MA proceeds to step AS9, where the gate electrode layer 460 (referring to FIG. 24) is patterned into gate electrodes 462 and 464, respectively over the TMDC layers 422' and 432'. For example, a mask layer is first formed over the gate electrode layer 460 (referring to FIG. 24) and then patterned to form a patterned mask, and then an etching process is performed on the gate electrode layer 460 (referring to FIG. 24) by using the patterned mask layer as an etch mask, thus patterning the gate electrode layer 460 (referring to FIG. 24) into the gate electrodes 462 and 464. In some embodiments, the patterned mask layer may comprise an organic material, such as a photoresist material, and may be formed using a spin-on coating process, followed by patterning the photoresist material to have the pattern using suitable lithography techniques. In some embodiments, the etching process may include wet etch, dry etch, or the combination thereof. In some embodiments, the dielectric layer 450 may have a higher etch resistance to the etching process than that of the gate electrode layer 460 (referring to FIG. 24), thereby protecting the underlying interconnect structure 406 and TMDC layers 422' and 432' from being etched.

Through the above steps, a gate structure GS1 (i.e., a combination of the gate electrode 462 and a portion of the dielectric layer 450 therebelow) is formed over the TMDC layer 422', and a gate structure GS2 (i.e., a combination of the gate electrode 464 and a portion of the dielectric layer 450 therebelow) is over the TMDC layer 432'.

In the present embodiments, the gate structures GS1 and GS2 are formed by patterning a deposited gate electrode layer and a deposited dielectric layer. In some alternative embodiments, the gate structures GS1 and GS2 may be formed using a gate-last process flow. In a gate-last process flow, a sacrificial dummy gate structure (not shown) is formed after forming the TMDC layers 422' and 423'. The dummy gate structure may comprise a dummy gate dielectric (e.g., silicon oxide), a dummy gate electrode (e.g., polysilicon) over the dummy gate dielectric. The dummy gate structure may be replaced by a metal gate structure. The replacement of the dummy gate structure may include forming gate spacers on opposite sides of the dummy gate structure, etching the dummy gate structure to leave a gate trench between the gate spacers, depositing a gate dielectric layer and a gate electrode layer into the gate trench, followed by a planarization process (e.g., CMP). The gate dielectric layer may include a high-k dielectric layer. The gate electrode layer may include a barrier layer, a work function layer, and a fill metal. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. The fill metal may comprise metals such as Cu, Al, W, Co, Ru, or the like, or combinations thereof, or multi-layers thereof. In gate-last embodiments, the gate structures GS1 and GS2 may include similar materials as the gate structure 404G in the device 404 below the interconnect structure 406.

Figure 27:
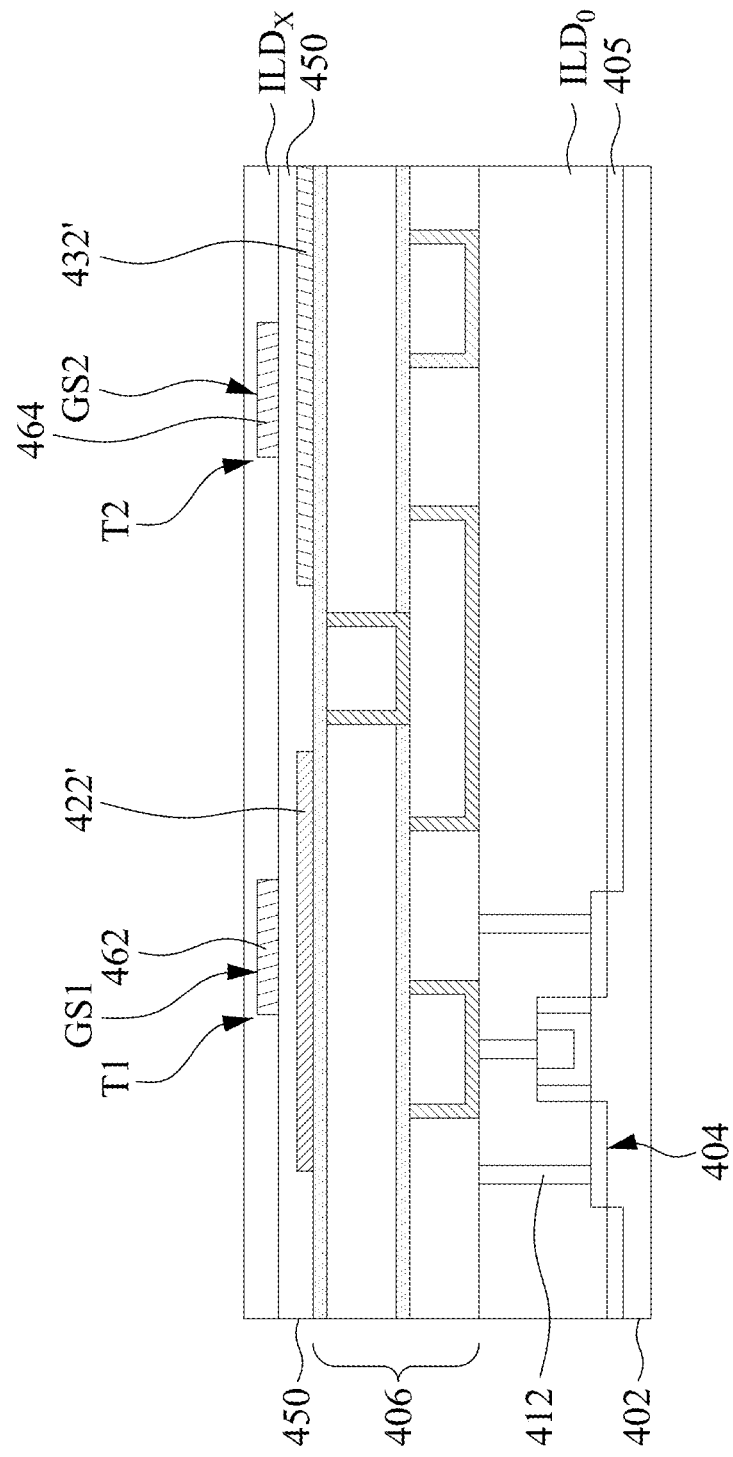

Reference is made to FIG. 17B and FIG. 27, the method MA proceeds to step AS10, where an ILD layer $ILD_x$ is deposited over the gate electrodes 462 and 464. In some embodiments, the ILD layer $ILD_x$ may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The ILD layer $ILD_x$ may be deposited using any suitable method, such as CVD, physical vapor deposition (PVD), ALD, PEALD, PECVD, SACVD, FCVD, spin-on, and/or the like, or a combination thereof.

Figure 28:
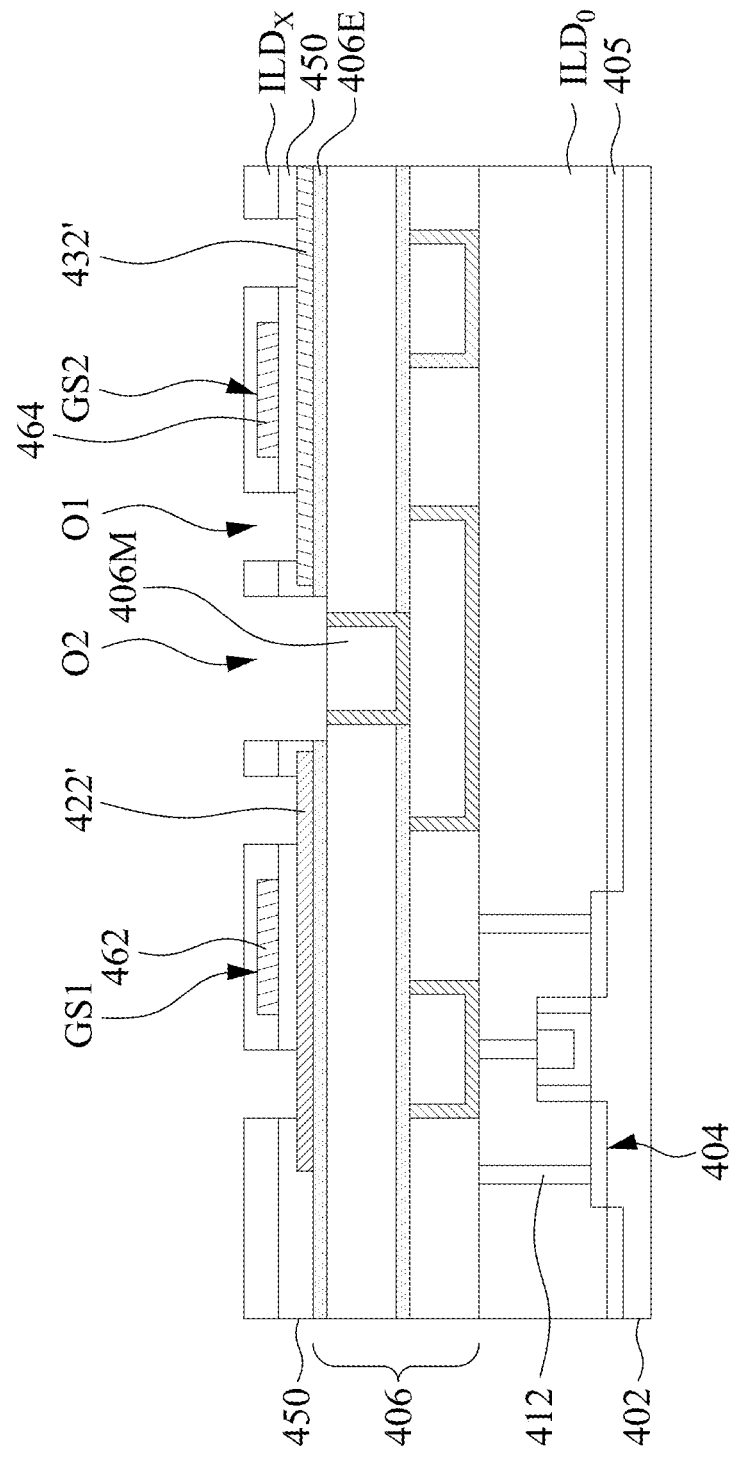

Reference is made to FIG. 17B and FIG. 28, the method MA proceeds to step AS11, where openings O1 and O2 are etched in the ILD layer $ILD_x$ and the dielectric layer 450. The openings O1 may expose the TMDC layers 422' and 432'. The opening O2 may expose the underlying conductive feature 406M. For example, a mask layer is first formed over the ILD layer $ILD_x$ and then patterned to form a patterned mask, and then an etching process is performed on the ILD layer $ILD_x$ and the dielectric layer 450 by using the patterned mask layer as an etch mask, thus forming the openings O1, O2, or the combination thereof. In some embodiments, the patterned mask layer may comprise an organic material, such as a photoresist material, and may be formed using a spin-on coating process, followed by patterning the photoresist material to have the pattern using suitable lithography techniques. In some embodiments, the etching process may include wet etch, dry etch, or the combination thereof. The TMDC layers 422' and 432' and the etch stop layer 406E may have a higher etch resistance to the etching process than that of the ILD layer $ILD_x$, therefore not be substantially etched by the etching process. After the formation of the openings O2, a liner removal etching process may be performed to remove a portion of the etch stop layer 406E exposed by the openings O2, thereby exposing the underlying conductive feature 406M.

Figure 29:
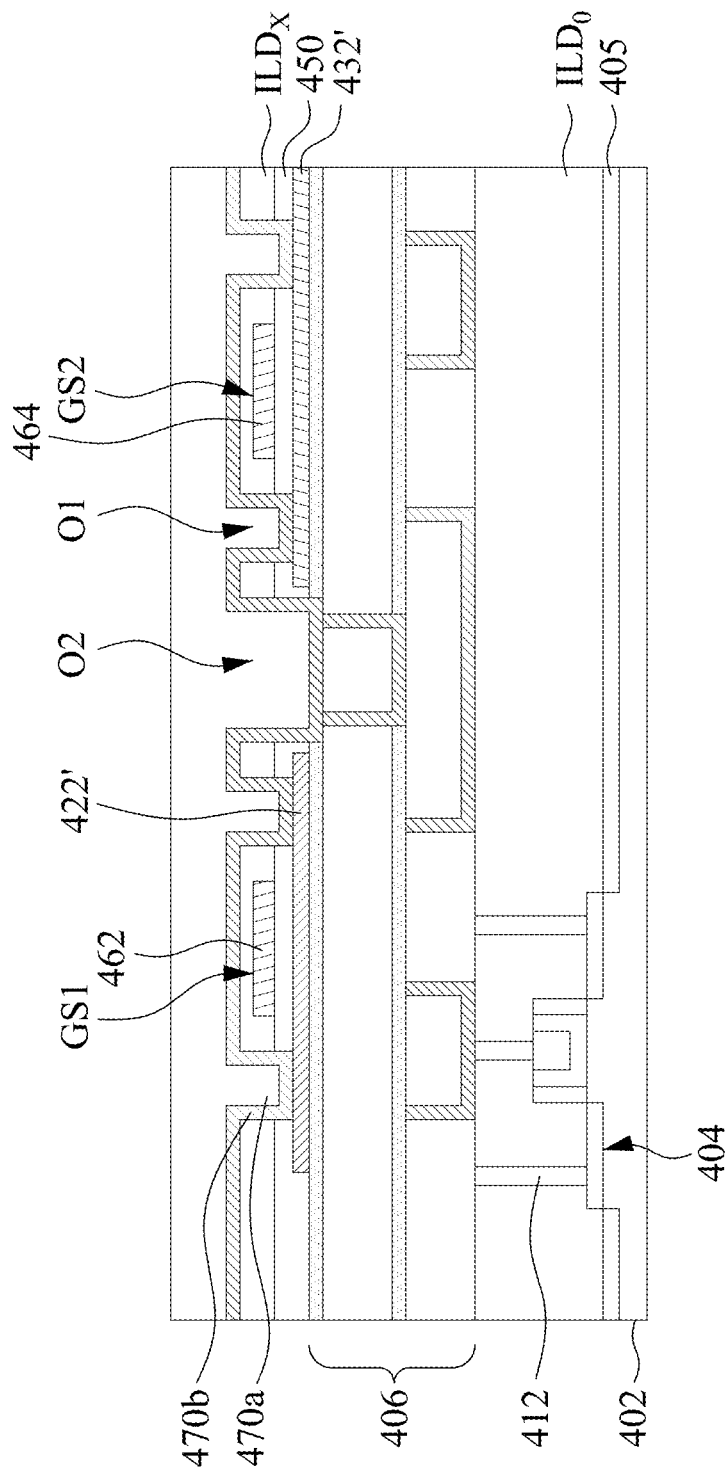

Reference is made to FIG. 17B and FIG. 29, the method MA proceeds to step AS12, where a conductive fill material 470a is deposited into the openings O1. The conductive fill material 470a may include W, Al, Cu, Ru, Ni, Co, alloys of these, combinations thereof, and the like. The conductive fill material 470a may be deposited using any acceptable deposition technique, such as CVD, ALD, PEALD, PECVD, PVD, ECP, electroless plating, or the like, or any combination thereof. In some embodiments, prior to depositing the conductive fill material 470a, a liner layer 470b is conformally deposited over the openings O1. The liner layer 470b may include barrier metals used to reduce out-diffusion of conductive materials from the contacts into the surrounding dielectric materials. The liner layer 470b may include a material different from that of the conductive fill material 470a. For example, the liner layer 470b may include TiN, TaN, Ta, or other suitable metals, or their alloys.

Figure 30:
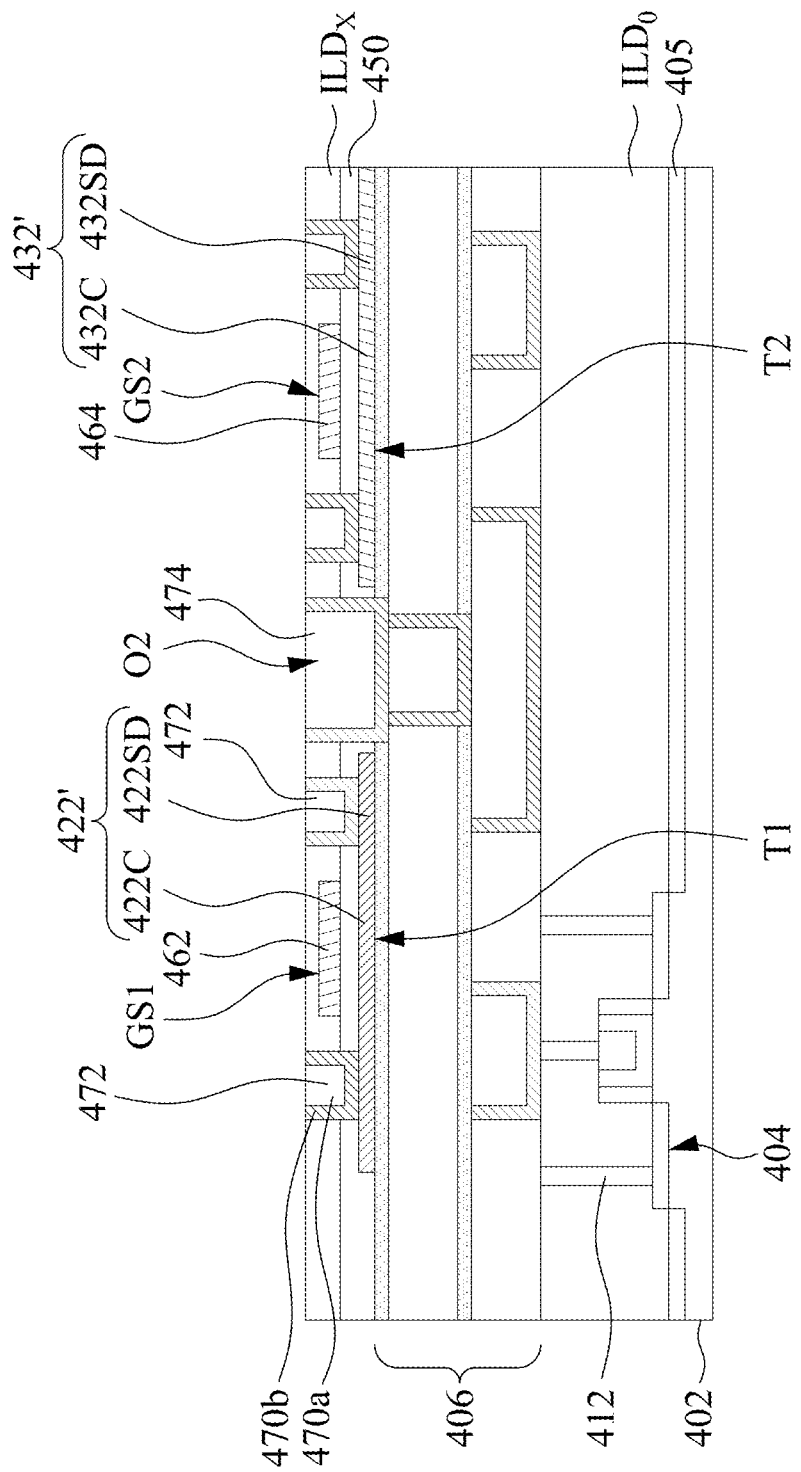

Reference is made to FIG. 17B and FIG. 30, the method MA proceeds to step AS13, where a planarization process (e.g., CMP) may be used to remove excess portions of all the conductive materials (e.g., the liner layer 470b and the conductive fill material 470a) from the surface of the ILD layer $ILD_x$. The remaining conductive materials form source/drain contacts 472 in the openings O1 and a conductive plug 474 in the opening O2. The source/drain contacts 472 extend into the ILD layer $ILD_x$ and the dielectric layer 450, and making physical and electrical connections to the TMDC layers 422' and 432'. The conductive plug 474 extend into the ILD layer $ILD_x$ and the dielectric layer 450, and making physical and electrical connections to the conductive feature 406M.

Through the steps, transistors T1 and T2 are formed. The transistors T1 may include the TMDC layer 422', the gate structure GS1, and the source/drain contacts 472. The transistors T2 may include the TMDC layer 432', the gate structure GS2, and the source/drain contacts 472. The source/drain contacts 472 may be referred to as source/drain electrodes in some embodiments. In some embodiments, portions of the TMDC layers 422' and 432' covered by the source/drain contacts 472 can be referred to as source/drain regions 422SD and 432SD, a portion of the TMDC layers 422' between the source/drain regions 422SD can be referred to as channel region 422C, and a portion of the TMDC layers 432' between the source/drain regions 432SD can be referred to as channel region 432C. In some embodiments, the transistor T1 is an n-type transistor, and the transistor T2 is a p-type transistor. The conductivity type difference may depend on at least the composition difference between the TMDC layers 422' and 432'.

Reference is made to FIG. 17B and FIG. 31-35, the method MA proceeds to step AS14, where another interconnect structure 490 is formed over the ILD layer $ILD_x$ using similar processes and materials as discussed previously with respect to the interconnect structure 406. For example, the interconnect structure 490 electrically interconnects one or more transistors T1 and T2, and may further interconnects one or more transistors 404 formed on the substrate 402 by using, e.g., one or more deep through vias extending from the upper interconnect structure 490 to the lower interconnect structure 406. The interconnect structure 490 may include one or more interconnect layers 490I, and each include an ILD layer 490D and conductive features (e.g., conductive vias, conductive lines, or the combination thereof) 490M' surrounded by the ILD layers 490D. The interconnect structure 490 may also include etch stop layer 490E between two adjacent interconnect layers 490I.

Figure 31:
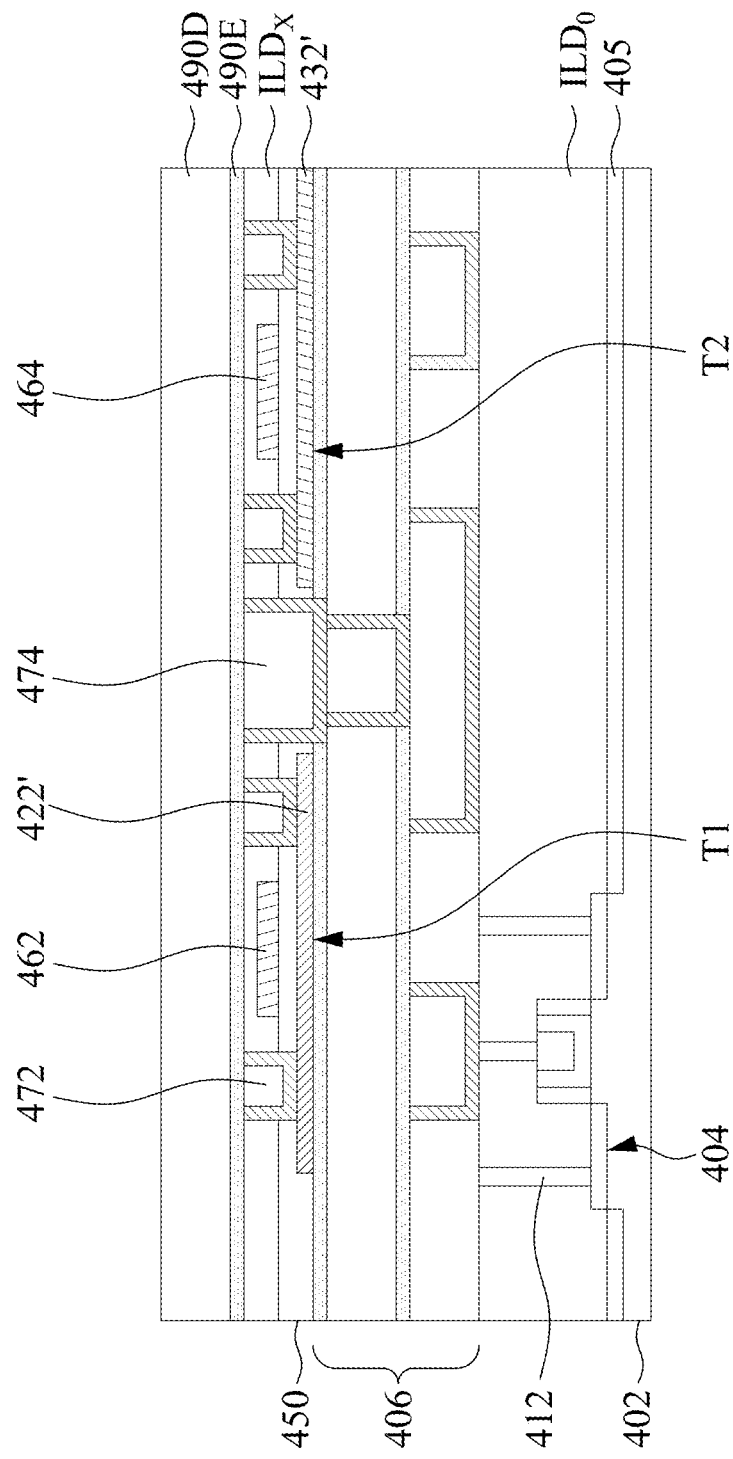

Referring to FIG. 31, an ILD layer 490D is deposited over the contacts 472 and the conductive plug 474. In some embodiments, the ILD layer 490D may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The ILD layer 490D may be deposited using any suitable method, such as CVD, physical vapor deposition (PVD), ALD, PEALD, PECVD, SACVD, FCVD, spin-on, and/or the like, or a combination thereof. In some embodiments, prior to the deposition of the ILD layer 490D, an etch stop layer 490E is deposited over the contacts 472 and the conductive plug 474.

Figure 32:
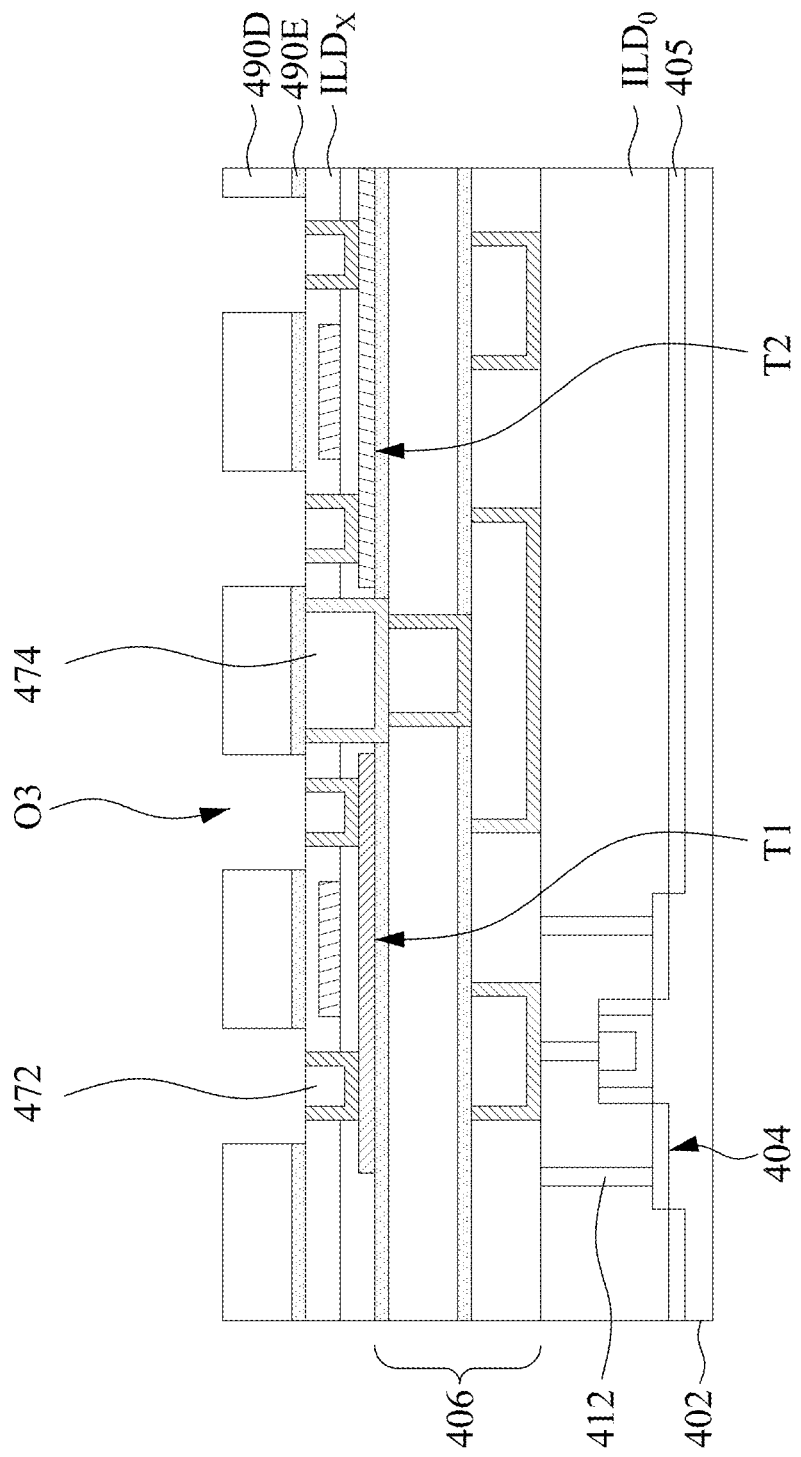

Referring to FIG. 32, openings O3 are etched in the ILD layer 490D. The openings O3 may be via opening, trench openings, or the combination thereof. A liner removal etching process may be performed to remove a portion of the etch stop layer 490E exposed by the openings O3. The formed openings O3 may extend through the ILD layer and the etch stop layer 490E, and expose some of the contacts 472 and the conductive plug 474.

Figure 33:
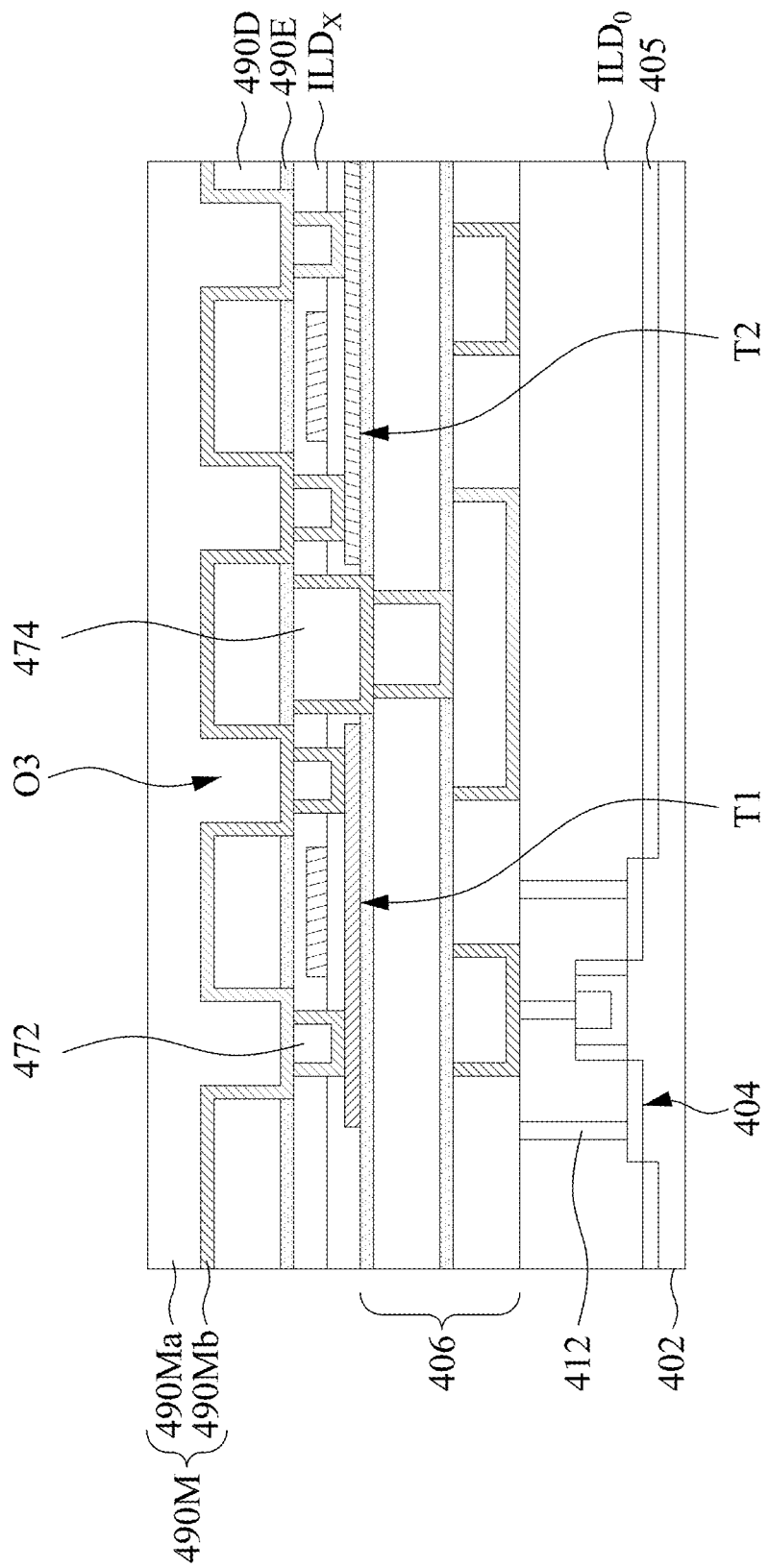

Referring to FIG. 33, a conductive material 490M is deposited into the openings O3 in the ILD layer 490D. The conductive material 490M may include a conductive fill material 490Ma and a liner layer 490Mb. The conductive fill material 490Ma may include W, Al, Cu, Ru, Ni, Co, alloys of these, combinations thereof, and the like. The conductive fill material 490Ma may be deposited using any acceptable deposition technique, such as CVD, ALD, PEALD, PECVD, PVD, ECP, electroless plating, or the like, or any combination thereof. Prior to depositing the conductive fill material 490Ma, the liner layer 490Mb may be conformally deposited over the openings O3. The liner layer 490Mb may include barrier metals used to reduce out-diffusion of conductive materials from the contacts into the surrounding dielectric materials. The liner layer 490Mb may include a material different from that of the conductive fill material 490Ma. For example, the liner layer 490Mb may include TiN, TaN, Ta, or other suitable metals, or their alloys.

Figure 34:
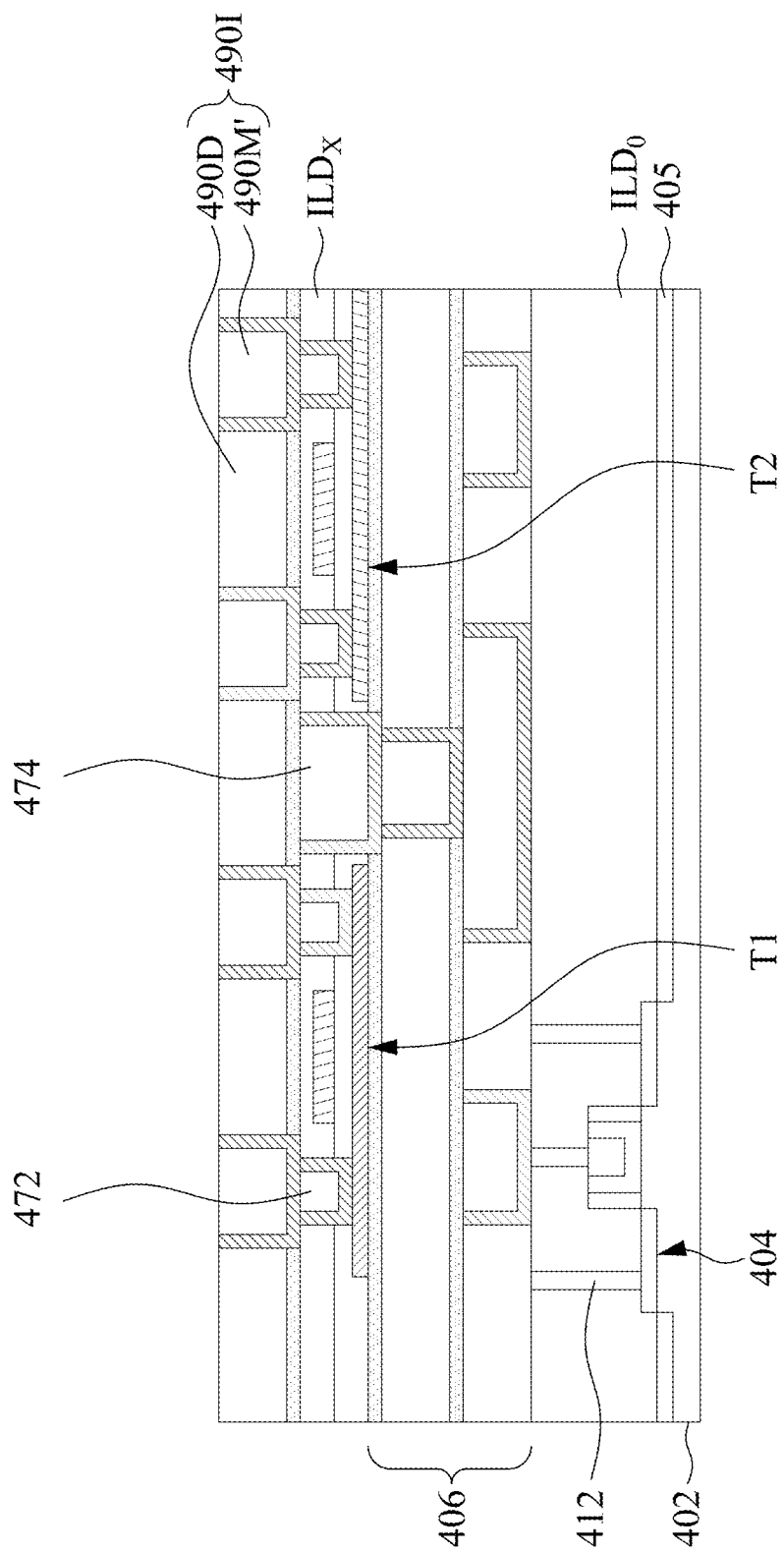

Referring to FIG. 34, a planarization process (e.g., CMP) is performed to remove excess material of all the conductive materials (e.g., the liner layer 490Mb and the conductive fill material 490Ma) from the surface of the ILD layer 490D. The remaining conductive materials forms conductive features 490M' in the openings O3. Depending on the shape of the openings O3, the conductive features 490M' may be a conducive via, a conductive line, or the combination thereof. Through the steps, an interconnect layer 490I including the ILD layer 490D and the conductive features 490M' is formed.

Figure 35:
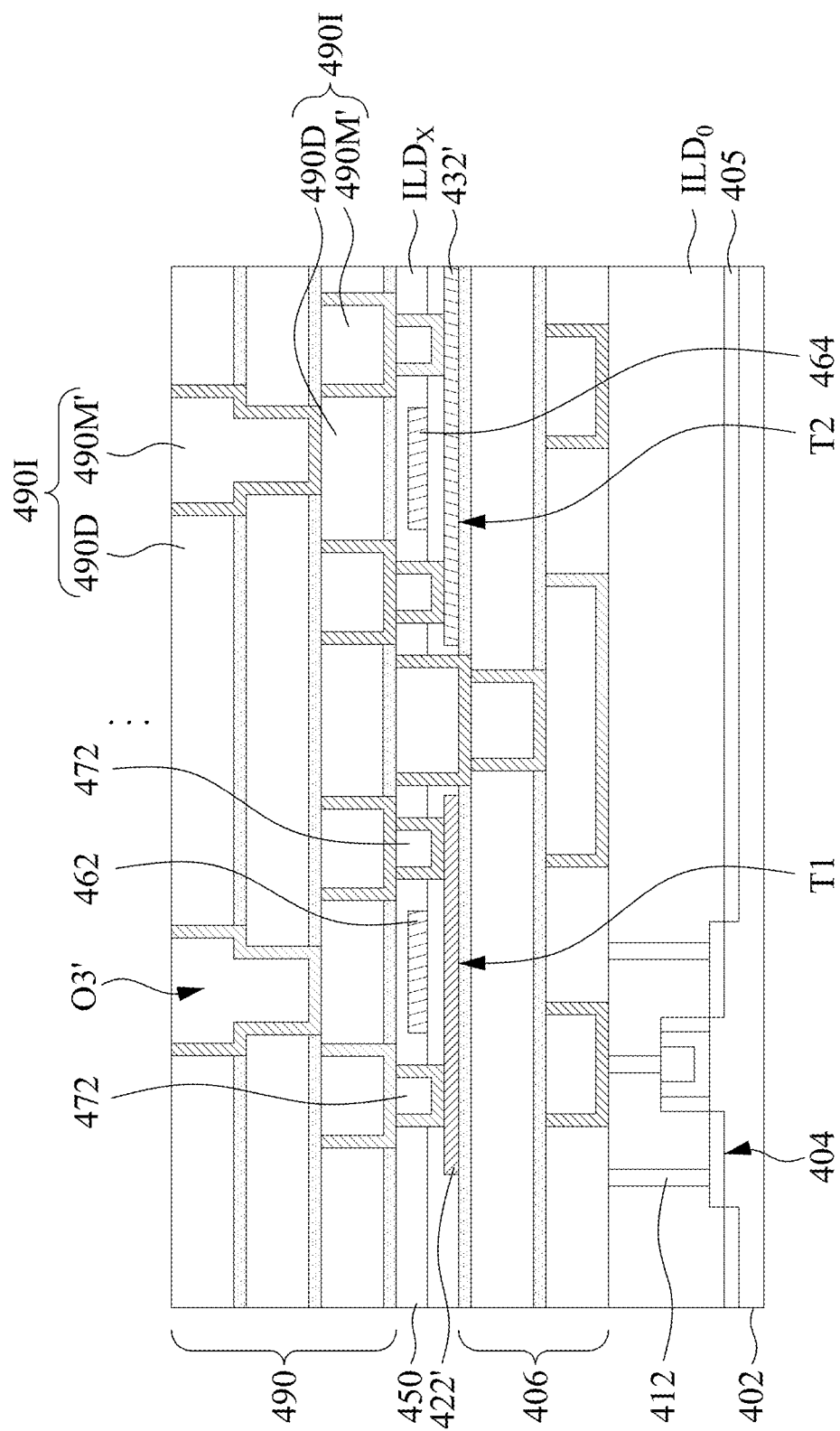

Referring to FIG. 35, an upper interconnect layer 490I is formed over the structure of FIG. 31. The formation of the upper interconnect layer 490I is similar to the process illustrated in FIGS. 31-34. Through the steps, an interconnect structure 490 including plural interconnect layers 490I is formed. Depending on the shape of opening O3' etched in the ILD layers 490D of the upper interconnect layer 490I, the conductive features 490M' of the upper interconnect layer 490I may be a conducive via, a conductive line, or the combination thereof. For example, in FIG. 35, as the opening O3' etched in the ILD layers 490D of the upper interconnect layer 490I is a combination of a via opening and a trench opening, a conductive features 490M' of the upper interconnect layer 490I is a combination of a conducive via and a conductive line.

Figure 36:
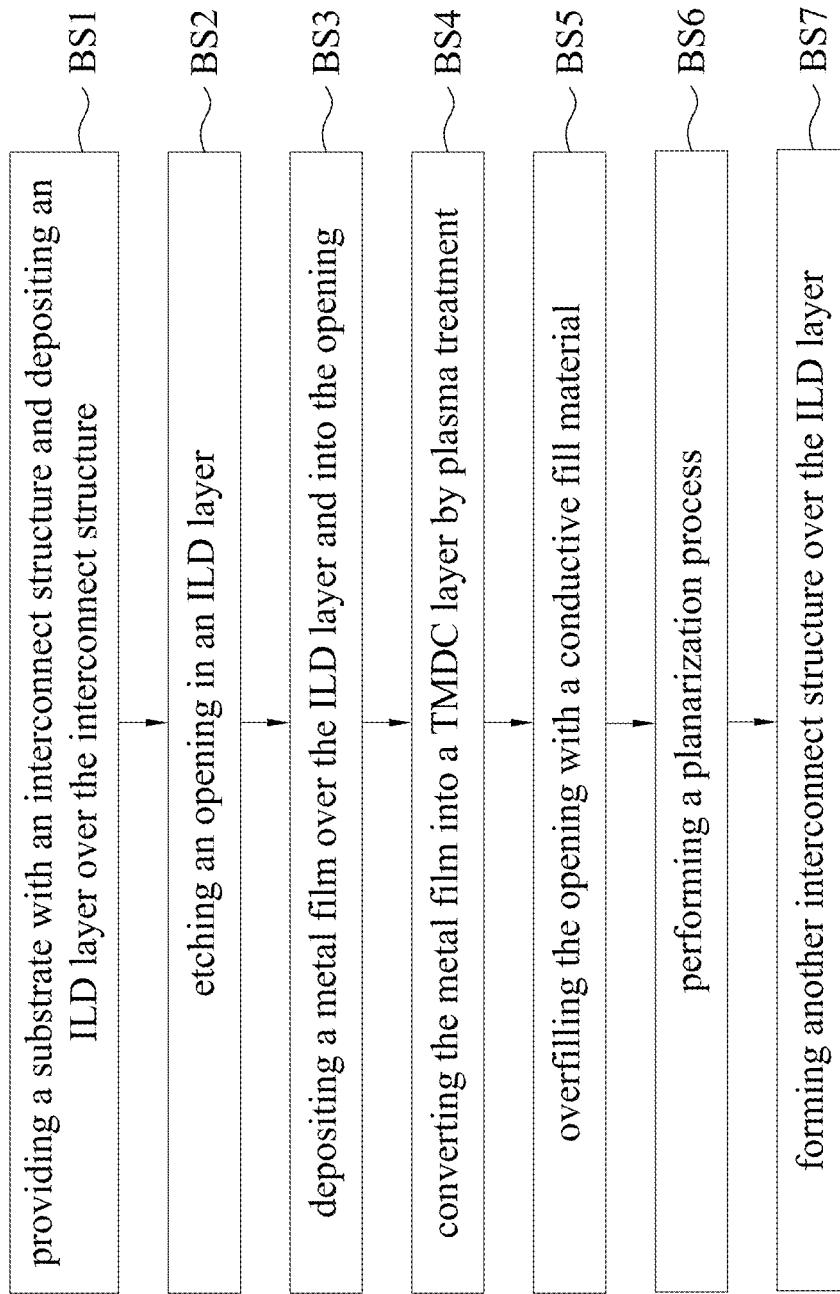
FIG. 36 is a flow chart of a method for forming an integrated circuit device according to some embodiments of the present disclosure.

FIG. 36 is a flow chart of a method MB for forming an integrated circuit device according to some embodiments of the present disclosure. FIGS. 37-43 illustrate a method for forming an integrated circuit device according to some embodiments of the present disclosure. The method MB may include steps BS1-BS7. It is understood that additional steps may be provided before, during, and after the steps BS1-BS7 shown by FIG. 36, and some of the steps described below can be replaced or eliminated for additional embodiments of the method. The order of the operations/processes may be interchangeable.

Figure 37:
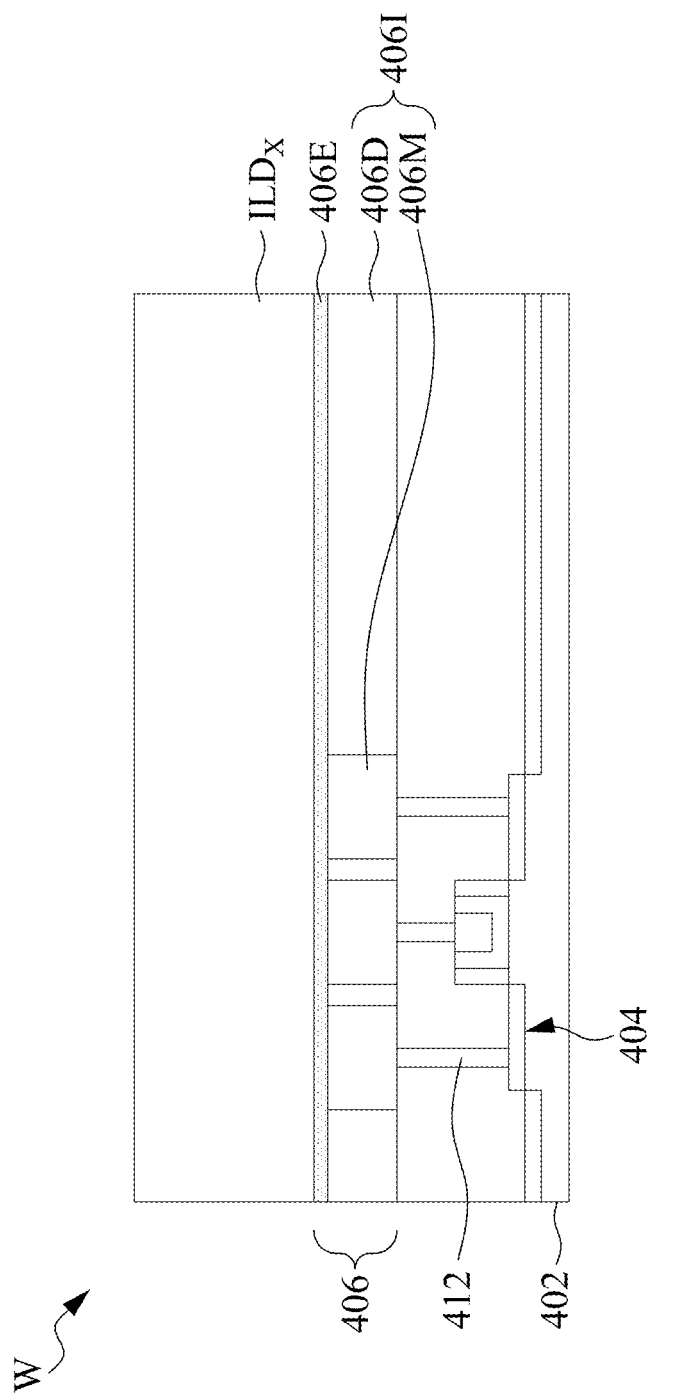
FIGS. 37-43 illustrate a method for forming an integrated circuit device according to some embodiments of the present disclosure.

Referring to FIGS. 36 and 37, the method MB begins at step BS1, where a substrate is provided with an interconnect structure. FIG. 37 illustrates a cross sectional view of an intermediate structure of a wafer W in an IC manufacturing process. In FIG. 37, the semiconductor wafer W is an intermediate structure of an IC manufacturing process where transistors and an interconnect structure have been formed. In some embodiments, the semiconductor wafer W may comprise a substrate 402, and one or more active and/or passive devices 404 are formed on the substrate 402. An interconnect structure 406 is formed over the one or more active and/or passive devices 404 and the substrate 402. The interconnect structure 406 electrically interconnects the one or more active and/or passive devices 404 to form functional electrical circuits within the semiconductor structure. The interconnect structure 406 includes one or more interconnect layers 406I, each comprising an ILD layer 406D and conductive features 406M (e.g., conductive vias, conductive lines, or the combination thereof) surrounded by the ILD layer 406D. Other details regarding the interconnect structure 406, devices 404, the substrate 402 have been illustrated above, and thereto not repeated herein.

An ILD layers $ILD_x$ is deposited over the interconnect structure 406. The materials of the ILD layer $ILD_x$ may comprise silicon oxide, phosphosilicate glass (PSG), borosilicate glass (BSG), boron-doped phosphosilicate glass (BPSG), undoped silicate glass (USG), a low dielectric constant (low-k) dielectric such as, fluorosilicate glass (FSG), silicon oxycarbide (SiOCH), carbon-doped oxide (CDO), flowable oxide, or porous oxides (e.g., xerogels/aerogels), or the like, or a combination thereof. The dielectric materials used to form the first ILD layer and the second ILD layer may be deposited using any suitable method, such as CVD, physical vapor deposition (PVD), ALD, PEALD, PECVD, SACVD, FCVD, spin-on, and/or the like, or a combination thereof. In some embodiments, prior to depositing the ILD layer $ILD_x$, an etch stop layer 406E is deposited over the interconnect layer 406I. The etch stop layer 406E may include a dielectric material different from the ILD layer $ILD_x$. For example, the etch stop layer 406E may include silicon nitride, silicon carbide, silicon oxynitride, silicon oxycarbide, silicon carbon nitride, the like, or the combination thereof.

Figure 38:
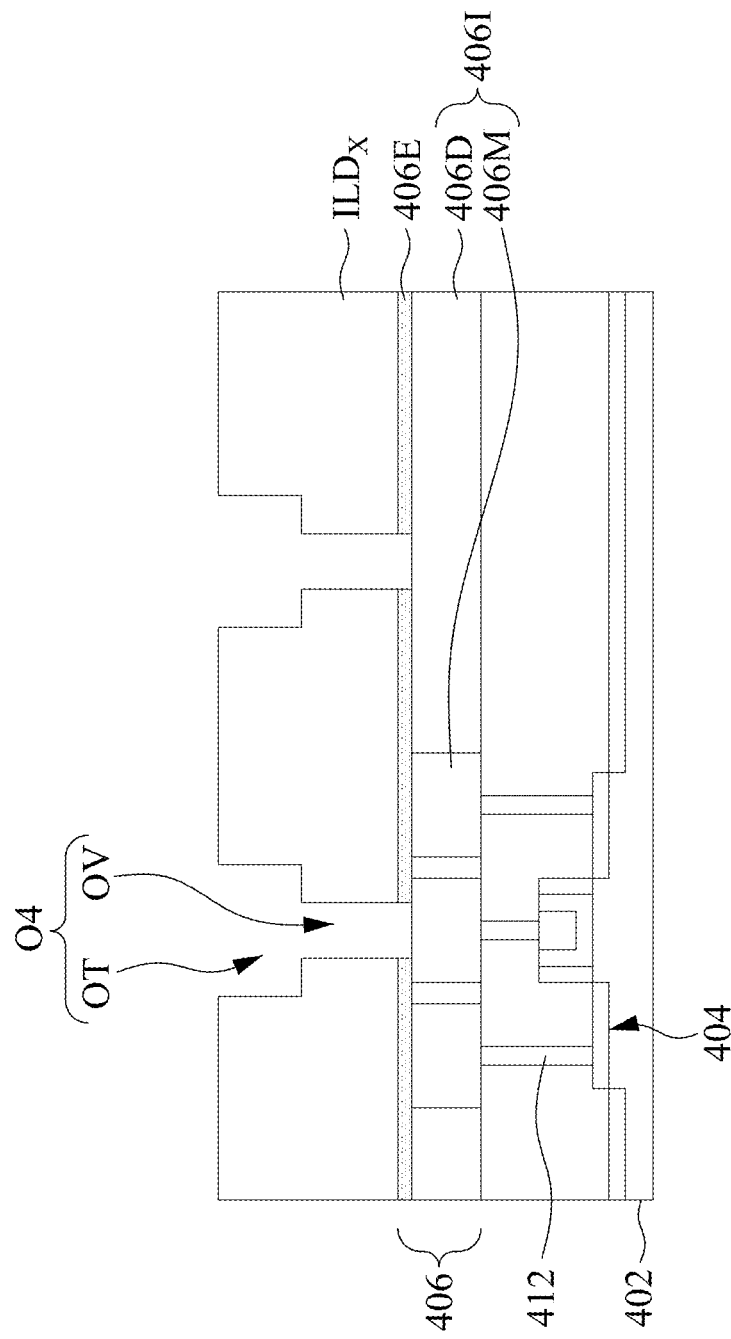

Referring to FIGS. 36 and 38, the method MB proceeds to step BS2, where openings O4 are etched in the ILD layer $ILD_x$. The etching process may include a trench etching process and a via etching process. For example, the trench etching process is first performed to remove a portion of the ILD layer $ILD_x$, thereby forming a trench portion OT of the openings O4. Subsequently, the via etching process is performed to remove a portion of the ILD layer $ILD_x$, thereby forming a via portion OV of the openings O4. The etch stop layer 406E may have a higher etch resistance to the via etching process than that of the ILD layer $ILD_x$, thereby protecting underlying materials from being etched during the via etching process. Suitable liner remove process may be performed to remove a portion of the etch stop layer 406E after the via etching process, such that underlying conductive features 406M may be exposed by the openings O4.

Figure 39:
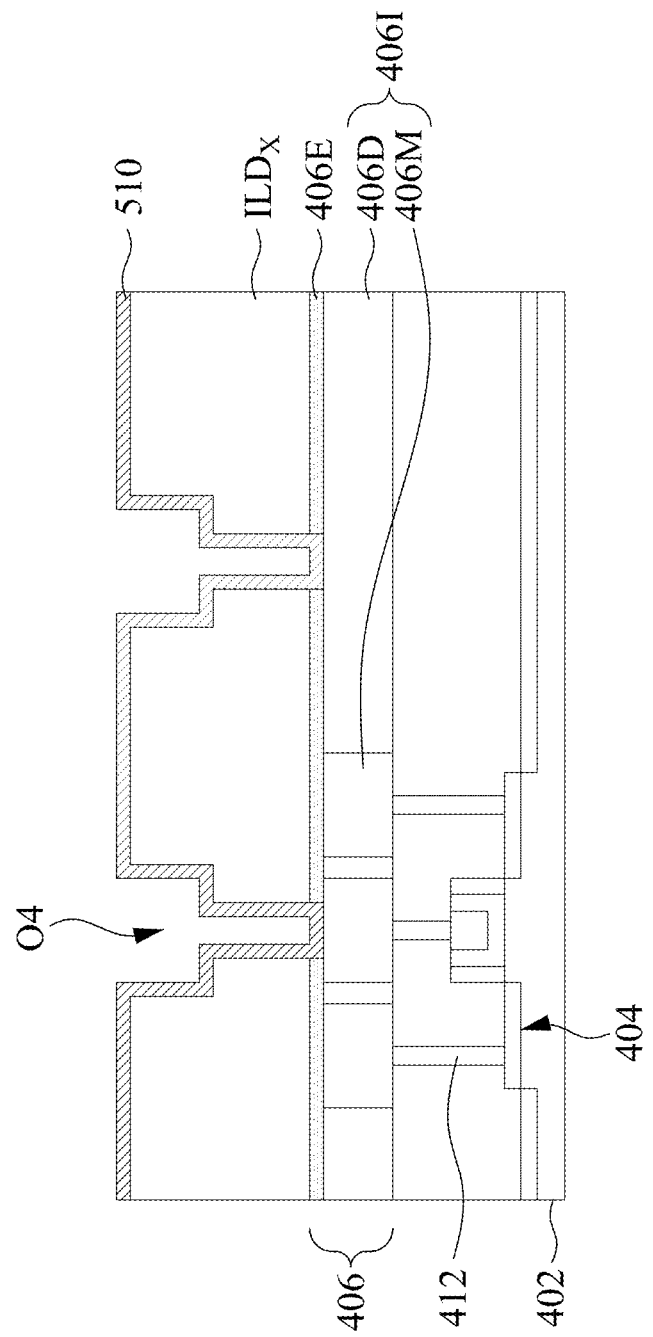

Referring to FIGS. 36 and 39, the method MB proceeds to step BS3, where a metal film 510 is deposited over the ILD layer $ILD_x$ and into the openings O4. The metal film 510 may be deposited in a conformal manner, such that it lines up sidewalls of the openings O4, the exposed top surfaces of the conductive feature 406M, and the top surface of the ILD layer $ILD_x$. The metal film 510 may include a transition metal, such as Mo, W, Pd, Pt, the like, or the combination thereof. The deposition of the metal film 510 may include PVD (e.g., E-gun evaporation deposition or thermal evaporation deposition), ALD, CVD, the like, or the combination thereof.

Figure 40:
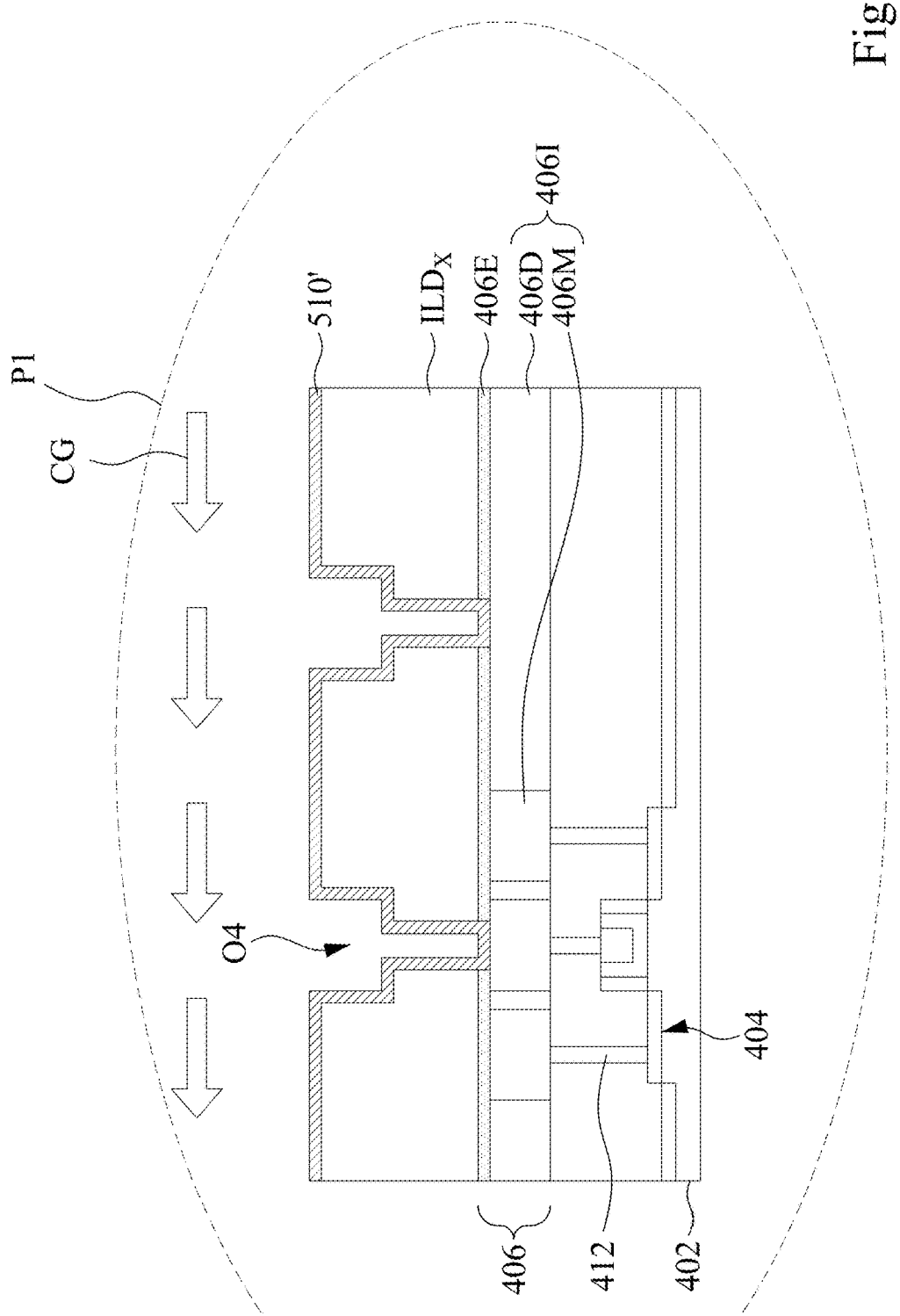

Referring to FIGS. 36 and 40, the method MB proceeds to step BS4, where a plasma treatment is performed to chalcogenize the metal film 510 (referring to FIG. 39). As illustrated previously FIGS. 1A-6A, the plasma treatment may use a microwave plasma P1 containing chalcogen brought by the gas flow CG. Through the plasma treatment, the metal film 510 is converted into a TMDC layer 510', which has high channel mobility, a high current ON/OFF ratio, and a good sub-threshold swing. For example, in some embodiments where the metal film 510 is a Mo layer, the formed TMDC layers 510' is a $MoS_2$ layer.

Figure 41:
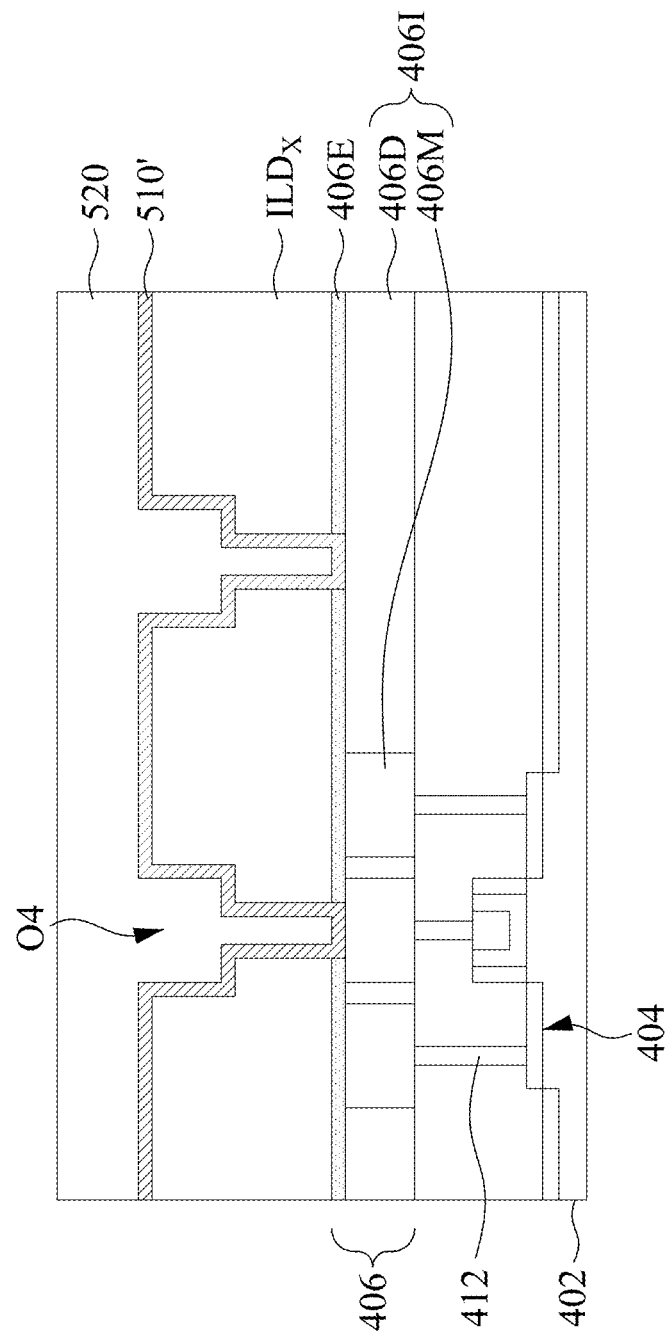

Referring to FIGS. 36 and 41, the method MB proceeds to step BS5, where a conductive fill material 520 overfills the openings O4. The conductive fill material 520 may include W, Al, Cu, Ru, Ni, Co, alloys of these, combinations thereof, and the like. The conductive fill material 520 may be deposited using any acceptable deposition technique, such as CVD, ALD, PEALD, PECVD, PVD, ECP, electroless plating, or the like, or any combination thereof.

Figure 42:
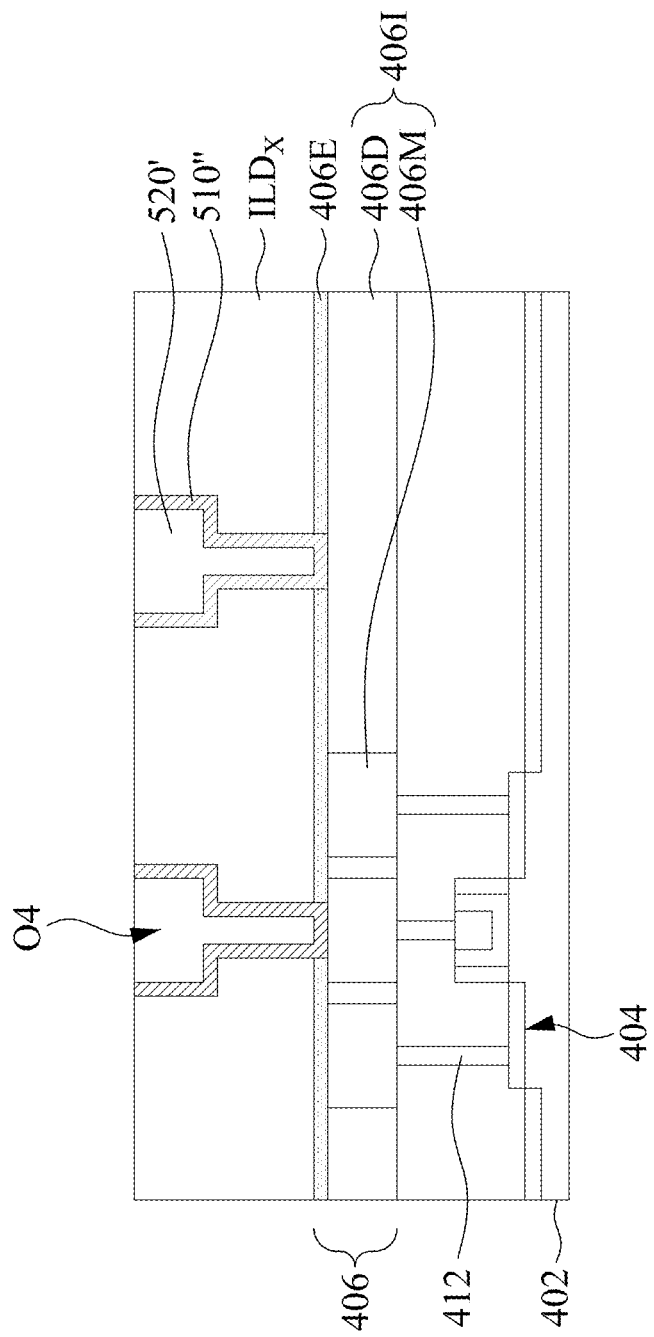

Referring to FIGS. 36 and 42, the method MB proceeds to step BS6, where a planarization process (e.g., CMP) is performed to remove excess materials of the conductive fill material 520 (referring to FIG. 41) and TMDC layer 510' (referring to FIG. 41) from the top surface of the ILD layer $ILD_x$. The remaining conductive fill material 520 (referring to FIG. 41) forms conductive features 520' in the openings O3. Depending on the shape of the openings O4, the conductive features 520' may be a conducive via, a conductive line, or the combination thereof. The remaining TMDC layer 510' (referring to FIG. 41) may serve as barrier layers 510" to prevent metal diffusion, and the barrier layer 510" space the conductive features 520' from the ILD layer $ILD_x$. In the present embodiments, the barrier layers 510" also spaces the conductive features 520' from the conductive features 406M. In some embodiments, the metal layer 510 (referring to FIG. 39) or the barrier layers 510" may be patterned to expose the conductive features 406M, such that the conductive features 520' is in direct contact with the conductive features 406M. In some embodiments, one of the conductive features 520' and one of barrier layers 510" in combination may be referred to as a conductive feature, such as a conducive via, a conductive line, or the combination thereof.

Figure 43:
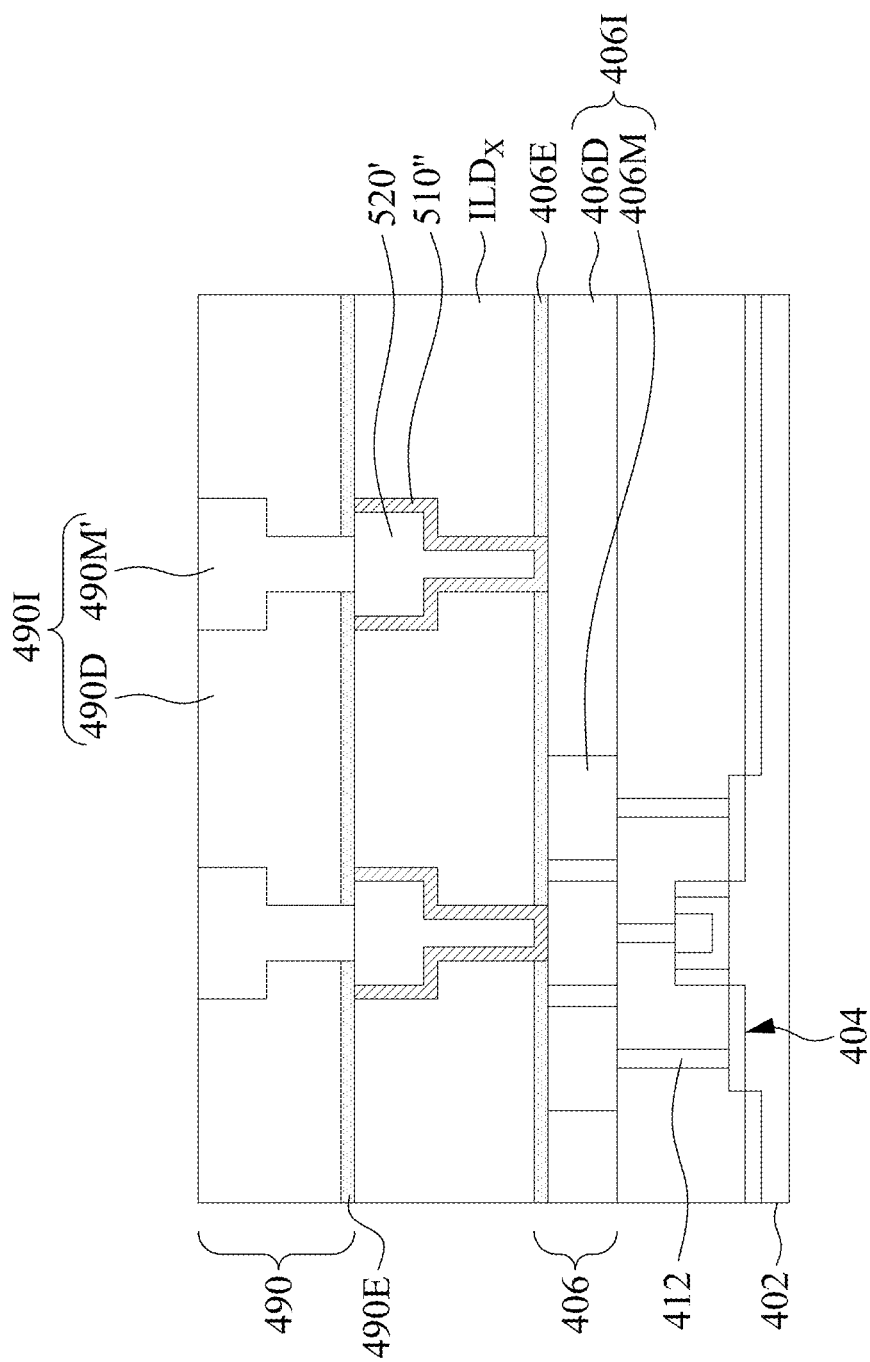

Referring to FIGS. 36 and 43, the method MB proceeds to step BS7, where another interconnect structure 490 is formed over the ILD layer $ILD_x$ using similar processes and materials as discussed previously with respect to the interconnect structure 406. The interconnect structure 490 may include one or more interconnect layers 490I, and each include dielectric layers 490D and conductive features (e.g., conductive vias, conductive lines, or the combination thereof) 490M' surrounded by the dielectric layers 490D. The interconnect structure 490 may also include etch stop layer 490E between two adjacent interconnect layers 490I. Other details of the present embodiments are similar to the above embodiments, and therefore not repeated herein.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a TMDC layer is directly synthesized and grown on a substrate using chalcogenization in a microwave plasma system. Another advantage is that the TMDC layer is synthesized at low temperature, which lower thermal budget, which is highly potential application in back-end processes. Still another advantage is that the TMDC layer is on a side of the substrate facing away from the plasma reactor, such that the plasma treatment has little or no influence on roughness of the formed TMDC layer.

According to some embodiments of the present disclosure, an integrated circuit device includes a substrate, a first transition metal dichalcogenide layer over the substrate, a dielectric layer over the first transition metal dichalcogenide layer, a first gate electrode, and a first source contact and a first drain contact. The first transition metal dichalcogenide layer has a surface roughness greater than 0.5 nm and less than 1 nm. The first gate electrode is over the dielectric layer and a first portion of the first transition metal dichalcogenide layer. The first source contact and the first drain contact are respectively connected with a second portion and a third portion of the first transition metal dichalcogenide layer. The first portion of the first transition metal dichalcogenide layer is between the second and third portions of the first transition metal dichalcogenide layer.

According to some embodiments of the present disclosure, an integrated circuit device includes a substrate; a first transistor over the substrate, wherein the first transistor comprises a semiconductor fin, a first gate structure over the semiconductor fin, and a doped semiconductor source/drain region alongside the gate structure and over the semiconductor fin; an interconnect structure over the first transistor; and a second transistor over the interconnect structure, wherein the second transistor comprises a transition metal dichalcogenide layer, a second gate structure over the transition metal dichalcogenide layer, and a second source/drain contact in contact with the transition metal dichalcogenide layer.

According to some embodiments of the present disclosure, an integrated circuit device includes a non-insulator structure; a conductive structure over the non-insulator structure, wherein the conductive structure comprises a transition metal dichalcogenide layer in contact with the non-insulator structure and a conductive feature over the transition metal dichalcogenide layer, and the transition metal dichalcogenide layer surrounds the conductive feature; and a dielectric layer surrounding the conductive structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a substrate;
a first transition metal dichalcogenide layer over the substrate, wherein the first transition metal dichalcogenide layer has a surface roughness greater than 0.5 nm and less than 1 nm;
a dielectric layer over the first transition metal dichalcogenide layer;
a first gate electrode over the dielectric layer and a first portion of the first transition metal dichalcogenide layer, wherein the first gate electrode has a width less than a width of the first transition metal dichalcogenide layer; and
a first source contact and a first drain contact respectively connected with a second portion and a third portion of the first transition metal dichalcogenide layer, the first portion of the first transition metal dichalcogenide layer is between the second and third portions of the first transition metal dichalcogenide layer, wherein the first source contact has a bottommost surface lower than a bottommost surface of the first gate electrode, and a topmost surface higher than a topmost surface of the first gate electrode.

2. The integrated circuit device of claim 1, wherein an element composition ratio of a chalcogen element to a transition metal element in the first transition metal dichalcogenide layer is in a range from 1.9:1 to 2.1:1.

3. The integrated circuit device of claim 1, further comprising:
a transistor over the substrate;
an interlayer dielectric layer overlaying the transistor; and
a contact plug in the interlayer dielectric layer and connected to the transistor, wherein the first transition metal dichalcogenide layer is over a top surface of the interlayer dielectric layer and a top surface of the contact plug.

4. The integrated circuit device of claim 1, further comprising:
a second transition metal dichalcogenide layer over the substrate, wherein the second transition metal dichalcogenide layer has a chalcogen element same as a chalcogen element of the first transition metal dichalcogenide layer and a transition metal element different from a transition metal element of the first transition metal dichalcogenide layer, and the dielectric layer is over the first transition metal dichalcogenide layer;
a second gate electrode over the dielectric layer and a first portion of the second transition metal dichalcogenide layer; and
a second source contact and a second drain contact respectively connected with a second portion and a third portion of the second transition metal dichalcogenide layer, the first portion of the second transition metal dichalcogenide layer being between the second and third portions of the second transition metal dichalcogenide layer.

5. The integrated circuit device of claim 4, wherein the first transition metal dichalcogenide layer is a $MoS_2$ layer, and the second transition metal dichalcogenide layer is a $WS_2$ layer.

6. The integrated circuit device of claim 4, wherein the first and second gate electrodes comprise a same gate electrode material.

7. The integrated circuit device of claim 4, wherein the second transition metal dichalcogenide layer is spaced apart from the first transition metal dichalcogenide layer by the dielectric layer.

8. The integrated circuit device of claim 1, wherein the first transition metal dichalcogenide layer extends beyond a sidewall of the first source contact.

9. An integrated circuit device, comprising:
a substrate;
a first transistor over the substrate, wherein the first transistor comprises a semiconductor fin, a first gate structure over the semiconductor fin, and a doped semiconductor source/drain region alongside the first gate structure and over the semiconductor fin;
an interconnect structure over the first transistor; and
a second transistor over the interconnect structure, wherein the second transistor comprises a transition metal dichalcogenide layer, a second gate structure over the transition metal dichalcogenide layer, and a second source/drain contact in direct contact with the transition metal dichalcogenide layer, wherein the transition metal dichalcogenide layer has a bottommost surface lower than a bottommost surface of the second source/drain contact.

10. The integrated circuit device of claim 9, wherein an element composition ratio of a chalcogen element to a transition metal element in the transition metal dichalcogenide layer is in a range from 1.9:1 to 2.1:1.

11. The integrated circuit device of claim 9, wherein the transition metal dichalcogenide layer is a $MoS_2$ layer.

12. The integrated circuit device of claim 9, wherein the transition metal dichalcogenide layer has a surface roughness greater than 0.5 nm and less than 1 nm.

13. The integrated circuit device of claim 9, wherein the transition metal dichalcogenide layer of the second transistor vertically overlaps the semiconductor fin of the first transistor.

14. An integrated circuit device, comprising:
a non-insulator structure;
a conductive structure over the non-insulator structure, wherein the conductive structure comprises a transition metal dichalcogenide layer in contact with the non-insulator structure and a conductive feature having sidewalls interfacing with the transition metal dichalcogenide layer, wherein a bottommost surface of the conductive feature interfaces with the transition metal dichalcogenide layer; and
a dielectric layer surrounding the conductive structure.

15. The integrated circuit device of claim 14, wherein the non-insulator structure is a conductive line of an interconnect structure.

16. The integrated circuit device of claim 14, further comprising:

an etch stop layer between the dielectric layer and the non-insulator structure.

17. The integrated circuit device of claim 14, wherein the conductive structure comprises a conductive line.

18. The integrated circuit device of claim 14, wherein the conductive structure comprises a conductive via.

19. The integrated circuit device of claim 14, wherein the conductive structure comprises a conductive line and a conductive via connecting the conductive line to the non-insulator structure.

20. The integrated circuit device of claim 9, wherein a vertical distance from a top surface of the transition metal dichalcogenide layer to a top surface of the second source/drain contact is greater than a vertical distance from a bottom surface of the second gate structure to a top surface of the second gate structure.

* * * * *